US010861852B2

(12) United States Patent
Li et al.

(10) Patent No.: US 10,861,852 B2
(45) Date of Patent: Dec. 8, 2020

(54) THREE-DIMENSIONAL (3D), VERTICALLY-INTEGRATED FIELD-EFFECT TRANSISTORS (FETS) FOR COMPLEMENTARY METAL-OXIDE SEMICONDUCTOR (CMOS) CELL CIRCUITS

(71) Applicant: QUALCOMM Incorporated, San Diego, CA (US)

(72) Inventors: Xia Li, San Diego, CA (US); Shashank Ekbote, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/180,349

(22) Filed: Nov. 5, 2018

(65) Prior Publication Data

US 2020/0144264 A1    May 7, 2020

(51) Int. Cl.
*H01L 27/092* (2006.01)
*H01L 27/12* (2006.01)
(Continued)

(52) U.S. Cl.
CPC ...... *H01L 27/0924* (2013.01); *H01L 21/8221* (2013.01); *H01L 21/823807* (2013.01);
(Continued)

(58) Field of Classification Search
CPC ............. H01L 27/0924; H01L 29/0847; H01L 23/528; H01L 29/0673; H01L 29/0696; H01L 21/845; H01L 21/823821; H01L 21/8221; H01L 27/1203; H01L 21/823807; H01L 23/5226; H01L 21/823871; H01L 25/074; H01L 29/66795–66818; H01L 21/823431; H01L 27/10879; H01L 21/8238–823892; H01L 27/092–0928; H01L 27/11807; H01L 2027/11809–11894; B81C 2203/0714;
(Continued)

(56) References Cited

U.S. PATENT DOCUMENTS 9,117,749 B1    8/2015  Or-Bach et al.
9,224,810 B2    12/2015 Kim et al.
(Continued)

*Primary Examiner* — Cuong B Nguyen
(74) *Attorney, Agent, or Firm* — Withrow & Terranova, PLLC

(57) ABSTRACT

A 3D vertically integrated FET for CMOS cell circuits is disclosed. Vertically integrating FETs for a 3D cell circuit reduces the footprint size of an IC chip. To reduce a CMOS cell circuit footprint, a PFET and an NFET are vertically integrated by stacking a second semiconductor layer including a second FET above a first semiconductor layer including a first FET, such that the channel structure of the second FET overlaps the channel structure of the first FET. The first FET may be an NFET, and the second FET may be a PFET, or vice versa. The longitudinal axis of the first FET channel structure may extend in a first plane parallel to a second plane including the longitudinal axis of the second FET channel structure. The longitudinal axes may be parallel or at an angle to each other, such that the second channel structure overlaps the first channel structure.

34 Claims, 48 Drawing Sheets

(51) Int. Cl.
*H01L 29/08* (2006.01)
*H01L 29/06* (2006.01)
*H01L 23/522* (2006.01)
*H01L 25/07* (2006.01)
*H01L 21/8238* (2006.01)
*H01L 21/84* (2006.01)
*H01L 21/822* (2006.01)
*H01L 23/528* (2006.01)

(52) U.S. Cl.
CPC ............ *H01L 21/823821* (2013.01); *H01L 21/823871* (2013.01); *H01L 21/845* (2013.01); *H01L 23/528* (2013.01); *H01L 23/5226* (2013.01); *H01L 25/074* (2013.01); *H01L 27/1203* (2013.01); *H01L 29/0673* (2013.01); *H01L 29/0696* (2013.01); *H01L 29/0847* (2013.01)

(58) Field of Classification Search
CPC .... B81C 2203/0728; B81C 2203/0735; B81C 2203/0742
See application file for complete search history.

(56) References Cited

U.S. PATENT DOCUMENTS

| | | |
|---|---|---|
| 9,691,785 B2 | 6/2017 | Lee et al. |
| 9,997,598 B2 | 6/2018 | Smith et al. |
| 2017/0207239 A1 | 7/2017 | Liaw |
| 2019/0355756 A1* | 11/2019 | Nelson ............ H01L 21/823821 |

* cited by examiner

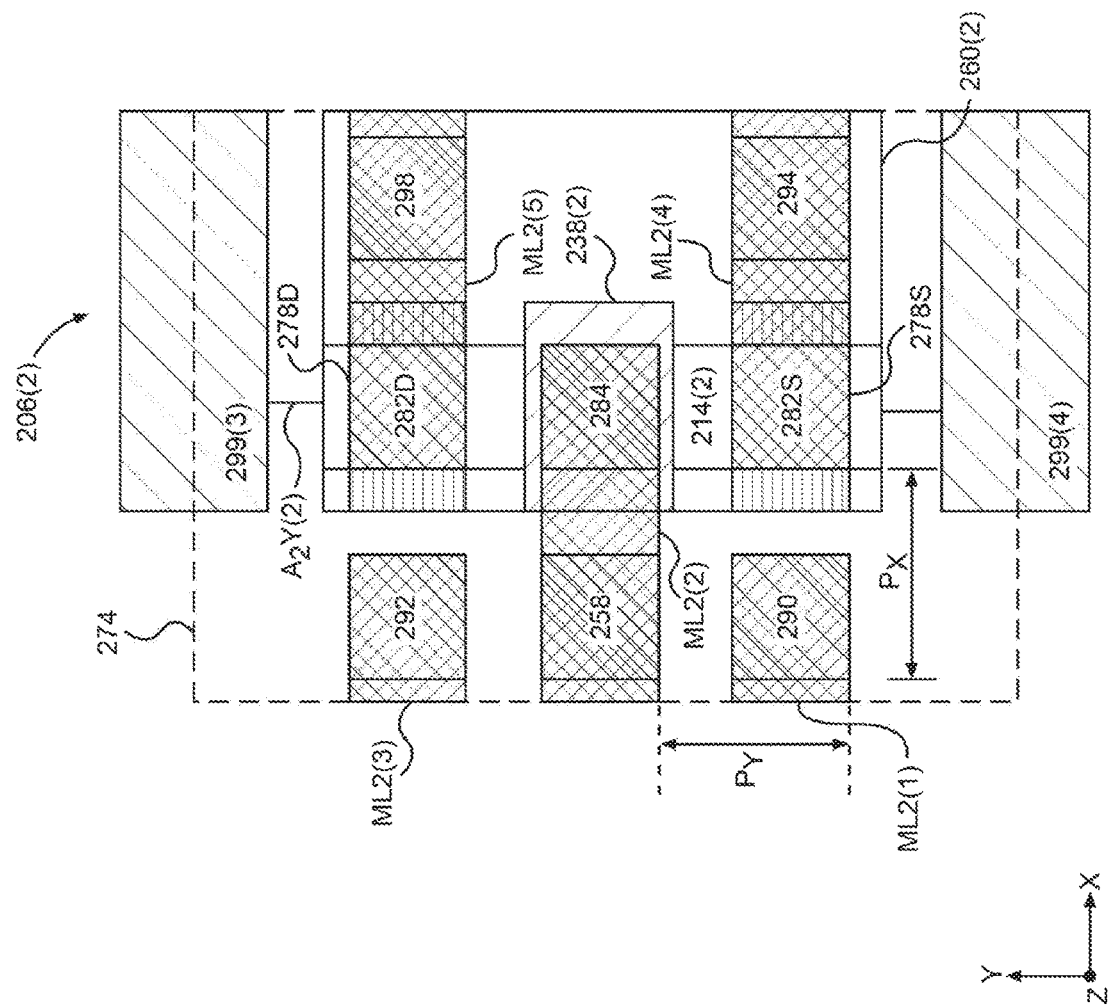
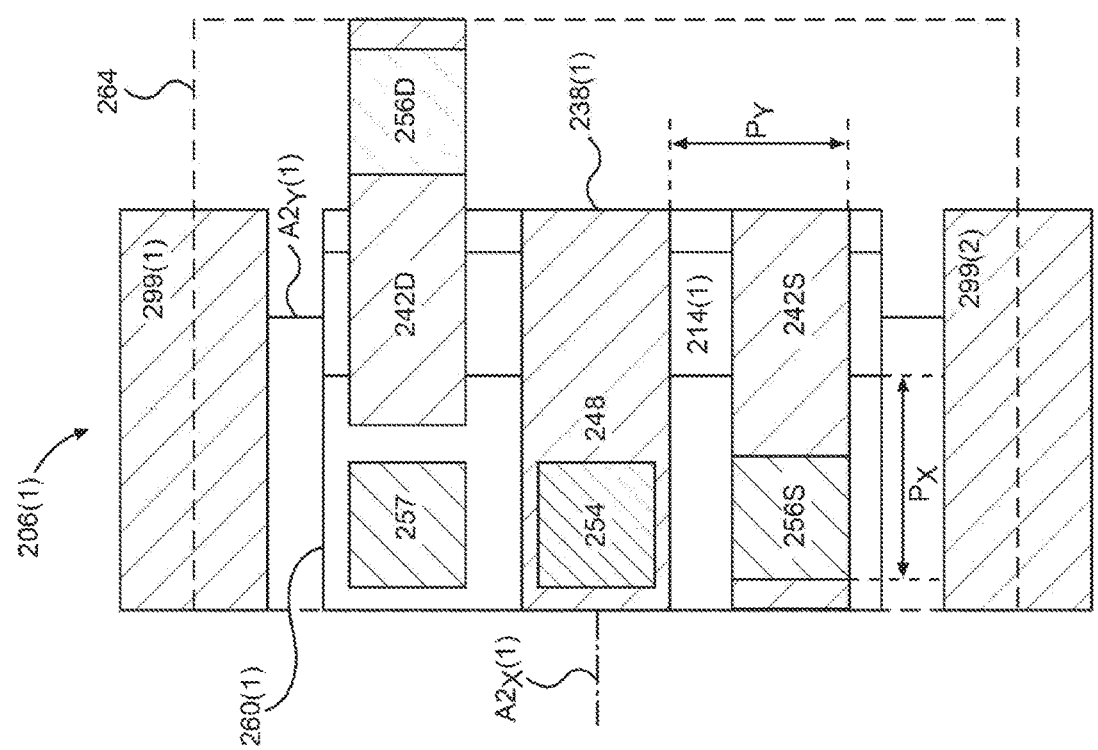

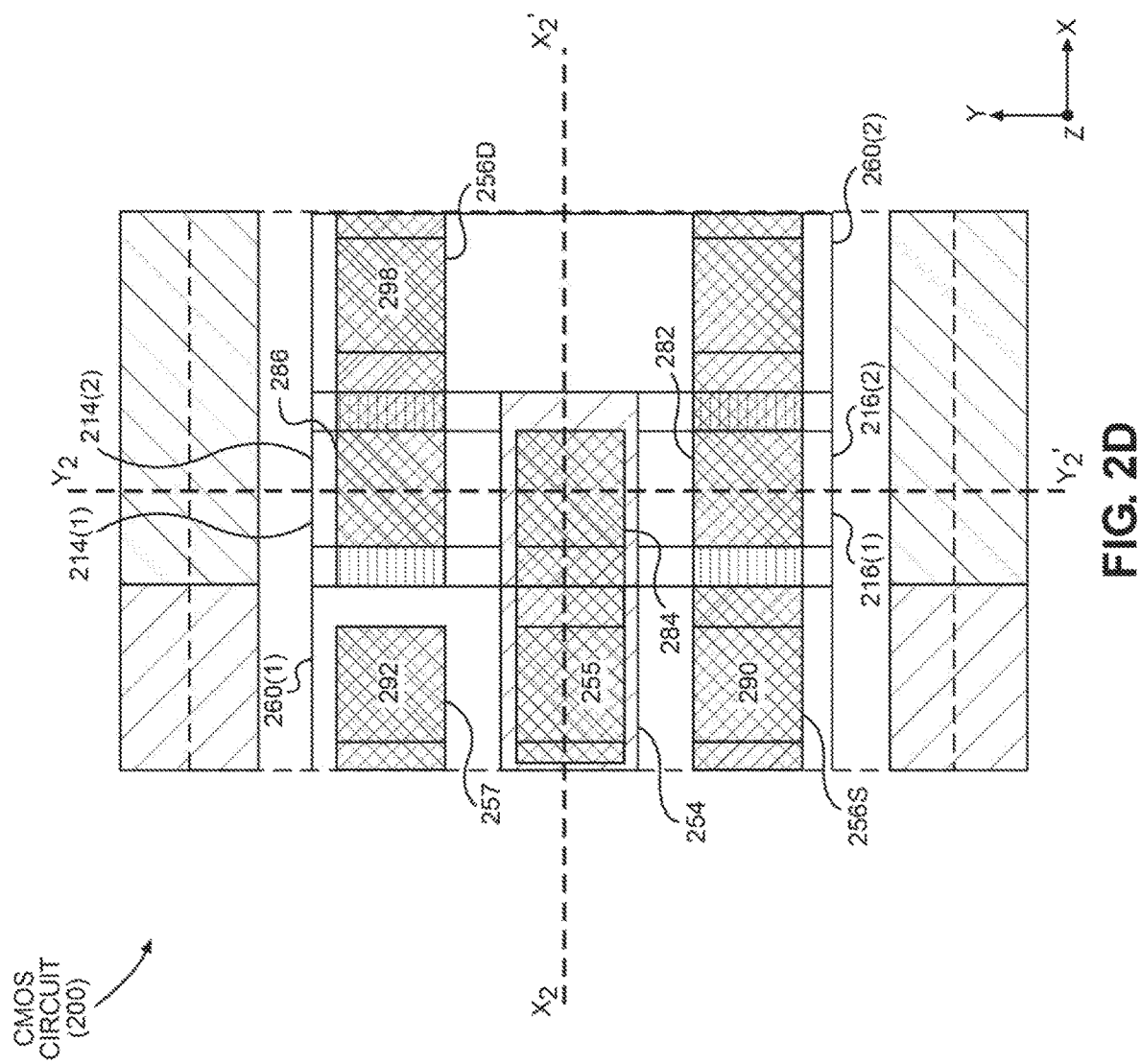

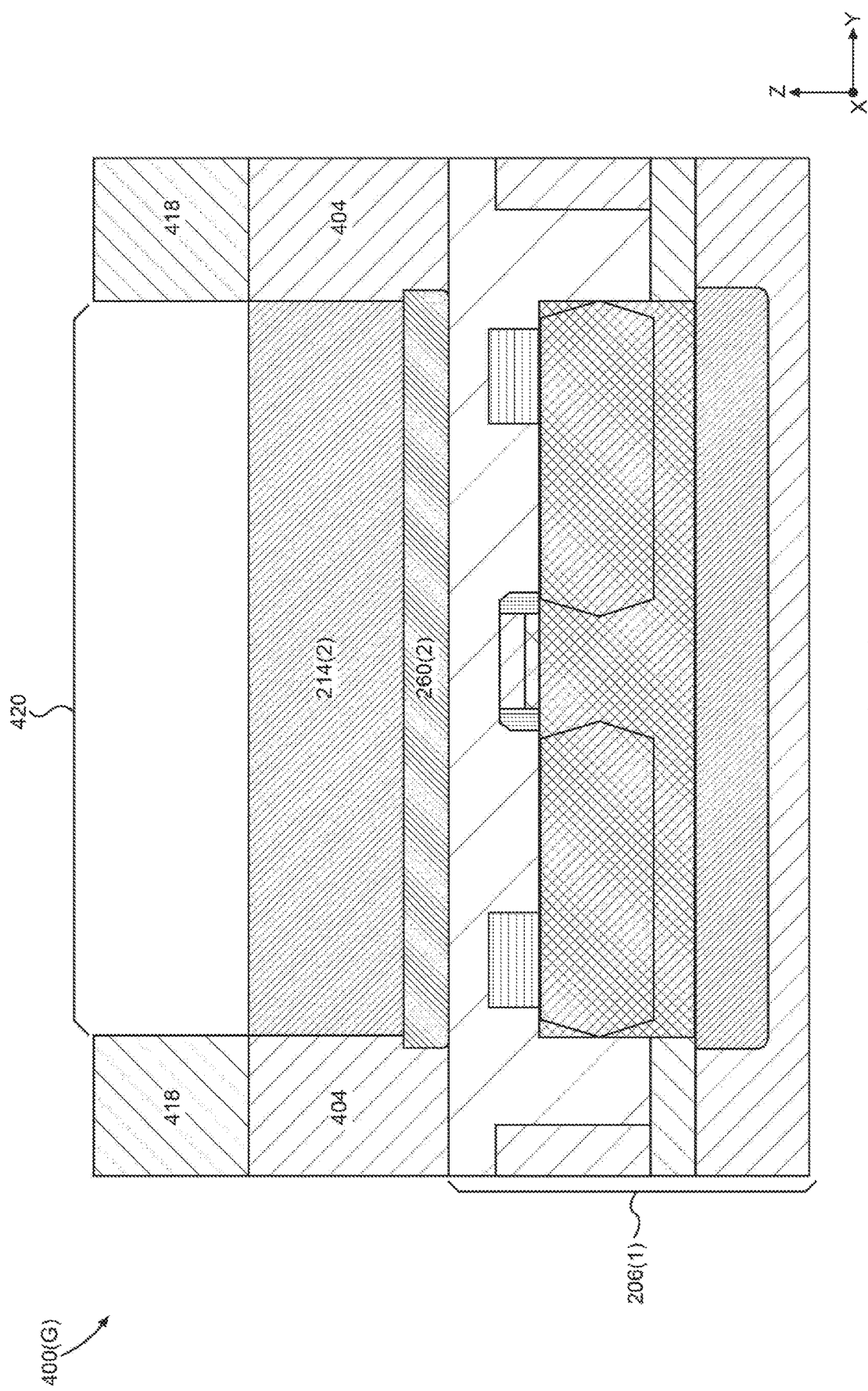

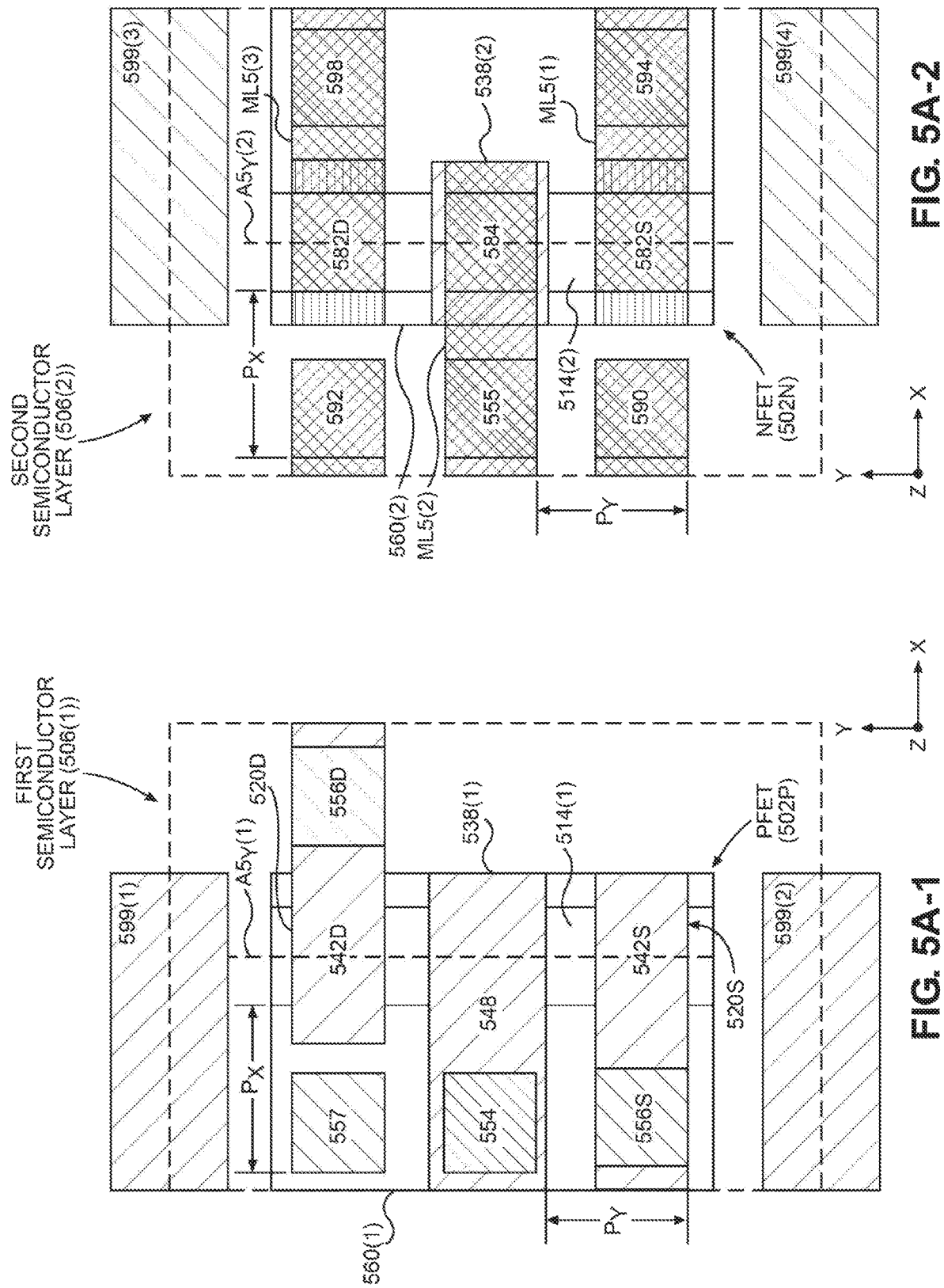

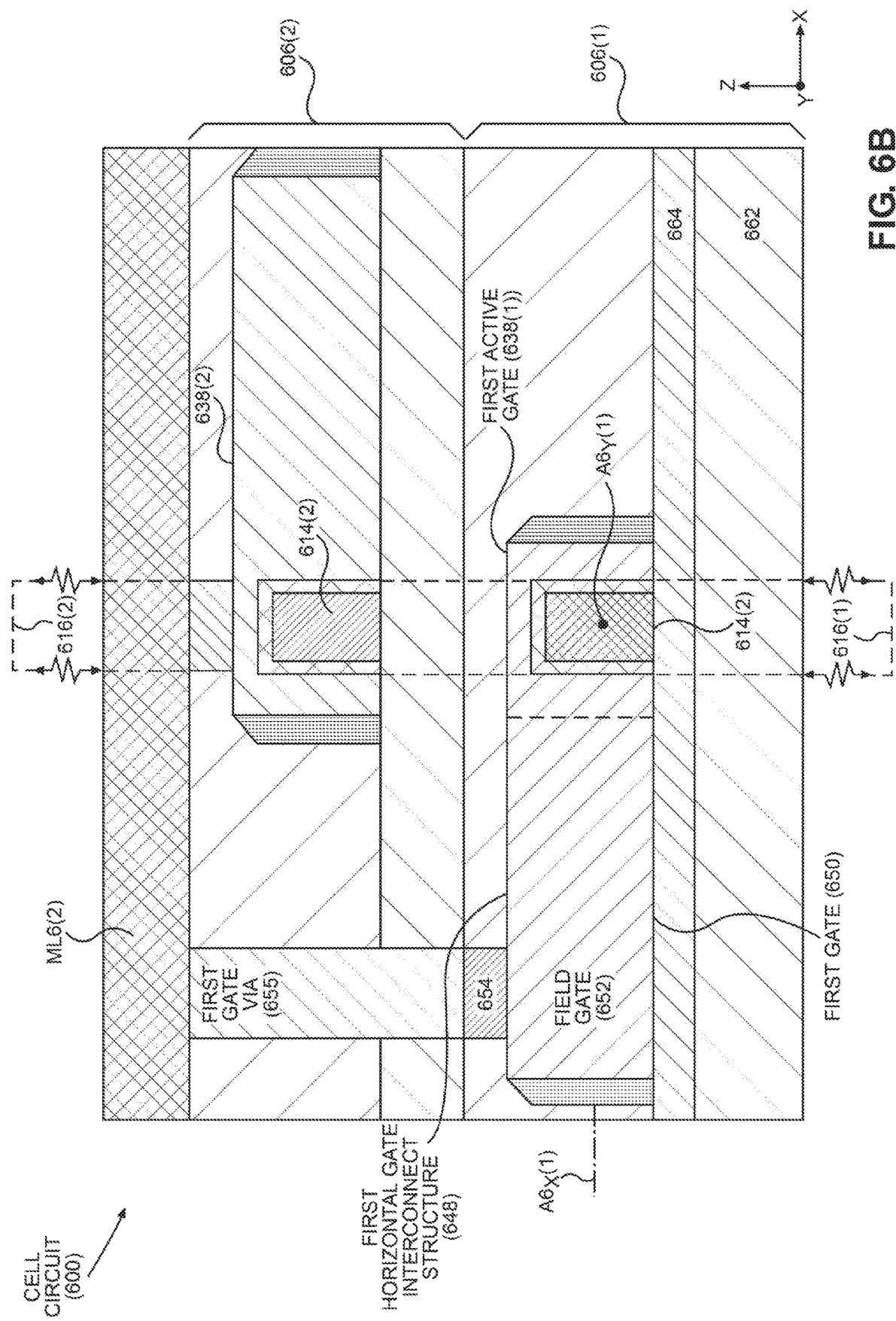

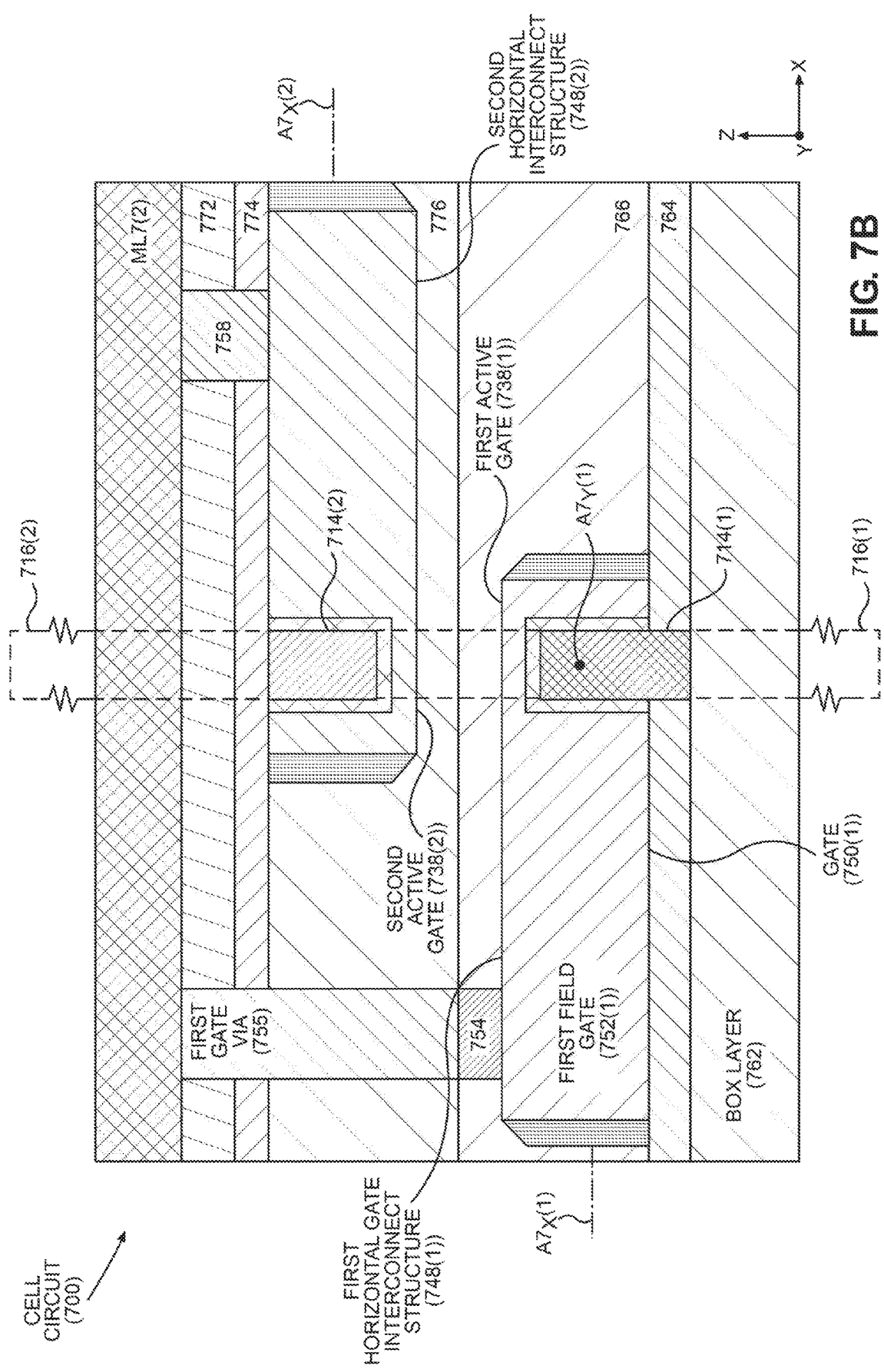

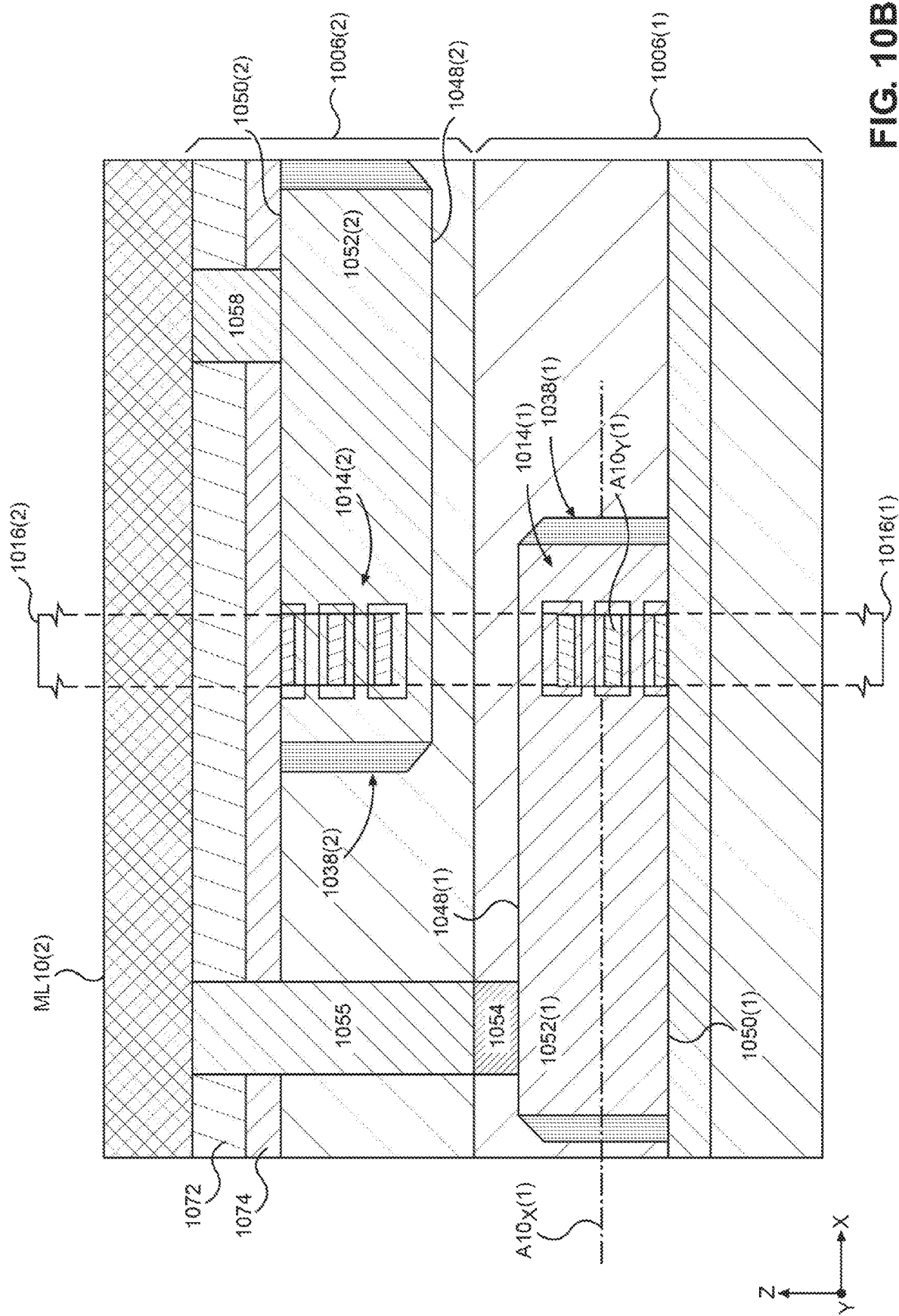

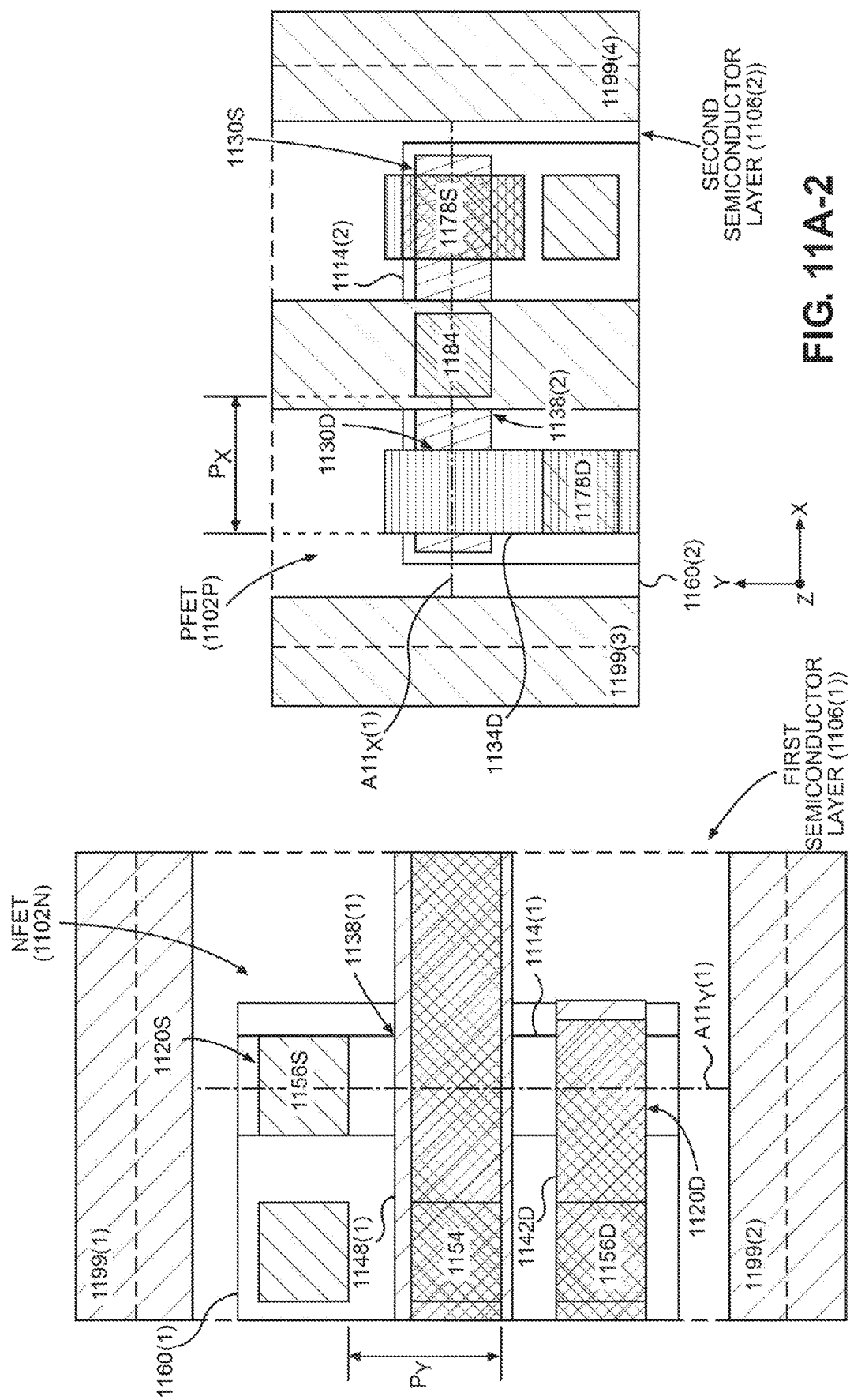

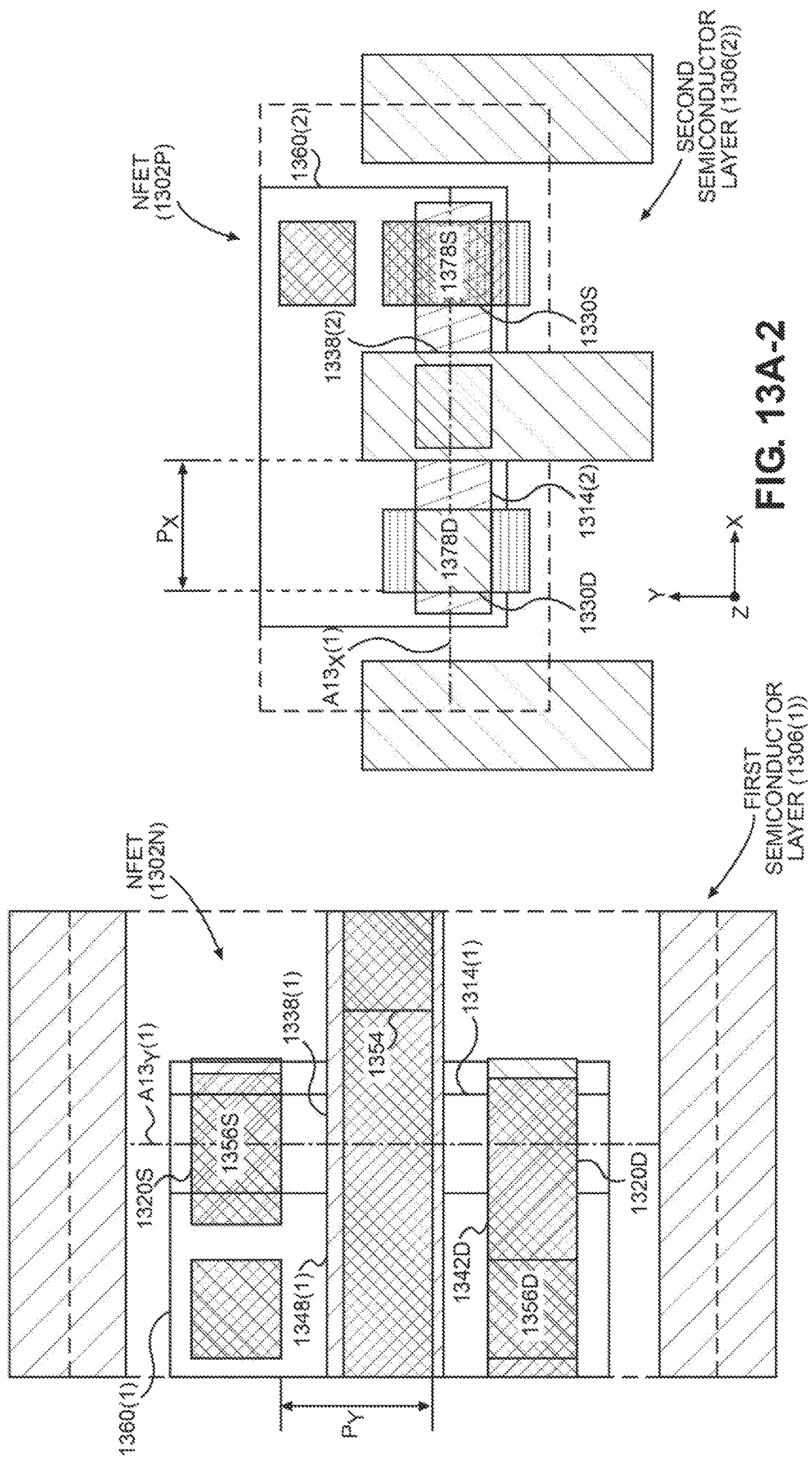

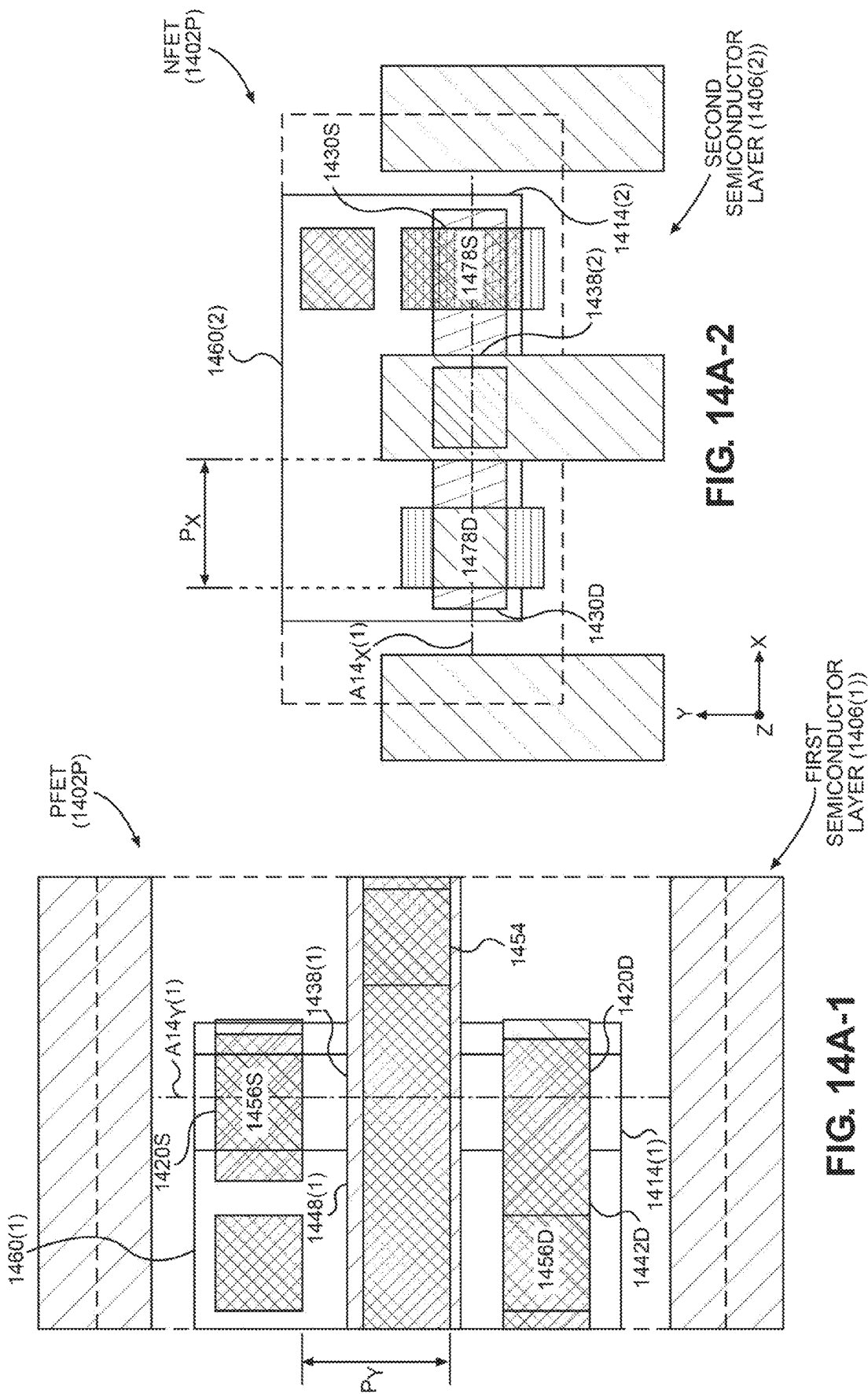

US 10,861,852 B2

THREE-DIMENSIONAL (3D), VERTICALLY-INTEGRATED FIELD-EFFECT TRANSISTORS (FETS) FOR COMPLEMENTARY METAL-OXIDE SEMICONDUCTOR (CMOS) CELL CIRCUITS

BACKGROUND

I. Field of the Disclosure

The technology of the disclosure relates generally to complementary metal-oxide semiconductor (MOS) (CMOS) circuits and, more specifically, to cell circuit architectures for realization of CMOS cell circuits.

II. Background

Transistors are essential components in modern electronic devices, and large numbers of transistors are employed in integrated circuits (ICs) therein. For example, components such as central processing units (CPUs) and memory systems each employ a large quantity of transistors for logic circuits and memory devices.

Transistors are formed on semiconductor substrates in which some portions are positively doped and others are negatively doped. Depending on the channel majority carrier type, transistors are one of a P-type and an N-type. A Field Effect Transistor (FET) is a transistor technology that is widely used in logic circuits and memory devices. In particular, a metal-oxide semiconductor (MOS) FET (MOSFET) may be one of a P-type and an N-type, and are referred to as PMOS FETs (PFETs) and NMOS FETs (NFETs). Forming logic circuits and memory devices of PFETs and NFETs coupled together in a complementary configuration provides advantages over designs of either NFET or PFET circuits alone. Such complementary configurations are known as complementary MOS (CMOS) circuits, which provide benefits in performance, power reduction, and resistance to noise. In fact, CMOS circuits are so commonly used in ICs that standardized CMOS logic circuits (e.g., inverters, NAND, NOR, etc.) have been developed for repetitive use. Design automation tools have been developed to implement circuit designs in which the standardized CMOS circuits are repetitively used and to generate circuit layouts in which standardized CMOS circuits may be densely organized. Such circuits are known as standard cells and may also be referred to herein as cell circuits. With ongoing market pressure for electronic devices to have more functionality in a smaller package, the area of a semiconductor substrate occupied by a cell circuit has significant impact on the total area of an IC. A physical layout of a CMOS cell circuit identifies an arrangement of all elements of the cell circuit, including at least one PMOS transistor, at least one NMOS transistor, internal interconnects of the PMOS and NMOS transistors, and contacts for external interconnects to power, ground, and other circuits. The cell circuit layout determines a total area or footprint of a standard cell, as well as the complexity of internal and external interconnects. Standard cell circuits may have different widths but usually have a same track height to optimize layout area.

In this regard, FIG. 1 below illustrates a top view of a layout 100 as an example of a conventional CMOS standard cell 102 (referred to as "standard cell 102") employing FinFETs. FinFETs are a transistor technology in which a semiconductor channel is provided in a fin structure extending vertically above the substrate, making it possible to increase a cross-sectional area of current flow without increasing a horizontal area. The standard cell 102 includes gates 104(1)-104(4) disposed along respective, parallel longitudinal axes $A1_Y(1)$-$A1_Y(4)$ in a first direction 106 of the Y-axis with a defined gate pitch $G_P$. The standard cell 102 includes a first voltage rail 108 configured to be coupled to a supply voltage. The first voltage rail 108 is disposed along a longitudinal axis $A1_X(1)$ in a second direction 110 of the X-axis substantially orthogonal to the first direction 106 in a first metal layer 112 (e.g., a metal zero (M0) metal layer). Additionally, the standard cell 102 includes a second voltage rail 114 having a longitudinal axis $A1_X(2)$ in the second direction 110 in the first metal layer 112. The standard cell 102 also includes diffusion regions 116P, 116N of P-type doped and N-type doped semiconductor materials, respectively, for forming active devices that include semiconducting materials, such as transistors. The standard cell 102 also includes fins 118(1)-118(4) for forming semiconductor channels of FinFETs disposed in the second direction 110 between the first and second voltage rails 108, 114. In this example, a first FinFET 119P formed in the P-type diffusion region 116P will include two fins 118(1), 118(2) to form its semiconductor channel, and a second FinFET 119N formed in the N-type diffusion region 116N will include two fins 118(3), 118(4) to form its semiconductor channel. Trench contacts 120(1)-120(3) are also formed in the first direction 106 to provide contacts to source/drain regions S(1)-S(4), D(1)-D(4) of the fins 118(1), 118(2) formed in the standard cell 102. Trench contact 120(1) has been cut. A metal line 122(1) can be formed in the first metal layer 112 to provide an interconnection to the trench contact 120(1) to provide interconnections to the source or drain region S(1), D(1). Vias (V1) 124(1), 124(2) can be formed over portions of the gates 104(1)-104(4) to form metal contacts to the gates 104(1)-104(4).

The FinFETs 119P, 119N in standard cell 102 in FIG. 1 each have two (2) respective fins 118(1)-118(2) and 118(3)-118(4) to serve as channel structures. Further advancements in technology have made it possible to fabricate standard cells that support FinFETs employing a single fin for a channel structure. A CMOS standard cell layout for single-fin FinFETs can occupy less area than the standard cell 102 in FIG. 1 for example, which can reduce total chip size and the number of internal interconnections required. There is a continued desire to further reduce the footprint size of a cell circuit. However, since the number of fins in a FinFET cannot be reduced beyond one fin, a reduction in the number of fins is no longer available as a means for reducing a footprint area of a FinFET standard cell.

SUMMARY OF THE DISCLOSURE

Aspects disclosed herein include three dimensional (3D), vertically-integrated Field-Effect Transistors (FETs) for complementary metal-oxide semiconductor (CMOS) cell circuits. Vertically integrating FETs for a 3D cell circuit can reduce the footprint size of CMOS circuits in an integrated circuit (IC) chip. A CMOS cell circuit is a building block that may be repeatedly employed by design automation tools in an IC design as part of an IC chip fabrication. In aspects disclosed herein, to reduce a footprint of a CMOS cell circuit, a P-type FET (PFET) and an N-type FET (NFET) are vertically integrated by stacking a second semiconductor layer that includes a second FET above a first semiconductor layer that includes a first FET, such that the channel structure of the second FET overlaps the channel structure of the first FET. For example, the first FET may be an NFET, and the second FET may be a PFET, or vice versa. The longitudinal axis of the first FET channel structure may extend in a first plane that is parallel to a second plane in which the longitudinal axis of the second FET channel structure extends. The longitudinal axes may be parallel or at an angle to each other, such that at least a portion of the second channel structure overlaps (i.e., is directly above) the first channel structure. For instance, an active gate of the second FET may overlap an active gate of the first FET. Overlapping the channel structures of the first and second FETs in the CMOS cell circuit by vertical integration can reduce the footprint size of the cell circuit in comparison to each FET being laterally (i.e., horizontally) disposed on the same semiconductor layer.

To provide interconnections to source, drain, and gate regions of each of the vertically-integrated FETs, the cell circuit is designed so that contacts to the respective regions of the channel structure of the first FET on the first semiconductor layer are located below open areas of the second semiconductor layer (i.e., areas not occupied by the second channel structure or gate of the second FET). This allows unobstructed vertical access to the metal layers for the FET in the bottom semiconductor layer of stacked semiconductor layers.

In other aspects disclosed herein, the first FET may be formed in the first semiconductor layer in a process that is separate from forming the second semiconductor layer that has the second FET formed therein. The second semiconductor layer may be bonded to a top surface of the first semiconductor layer in which the first FET has been formed. The second FET may be formed in the second semiconductor layer before or after the second semiconductor layer is bonded to the first semiconductor layer. The first FET and the second FET may be bulk-type FETs or silicon-on-insulator (SOI) FETs. The second FET may be either a PFET or an NFET, with the first FET being opposite to the second FET. The second FET may be stacked on the first FET in a bottom-to-top orientation, or a top-to-top orientation.

In this regard, in one aspect, a CMOS cell circuit is disclosed herein. The CMOS cell circuit includes a first semiconductor layer, a second semiconductor layer disposed above the first semiconductor layer, and a second gate. The first semiconductor layer includes a first channel structure, a first channel column of the first channel structure, and a first gate comprising a first active gate disposed on the first channel structure. The second semiconductor layer includes a second channel structure, and a second channel column of the second channel structure, the second channel structure overlapping the first channel structure such that at least a portion of the second channel column of the second channel structure overlaps a least a portion of the first channel column of the first channel structure. The second gate includes a second active gate disposed on the second channel structure. The first semiconductor layer further includes a first type FET including a first source/drain (S/D) region in a first end portion of the first channel structure, a first drain/source (D/S) region in a second end portion of the first channel structure, and the first active gate disposed between the first S/D region and the first D/S region. The second semiconductor layer further includes a second type FET, including a second S/D region in a first end portion of the second channel structure, a second D/S region in a second end portion of the second channel structure, and the second active gate disposed between the second S/D region and the second D/S region.

In another aspect, a method of fabricating a CMOS cell circuit is disclosed herein. The method includes forming a first semiconductor layer including a first type FET. Forming the first type FET includes forming a first channel structure extending longitudinally in a first direction, forming a first S/D region in a first end portion of the first channel structure, forming a first D/S region in a second end portion of the first channel structure, and forming a first active gate above a top surface of the first channel structure between the first S/D region and the first D/S region. The method of forming a CMOS cell circuit further includes disposing a second semiconductor layer above the first semiconductor layer, which includes disposing a semiconductor substrate on a top surface of the first semiconductor layer, and forming a second type FET in the semiconductor substrate. Forming the second type FET in the semiconductor substrate includes forming a second channel structure in the semiconductor substrate, the second channel structure extending longitudinally in a second direction and overlapping above at least a portion of a first channel column of the first channel structure, forming a second S/D region in the second channel structure, forming a second D/S region in the second channel structure, and forming a second active gate on the second channel structure between the second S/D region and the second D/S region.

BRIEF DESCRIPTION OF THE FIGURES

FIGS. 2C-1 and 2C-2 are top views of the first semiconductor layer that includes a first FinFET, and the second semiconductor layer, that includes a second FinFET, that is vertically stacked above the first semiconductor layer during fabrication of the CMOS cell circuit shown in FIGS. 2A and 2B;

FIG. 2D is a top view of the first and second semiconductor layers of the CMOS cell circuit in FIGS. 2C-1 and 2C-2, respectively, vertically integrated to form the CMOS cell circuit in FIGS. 2A and 2B;

FIG. 4G is a cross-sectional side view in another exemplary fabrication stage of the vertically-integrated CMOS cell circuit in FIGS. 2A-2D in which a fin for the PMOS bulk-type FinFET is formed on the well region in the semiconductor substrate, according to the fabrication process in FIG. 3;

FIGS. 5A-1 and 5A-2 are top views of a first semiconductor layer that includes a PFET, and a second semiconductor layer that includes an NFET that is vertically stacked above the first semiconductor layer during fabrication of the CMOS cell circuit;

FIG. 6B is a cross-sectional side view in a second direction of the exemplary CMOS cell circuit shown in FIG. 6A;

FIG. 7B is a cross-sectional side view in a second direction of the exemplary CMOS cell circuit shown in FIG. 6A;

FIGS. 7C-1 and 7C-2 are top views of an exemplary first semiconductor layer including a NFET, and an exemplary second semiconductor layer including a PFET, respectively, for fabricating the CMOS cell circuit shown in FIGS. 7A and 7B;

FIG. 10B is a cross-sectional side view in a second direction of the exemplary CMOS cell circuit shown in FIG. 10A;

FIGS. 11A-1 and 11A-2 are top views of an exemplary first semiconductor layer including an NFET, and an exemplary second semiconductor layer including a PFET, respectively, for fabricating a CMOS cell circuit in which fins of the vertically integrated NFET and PFET are orthogonal to each other and the fin of the PFET overlaps a gate region of the NFET;

FIGS. 12A-1 and 12A-2 are top views of an exemplary first layer including a PFET, and an exemplary second semiconductor layer including an NFET, respectively, for fabricating a CMOS cell circuit in which fins of the vertically integrated PFET and NFET are orthogonal to each other and the fin of the NFET overlaps a gate region of the PFET;

FIGS. 13A-1 and 13A-2 are top views of an exemplary first semiconductor layer including an NFET, and an exemplary second semiconductor layer including a PFET, respectively, for fabricating a CMOS cell circuit in which fins of the vertically integrated NFET and PFET are orthogonal to each other and the fin of the PFET overlaps a drain/source region of the NFET;

FIGS. 14A-1 and 14A-2 are top views of an exemplary first semiconductor layer including a PFET, and an exemplary second semiconductor layer including an NFET, respectively, for fabricating a CMOS cell circuit in which fins of the vertically integrated PFET and NFET are orthogonal to each other and the fin of the NFET overlaps a drain/source region of the PFET;

DETAILED DESCRIPTION

Figure 1:
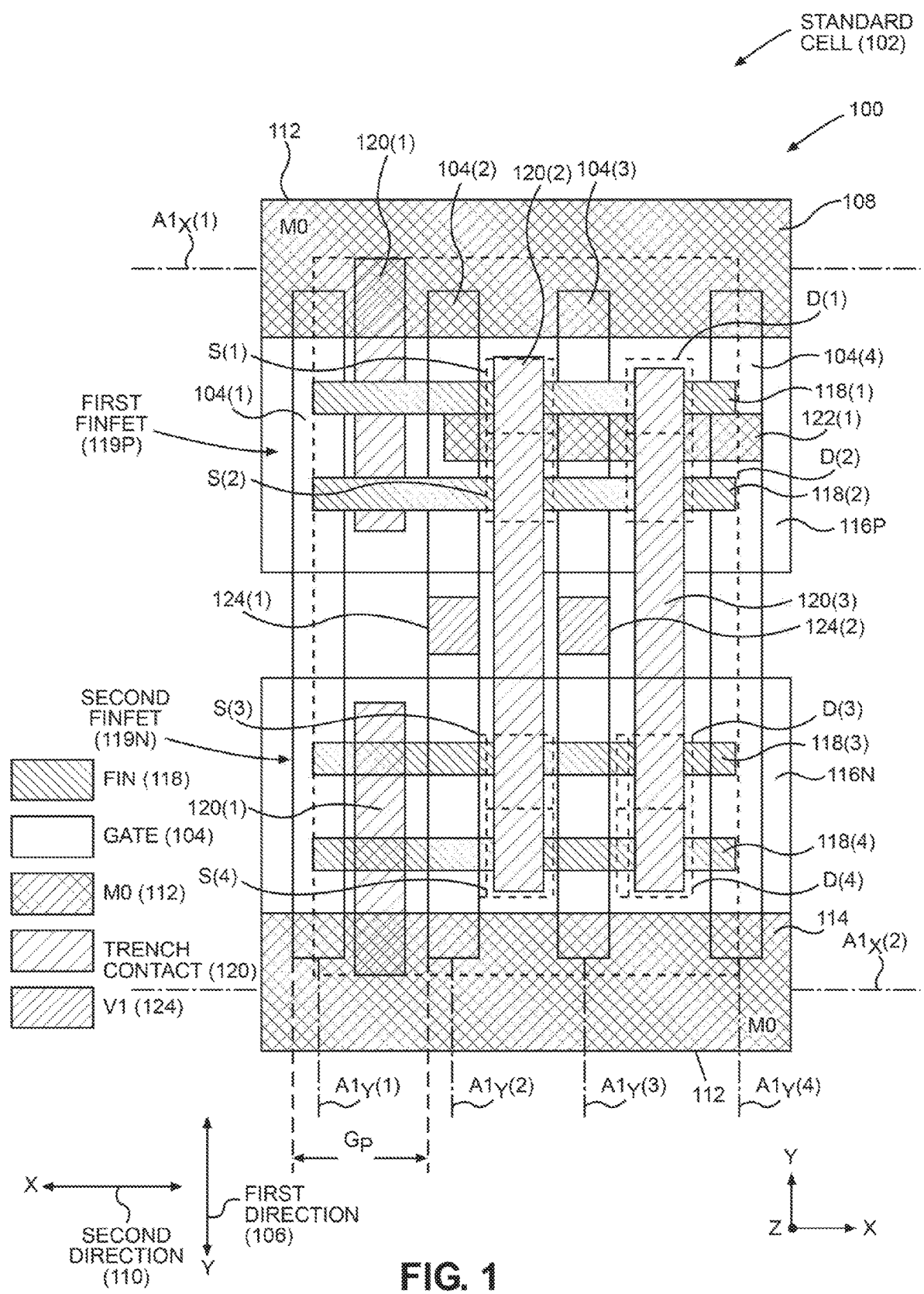
FIG. 1 is a top view of a conventional complementary metal-oxide semiconductor (CMOS) cell circuit layout including a P-type metal oxide semiconductor (MOS) (PMOS) Fin Field-Effect Transistor (FET) (FinFET) and an N-type MOS (NMOS) FinFET laterally disposed on a semiconductor layer.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include three dimensional (3D), vertically integrated field-effect transistors (FETs) for complementary metal-oxide semiconductor (CMOS) cell circuits. Vertically integrating FETs for a 3D cell circuit can reduce the footprint size of CMOS circuits in an integrated circuit (IC) chip. A CMOS cell circuit is a building block that may be repeatedly employed by design automation tools in an integrated circuit (IC) design as part of a an IC chip fabrication. In aspects disclosed herein, to reduce a footprint of a CMOS cell circuit, a P-type FET (PFET) and an N-type FET (NFET) are vertically integrated by stacking a second semiconductor layer that includes a second FET above a first semiconductor layer that includes a first FET, such that the channel structure of the second FET overlaps the channel structure of the first FET. For example, the first FET may be an NFET, and the second FET may be a PFET, or vice versa. The longitudinal axis of the first FET channel structure may extend in a first plane that is parallel to a second plane in which the longitudinal axis of the second FET channel structure extends. The longitudinal axes may be parallel or at an angle to each other, such that at least a portion of the second channel structure overlaps (i.e., directly above) the first channel structure. For instance, the active gate of the second FET may overlap the active gate of the first FET. Overlapping the channel structures of the first and second FETs in the CMOS cell circuit by vertical integration can reduce a footprint size of the cell circuit in comparison to each FET being laterally (i.e., horizontally) disposed on the same semiconductor layer.

To provide interconnections to source, drain, and gate region of each of the vertically integrated FETs, the cell circuit is designed so that contacts to the respective regions of the channel structure of the first FET on the first semiconductor layer are located below open areas of the second semiconductor layer (i.e., areas not occupied by the second channel structure or gate of the second FET). This allows unobstructed vertical access to the metal layers for the FET in the bottom semiconductor layer of stacked semiconductor layers.

In other aspects disclosed herein, the first FET may be formed in the first semiconductor layer in a process that is separate from forming the second semiconductor layer that has the second FET formed therein. The second semiconductor layer may be bonded to a top surface of the first semiconductor layer in which the first FET has been formed. The second FET may be formed in the second semiconductor layer before or after the second semiconductor layer is bonded to the first semiconductor layer. The first FET and the second FET may be bulk type FETs or silicon-on-insulator (SOI) type FETs. The second FET may be either a PFET or an NFET, with the first FET being opposite to the second type FET. The second FET may be stacked on the first FET in a bottom-to-top orientation, or a top-to-top orientation.

Figure 2A:
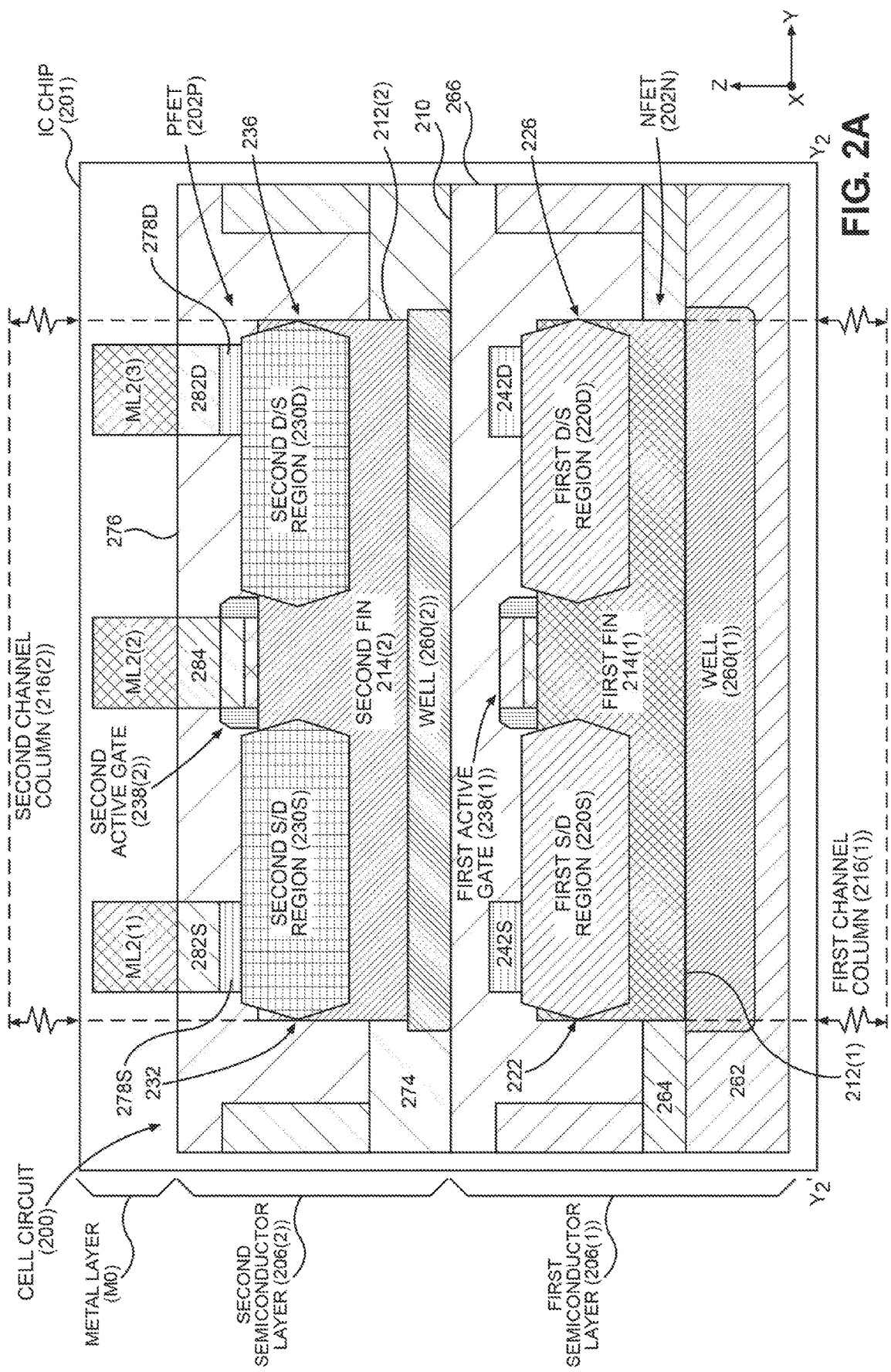
FIG. 2A is a cross-sectional side view in a first direction of an exemplary CMOS cell circuit that includes a bulk-type PFET in a second semiconductor layer vertically stacked in a bottom-to-top orientation above a bulk-type NFET in a first semiconductor layer such that the channel structure of the PFET overlaps the channel structure of the NFET to reduce the footprint size of the CMOS cell circuit.

In this regard, FIG. 2A is a cross-sectional side view of an exemplary CMOS cell circuit 200 (referred to herein as "cell circuit 200"). The cell circuit 200 can be formed as part of an IC in an IC chip 201, such as a system-on-a-chip (SoC). The cross-sectional side view of the cell circuit 200 in FIG. 2A is in the direction of the X-axis along the cross-sectional line from $X_2'$ to $X_2$ in the top view illustration of the cell circuit 200 in FIG. 2D ($X_2'$ is right side and $X_2$ is left side), which is discussed further below. The reference to "right side" and "left side" herein are specific to the exemplary orientation of the cell circuit 200 in FIG. 2A. The cross-section of the cell circuit 200 in FIG. 2A is in a plane in the Y-axis and Z-axis directions along the line $Y_2$-$Y_2'$.

With further reference to FIG. 2A, in this example, an NMOS FET (NFET) 202N in the form of a FinFET is formed in a first semiconductor layer 206(1) of the cell circuit 200, and a PMOS FET (PFET) 202P in the form of a FinFET is formed in a second semiconductor layer 206(2) to support CMOS circuits. To reduce a footprint area of the cell circuit 200, the second semiconductor layer 206(2) is vertically integrated (i.e., "stacked") on or above a top surface 210 of the first semiconductor layer 206(1). This is in contrast to the NFET 202N and the PFET 202P being fabricated laterally disposed, side-by-side in the X-axis direction in the same semiconductor layer. In particular, as illustrated in FIG. 2A, the second semiconductor layer 206(2) is stacked on the first semiconductor layer 206(1) such that a first channel structure 212(1) of the NFET 202N is overlapped in the vertical Z-axis direction by a second channel structure 212(2) of the PFET 202P to reduce a horizontal area occupied by the cell circuit 200 to reduce and/or conserve chip area. In the NFET 202N, the first channel structure 212(1) is in the form of a first fin 214(1). In the PFET 202P, the second channel structure 212(2) is in the form of a second fin 214(2).

As shown in FIG. 2A, a second channel column 216(2) extends vertically (up and down) from a horizontal area of the second fin 214(2), and a first channel column 216(1) extends vertically from a horizontal area of the first fin 214(1). In this regard, the second channel column 216(2) overlaps at least a portion of the first channel column 216(1). In the example in FIG. 2A, the second fin 214(2) in the second semiconductor layer 206(2) overlaps the first fin 214(1) in the first semiconductor layer 206(1) such that the second channel column 216(2) fully overlaps (i.e., occupies substantially the same area extending in a vertical direction) as the first channel column 216(2).

With continuing reference to FIG. 2A, the NFET 202N includes a first source/drain (S/D) region 220S in a first end portion 222 of the first fin 214(1), and a first drain/source (D/S) region 220D in a second end portion 226 of the first fin 214(1). For example, if the first S/D region 220S is a source (S) region, the first D/S region 220D is a drain (D) region, and vice versa. Similarly, the PFET 202P includes a second S/D region 230S in a first end portion 232 of the second fin 214(2), and a second D/S region 230D in a second end portion 236 of the second fin 214(2). A first active gate 238(1) is disposed on the first fin 214(1) between the first S/D region 220S and the first D/S region 220D, and a second active gate 238(2) is disposed on the second fin 214(2) between the second S/D region 230S and the second D/S region 230D. To electrically couple the PFET 202P in the cell circuit 200, the second S/D region 230S, the second D/S region 230D, and the second active gate 238(2) each vertically couple, within the second channel column 216(2), to a respective metal line (not shown) above the second semiconductor layer 206(2). However, due to the second channel column 216(2) of the second fin 214(2) overlapping the first channel column 216(1) of the first fin 214(1), vertical coupling from the metal lines to any of the first S/D region 220S, the first D/S region 220D, and the first active gate 238(1) is obstructed by the second fin 214(2). To avoid obstruction caused by the overlapping second channel column 216(2), the first semiconductor layer 206(1) includes horizontal interconnect structures, such as horizontal interconnect structures 242S and 242D which are described further with reference to FIG. 2B.

To provide interconnections to source, drain, and gate regions of channel structures of each of the vertically-integrated FETs, the cell circuit 200 is designed so that contacts to the respective regions of the first channel structure 212(1) of the NFET 202N on the first semiconductor layer 206(1) are located below open areas of the second semiconductor layer 206(2) (i.e., areas not occupied by the second channel structure 212(2) or other structures of the PFET 202P). This allows unobstructed vertical access between the metal lines and the NFET 202N in the first semiconductor layer 206(1) of the stacked semiconductor layers.

Figure 2B:
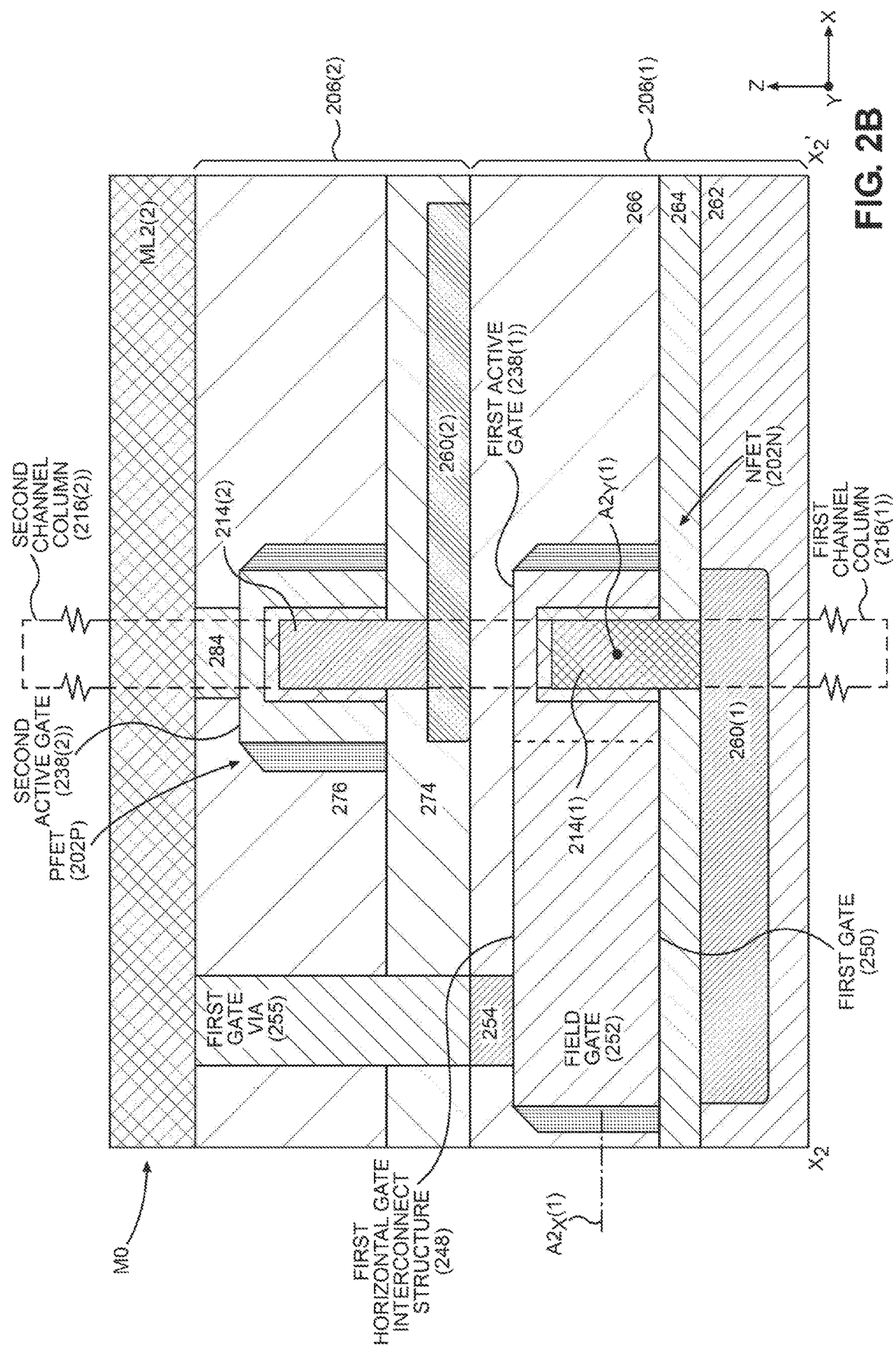
FIG. 2B is a cross-sectional side view of the vertically-integrated CMOS cell circuit shown in FIG. 2A in a second direction orthogonal to the first direction in FIG. 2A.

FIG. 2B is cross-sectional side view of the cell circuit 200 including the NFET 202N and the PFET 202P. Specifically, the cross-sectional side view in FIG. 2B is in the direction of the Y-axis along the cross-sectional line from $Y_2'$ to $Y_2$ in the illustration in FIG. 2D, which is discussed further below. The cross-section of the cell circuit 200 is in a plane in the X-axis and Z-axis directions. FIG. 2B illustrates an end view of the first fin 214(1) along a first longitudinal axis $A2_Y(1)$. As shown in FIGS. 2A and 2B, the second channel column 216(2) of the second fin 214(2) overlaps the first channel column 216(1) of the first fin 214(1) in both the X-axis direction and the Y-axis direction. Alternatively, the second channel column 216(2) may partially overlap the first channel column 216(1). In the first channel column 216(1) of the first fin 214(1), where vertical coupling is obstructed by the overlapping second fin 214(2), the first semiconductor layer 206(1) includes at least one horizontal interconnect structure having a second longitudinal axis $A2_X(1)$ orthogonal to the first longitudinal axis $A2_Y(1)$ (i.e., of the first fin 214(1)) and extending outside the second channel column 216(2) of the second fin 214(2). For example, in FIG. 2B, the first semiconductor layer 206(1) includes a first horizontal gate interconnect structure 248 in contact with the first active gate 238(1). In this regard, a first gate 250 of the NFET 202N includes a field gate 252, which is adjacent to the first active gate 238(1) and comprises the first horizontal gate interconnect structure 248. The first semiconductor layer 206(1) also includes a first metal gate contact 254 outside of the second channel column 216(2) of the second fin 214(2) and in contact with the first horizontal gate interconnect structure 248. Vertical coupling to a metal line ML2(2) from the first metal gate contact 254 is not obstructed by the second fin 214(2). A first gate via 255 vertically couples the first metal gate contact 254 to the metal line ML2(2). Thus, the first gate 250 is electrically coupled to the metal line ML2(2).

1 Returning to FIG. 2A, it is shown therein that the second channel column 216(2) of the second fin 214(2) also overlaps the first S/D region 220S and the first D/S region 220D of the first fin 214(1), obstructing vertical coupling to the first S/D region 220S and the first D/S region 220D. In this regard, the first semiconductor layer 206(1) includes the first horizontal S/D interconnect structure 242S in contact with the first S/D region 220S. The first semiconductor layer 206(1) includes the first horizontal D/S interconnect structure 242D in contact with the first D/S region 220S With reference back to FIG. 2A, the NFET 202N is a bulk-type FinFET, with the first fin 214(1) formed on a well region 260(1) in a semiconductor substrate 262. A first shallow trench isolation (STI) layer 264 surrounds a lower portion of the first fin 214(1), and the first S/D region 220S and the first D/S region 220D are formed in upper portions of the first fin 214(1). The first semiconductor layer 206(1) further includes a first protective inter-layer dielectric (ILD) 266 that forms the top surface 210 of the first semiconductor layer 206(1). The PFET 202P is a bulk-type FinFET with the second fin 214(2) formed on a well region 260(2). A second STI layer 274 surrounds a lower portion of the second fin 214(2). The second S/D region 230S and the second D/S region 230D are formed in upper portions of the second fin 214(2). The second semiconductor layer 206(2) further includes a second protective ILD 276. A second metal S/D contact 278S and a second metal D/S contact 278D are formed on the second S/D region 230S and the second D/S region 230D, respectively. The second metal S/D contact 278S, the second active gate 238(2), and the second metal D/S contact 278D of the PFET 202(P) are vertically coupled through the second protective ILD 276 to metal lines ML2(1), ML2(2), and ML2(3), respectively, by vias 282S, 284, and 282D.

Figure 7A:
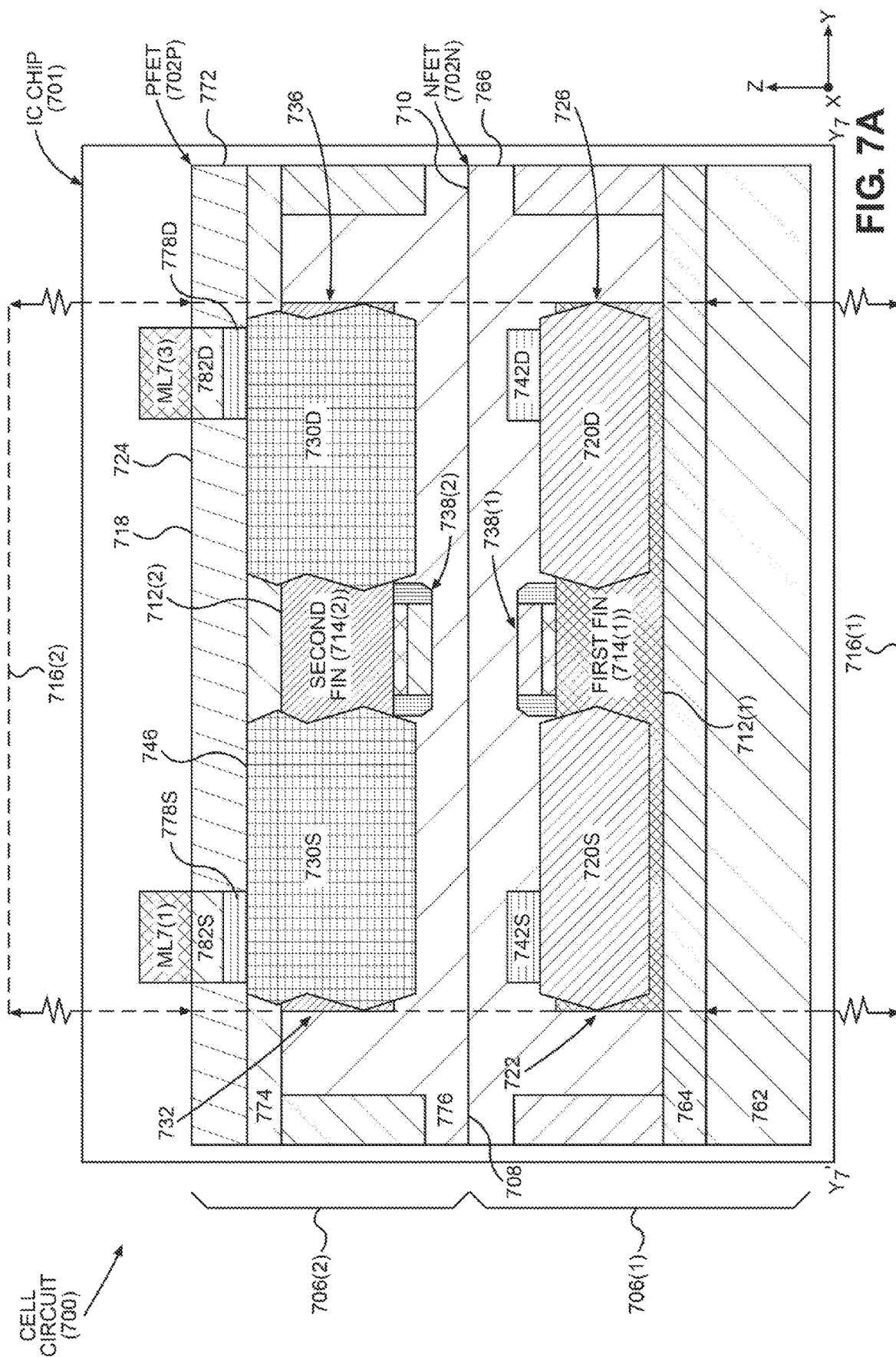
FIG. 7A is a cross-sectional side view in a first direction of an exemplary CMOS cell circuit in which a SOI PFET in a second semiconductor layer is vertically integrated in a top-to-top orientation on a SOI NFET in a first semiconductor layer.
Figures 2, 7C:
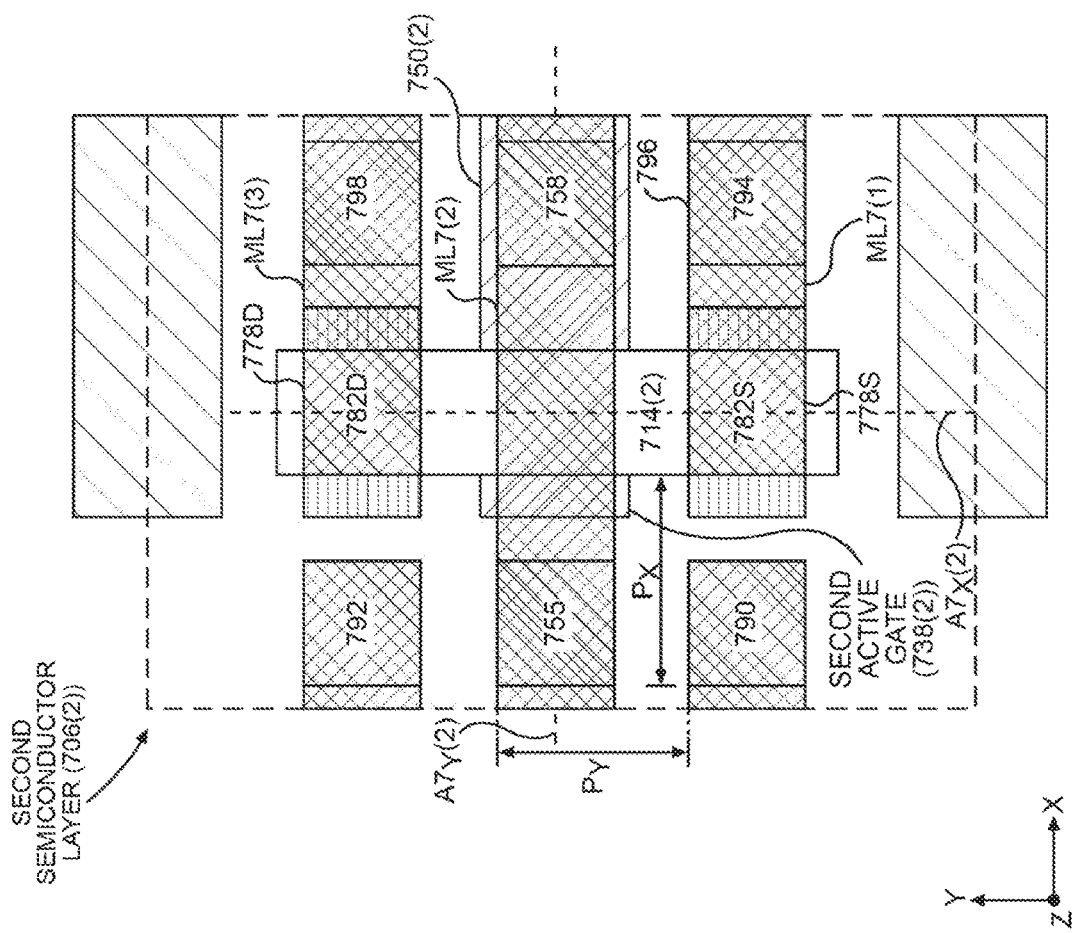
Figures 1, 7C:
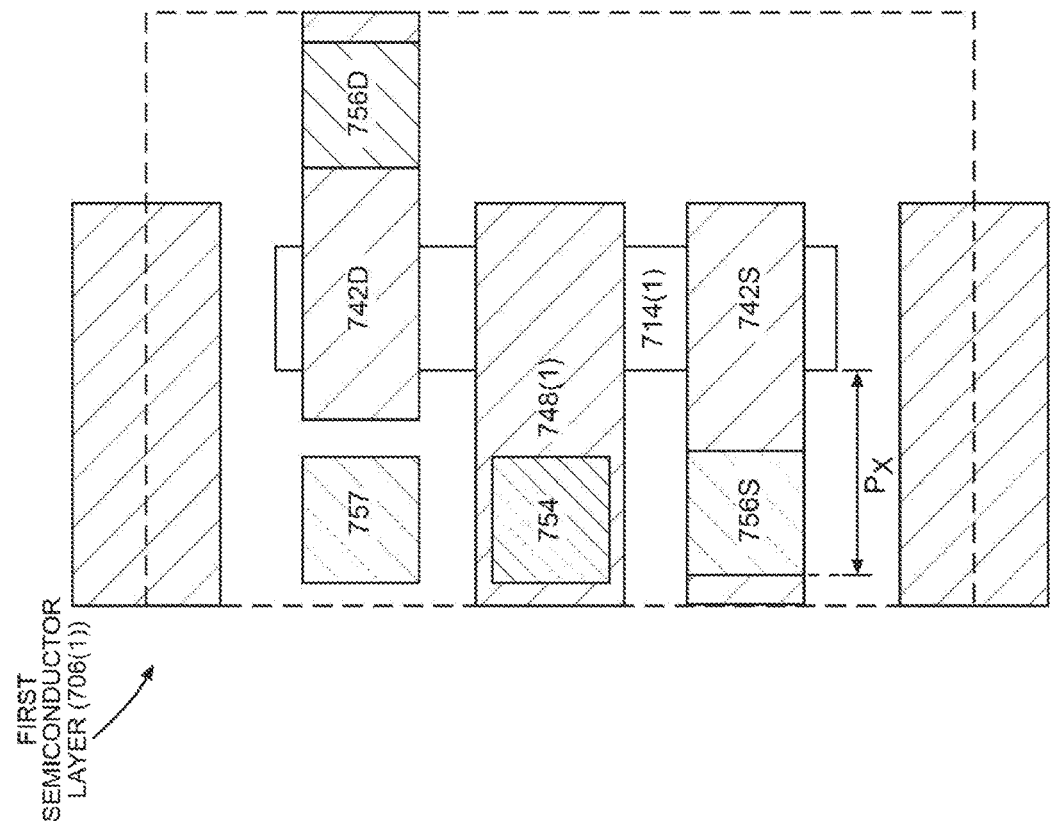

FIGS. 2C-1 and 2C-2 are separate top views of the first semiconductor layer 206(1) including the NFET 202N, and the second semiconductor layer 206(2) including the PFET 202P that is vertically stacked above the first semiconductor layer 206(1) during fabrication of the cell circuit 200. FIG. 2C-1 illustrates a top view (i.e., a perspective in the Z-axis direction) of features of the first semiconductor layer 206(1). FIG. 2C-2 illustrates a top view of features of the second semiconductor layer 206(2), and also shows exemplary interconnects formed by the metal lines ML2(1), ML2(2), and ML2(3). FIG. 2C-2 shows a top view perspective of the second semiconductor layer 206(2), vias 282S, 284, 282D, 290, 255, 292, 294, and 298 spaced apart in the Y-axis direction according to a line pitch $P_Y$ of the metal lines ML2(1), ML2(2), and ML2(3), and also spaced apart according to a line pitch $P_X$ in the X-axis direction. The first S/D region 220S, the first active gate 238(1), and the first D/S region 220D are disposed along the first fin 214(1) in the Y-axis direction and spaced apart at the line pitch $P_Y$ to coincide with the metal lines ML2(1), ML2(2), and ML2(3). Thus, the first horizontal S/D interconnect structure 242S, the first horizontal gate interconnect structure 248, and the first horizontal D/S interconnect structure 242D are disposed along the first fin 214(1) at the line pitch $P_Y$ in the Y-axis direction. The first horizontal S/D interconnect structure 242S is in contact with a first metal S/D contact 256S outside of the second channel column 216(2) of the second fin 214(2), and the first horizontal D/S interconnect structure 242D is in contact with a first metal D/S contact 256D outside of the second channel column 216(2) of the second fin 214(2). The first metal S/D contact 256S and the first metal gate contact 254 are each spaced at the line pitch $P_X$ in the X-axis direction to the left side in FIG. 2C-1. The well region 260(1) extends at least a line pitch $P_X$ in the X-axis direction from the first fin 214(1) so that a first metal ground contact 257 can vertically couple a voltage from a ground node (not shown) to the well region 260(1). With the first metal ground contact 257 occupying the location at the line pitch $P_X$ to the left side of the first D/S region 220D, the first metal D/S contact 256D is spaced at the line pitch $P_X$ in the X-axis direction to the right side of the first fin 214(1). The reference to "right side" and "left side" here are specific to the exemplary orientation of the cell circuit 200 in FIGS. 2C-1 and 2C-2. Also shown in the FIGS. 2C-1 and 2C-2 are dummy gates 299(1)-299(4) disposed at ends of the first semiconductor layer 206(1) and the second semiconductor layer 206(2). The dummy gates 299(1)-299(4) are structural features but are not electrically active features of the cell circuit 200.

In FIG. 2C-2, the second fin 214(2) extends along a third longitudinal axis $A2_Y(2)$. As noted above, the vias 282S, 284, 282D, 290, 255, 292, 294, and 298 are spaced apart in the Y-axis direction according to the line pitch $P_Y$, and according to a line pitch $P_X$ in the X-axis direction to align features of the second semiconductor layer 206(2) with corresponding features in the first semiconductor layer 206(1). Metal contacts 278S and 278D on the second S/D region 230S and the second D/S region 230D, respectively, are each spaced at the line pitch $P_Y$ in the Y-axis direction from the second active gate 238(2). The vias 290, 255, and 292 are spaced at the line pitch $P_X$ to the left side of the second fin 214(2) in the X-axis direction in FIG. 2C-2, and are positioned to vertically couple to the first metal S/D contact 256S, the first metal gate contact 254, and the first metal ground contact 257, respectively, in FIG. 2C-1. A power source via 294 to couple a voltage from a supply voltage node (not shown) to the PFET 202P, and a first D/S via 298 to vertically couple to the first metal D/S contact 256D in the first semiconductor layer 206(1) are spaced at the line pitch $P_X$ to the right in the X-axis direction. In the example of cell circuit 200, the NFET 202N and the PFET 202P are coupled in an inverter configuration. In this regard, a metal line ML2(5) horizontally couples the first D/S via 298 to the via 282D, to couple the first D/S region 220D of the NFET 202N and the second D/S region 230D of the PFET 202P. In addition, the via 284 is horizontally coupled to the first gate via 255 by the metal line ML2(2), and the power source via 294 is horizontally coupled to the second S/D region 230S by a metal line ML2(4). However, the cell circuit 200 is not limited to an inverter configuration. The NFET 202N and the PFET 202P are independently vertically coupled to the metal lines or other interconnect layers not shown, so other configurations are possible.

FIG. 2D is a top view of the cell circuit 200 with the second semiconductor layer 206(2) vertically integrated with the first semiconductor layer 206(1) such that the second fin 214(2) of the PFET 202P overlaps the first fin 214(1) of the NFET 202N. Accordingly, the second channel column 216(2) of the second fin 214(2) overlaps the first channel column 216(1) of the first fin 214(1) in FIG. 2D. In addition, the vias 290, 255, and 292 of the left side of the second channel column 216(2) in the second semiconductor layer 206(2) are vertically aligned with the first metal S/D contact 256S, the first metal gate contact 254, and the first metal ground contact 257 in the first semiconductor layer 206(1). On the right side of the second channel column 216(2), the first D/S via 298 is vertically aligned with the first metal D/S contact 256D. The cell circuit 200, with the first and second semiconductor layers 206(1) and 206(2) vertically integrated as shown, has a reduced footprint area compared to a conventional CMOS circuit in which an NFET and a PFET are laterally disposed in a horizontal direction on a surface of a substrate. In addition, various configurations of the cell circuit 200 are made possible because the NFET 202N and the PFET 202P are both vertically coupled to the metal lines ML2(1), ML2(2), and ML2(3) or other metal lines (not shown).

Figure 3:
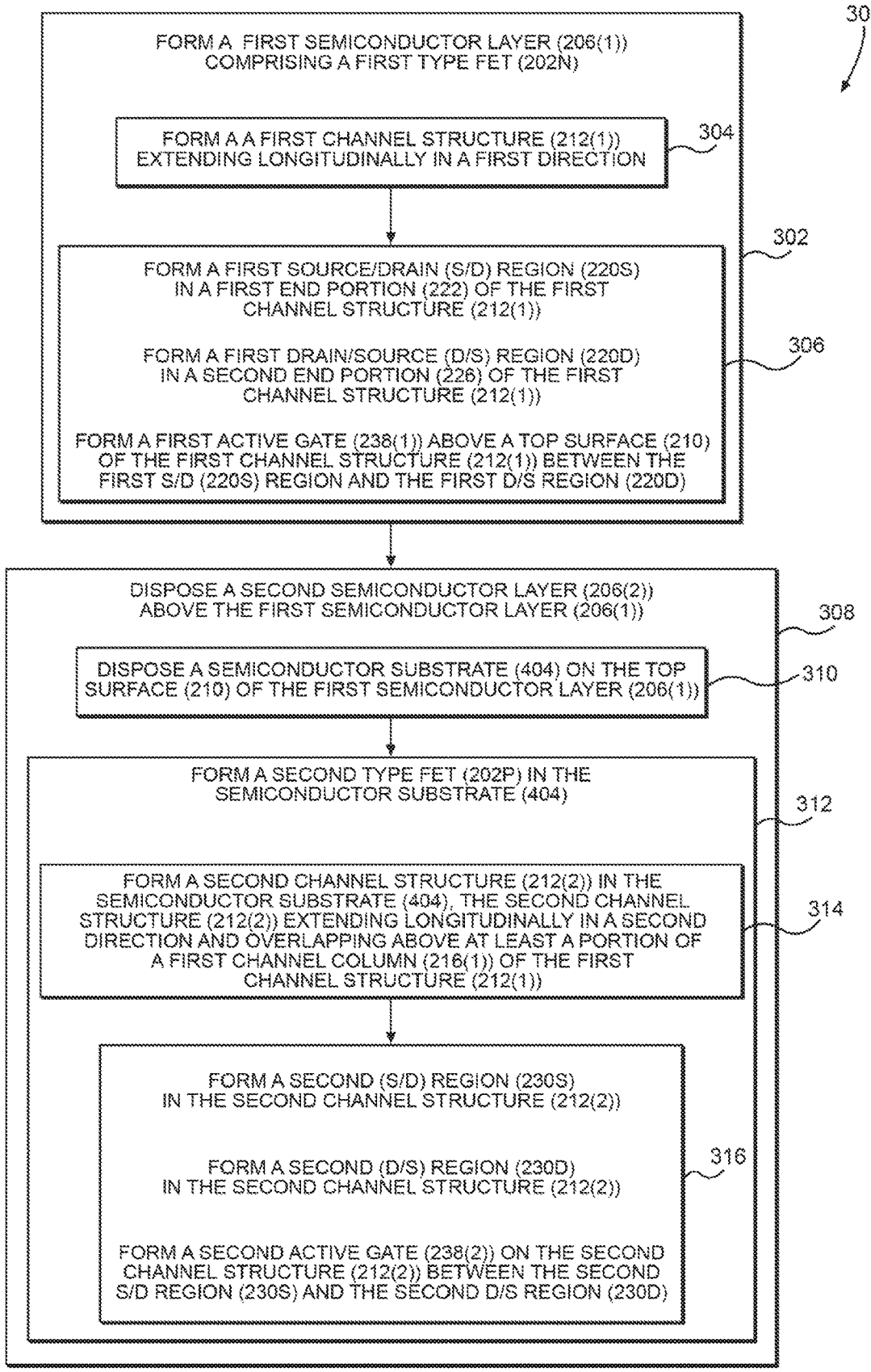
FIG. 3 is a flowchart illustrating an exemplary process for fabricating the vertically-integrated FETs in the CMOS cell circuit in FIGS. 2A-2D.

The cell circuit 200 can be fabricated according to a variety of methods and processes. For example, the cell circuit 200 can be fabricated according to CMOS fabrication methods. In this regard, FIG. 3 is a flowchart illustrating an exemplary process 300 of fabricating the cell circuit 200 in FIGS. 2A-2D in which the second semiconductor layer 206(2) is stacked on or above the top surface 210 of the first semiconductor layer 206(1) including the NFET 202N with the first fin 214(1) such that the second fin 214(2) in the PFET 202P in the second semiconductor layer 206(2) at least partially overlaps the first fin 214(1). FIGS. 4A-4K illustrate exemplary fabrication stages of the cell circuit 200 as it is fabricated according to the exemplary fabrication process 300. In this regard, the exemplary fabrication process 300 in FIG. 3 and the exemplary fabrication stages of the cell circuit 200 in FIGS. 4A-4K will be discussed in conjunction with each other below.

FIG. 3 is a flowchart illustrating an exemplary process 300 for fabricating the vertically-integrated FETs in the CMOS cell circuit in FIGS. 2A-2D. The process 300 is explained with reference to the fabrication stages illustrated in FIGS. 4A-4K.

Figure 4A:
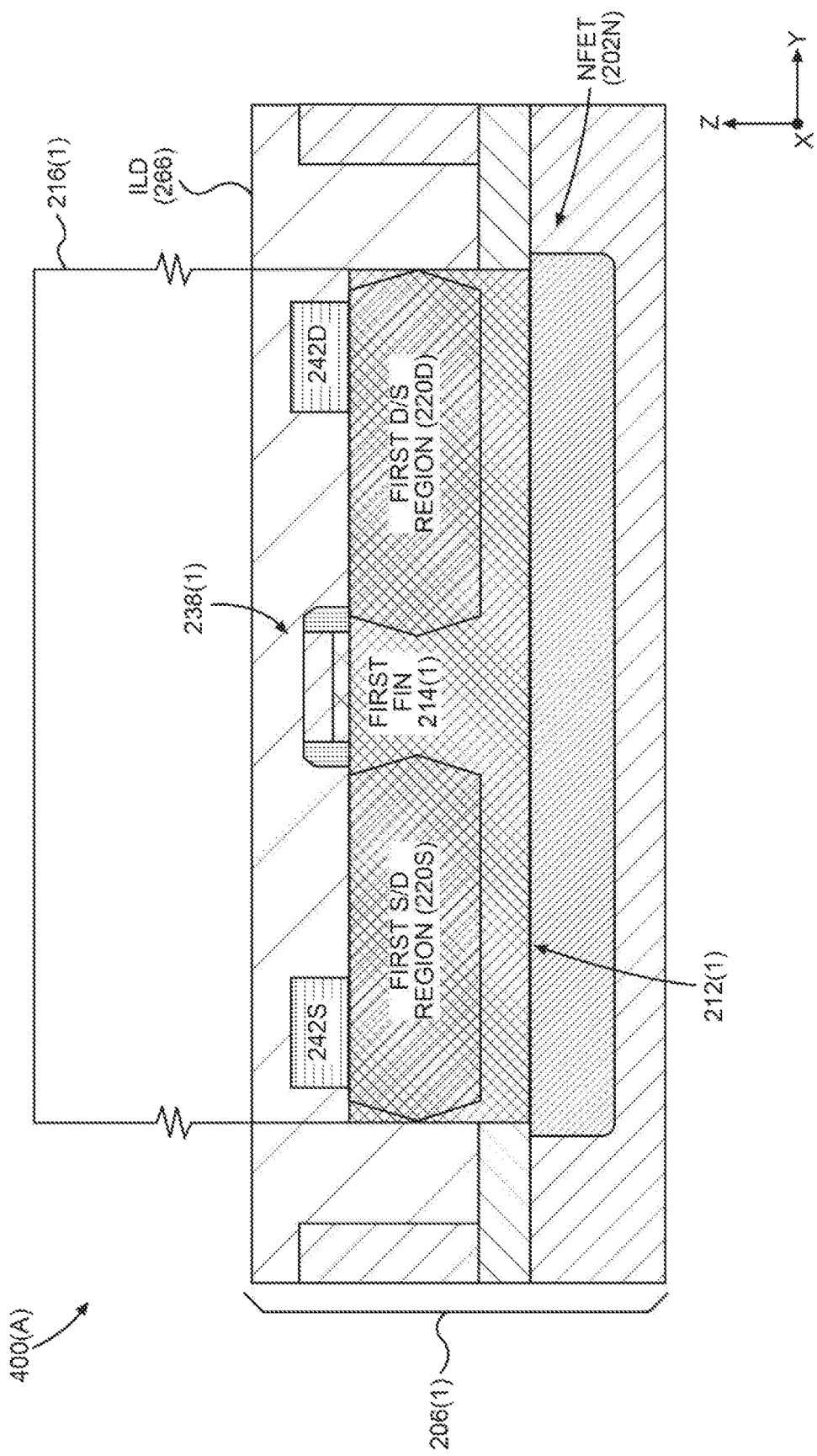
FIG. 4A is a cross-sectional side view of a first exemplary fabrication stage for fabricating the vertically-integrated CMOS cell circuit in FIGS. 2A-2D, in which the NMOS bulk-type FinFET with contacts to gate, source, and drain regions of a fin is formed in a first semiconductor layer, according to the exemplary fabrication process in FIG. 3.

FIG. 4A is a cross-sectional view of the first semiconductor layer 206(1) in a first fabrication stage 400(A) in which the first semiconductor layer 206(1), including the NFET 202N, is formed (block 302 in FIG. 3). Forming the first semiconductor layer 206(1) including the NFET 202N includes forming the first channel structure (i.e., fin) 212(1) extending longitudinally in a first direction on the semiconductor substrate 262 (block 304). Forming the first channel structure 212(1) includes doping the first channel structure 212(1) to form an NFET 202N, or doping the first channel structure 212(1) to form a PFET 202P. Forming the NFET 202N further includes forming the first S/D region 220S in the first end portion 222 of the first fin 214(1), forming the first D/S region 220D in the second end portion 226 of the first fin 214(1), and forming the first active gate 238(1) above the top surface 210 of the first channel structure between the first S/D region 220S and the first D/S region 220D (block 306). In anticipation of the second fin 214(2) being formed in the second channel column 216(2) directly above at least a portion of the first fin 214(1) overlapping at least a portion of the first channel column 216(1), the horizontal interconnect structures 242S, 248, and 242D are formed to couple with the first S/D region 220S, the first active gate 238(1), and the first D/S region 220D, respectively. Each of the horizontal interconnect structures 242S, 248, and 242D is formed having a longitudinal axis orthogonal to the longitudinal axis of the first fin 214(1). In addition, the first metal S/D contact 256S, the first metal gate contact 254, and the first metal D/S contact 256D are formed on and in contact with the horizontal interconnect structures 242S, 248, and 242D. The first protective ILD 266 is formed over the NFET 202N, including the first fin 214(1), the horizontal interconnect structures 242S, 248, and 242D, and the metal contacts 256S, 254, and 256D. A top surface of the first protective ILD 266 forms the top surface 210 of the first semiconductor layer 206(1).

Figure 4B:
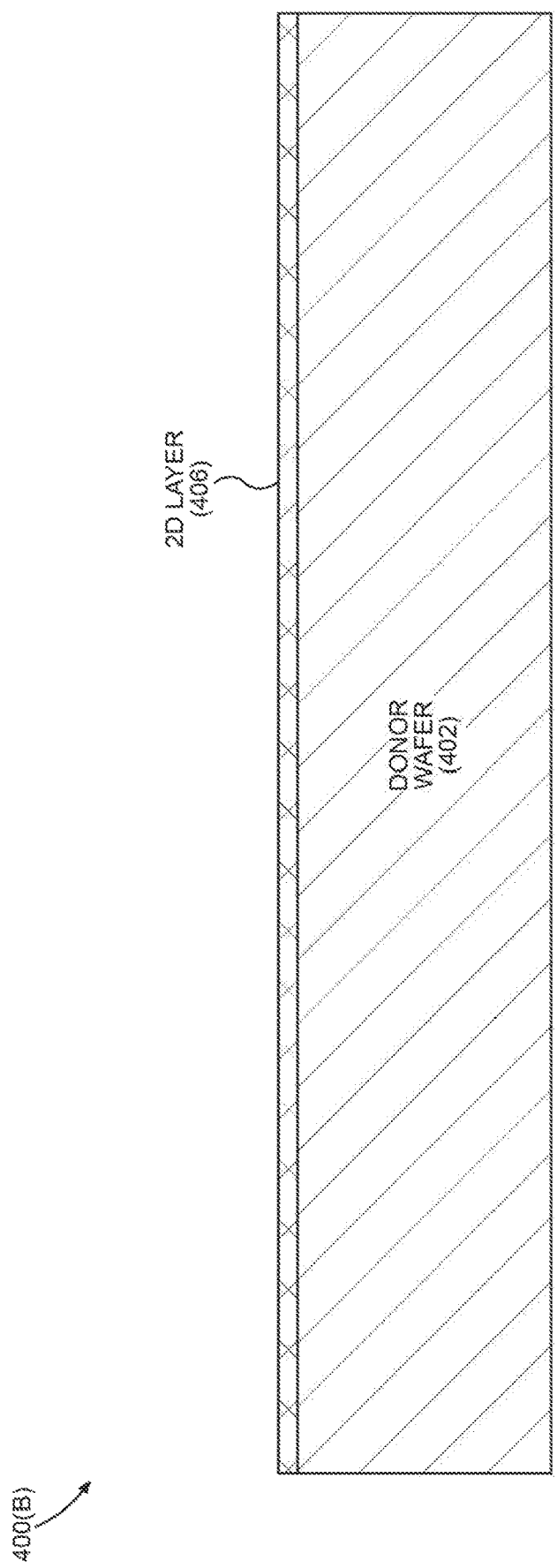
FIG. 4B is a cross-sectional side view in another exemplary fabrication stage of the vertically-integrated CMOS cell circuit in FIGS. 2A-2D of an exemplary donor wafer, according to the fabrication process in FIG. 3.

FIG. 4B illustrates an exemplary fabrication stage 400(B) in which fabricating the cell circuit 200 further includes disposing a second semiconductor layer 206(2) above the first semiconductor layer 206(1) (block 308). Disposing the second semiconductor layer 206(2) above the first semiconductor layer 206(1) includes disposing a semiconductor substrate 404 on the top surface 210 of the first semiconductor layer 206(1) (block 310). In this regard, a donor wafer 402 (e.g., Silicon Carbide (SiC)) is employed as a platform on which the semiconductor substrate 404 (FIG. 4C) is first disposed. The donor wafer 402 in this example includes a surface having a two-dimensional (2D) crystal layer 406, such as graphene, on which the semiconductor substrate 404 is formed.

Figure 4C:
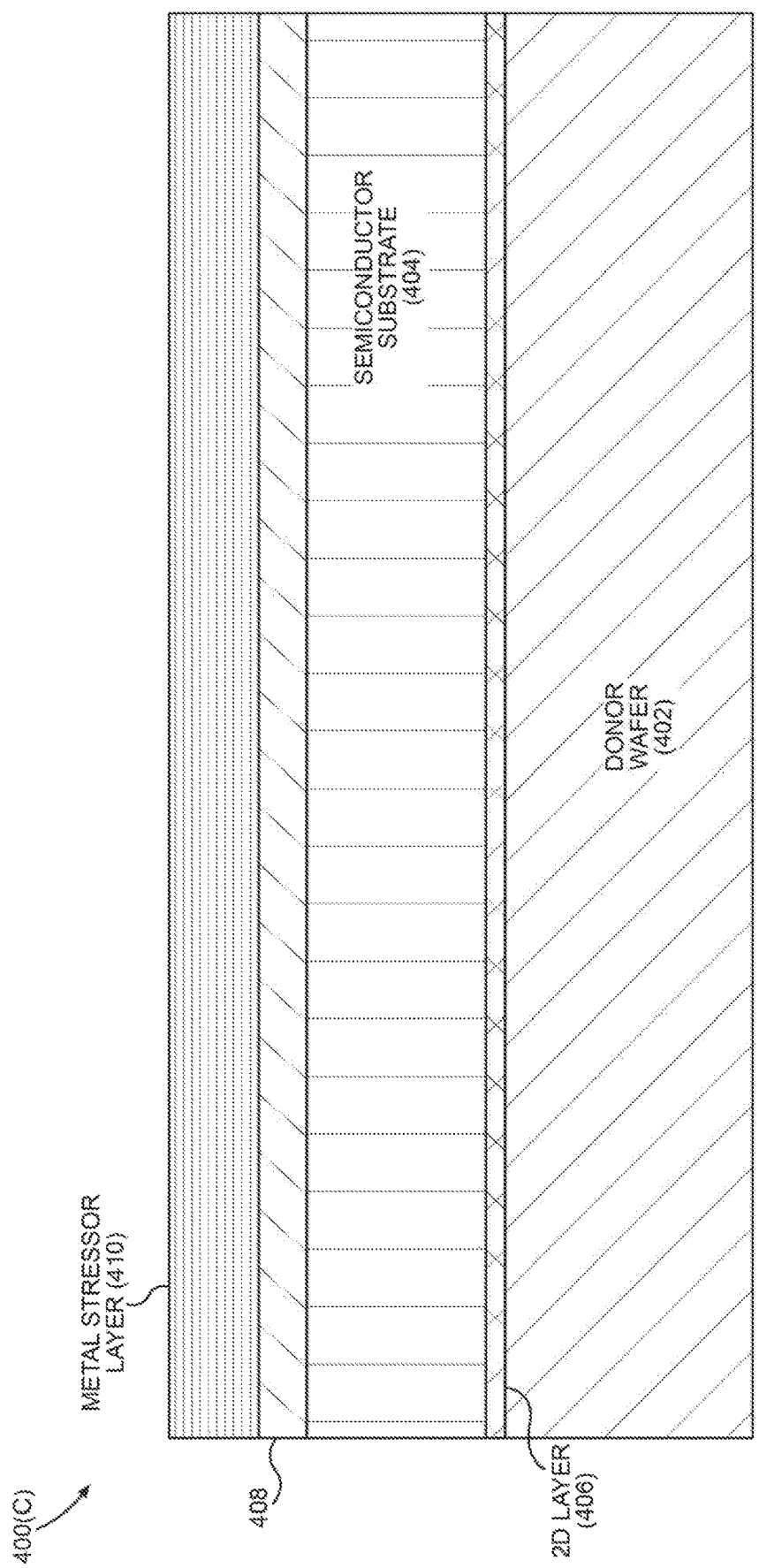
FIG. 4C is a cross-sectional side view in another exemplary fabrication stage of the vertically-integrated CMOS cell circuit in FIGS. 2A-2D in which a semiconductor substrate is formed on the donor wafer shown in FIG. 4B, according to the fabrication process in FIG. 3.

FIG. 4C illustrates an exemplary fabrication stage 400(C) in which the semiconductor substrate 404 is formed on the donor wafer 402. The 2D crystal layer 406, such as graphene, on the surface of the donor wafer 402 displays weak Van der Waals forces, so the lattice structure of the semiconductor substrate 404, an epitaxial layer grown on the donor wafer 402, forms naturally, without atomic crystal lattice mismatch stresses that force the epitaxial layer structure to align with the lattice structure of the donor wafer material (e.g., SiC). In this regard, unwanted stresses in the semiconductor substrate 402, which can affect performance of a FET formed therein, are avoided. A protective oxide layer 408 and a metal stressor layer 410 (e.g., nickel (Ni)) are respectively disposed on a top surface of the semiconductor substrate 404.

Figure 4D:
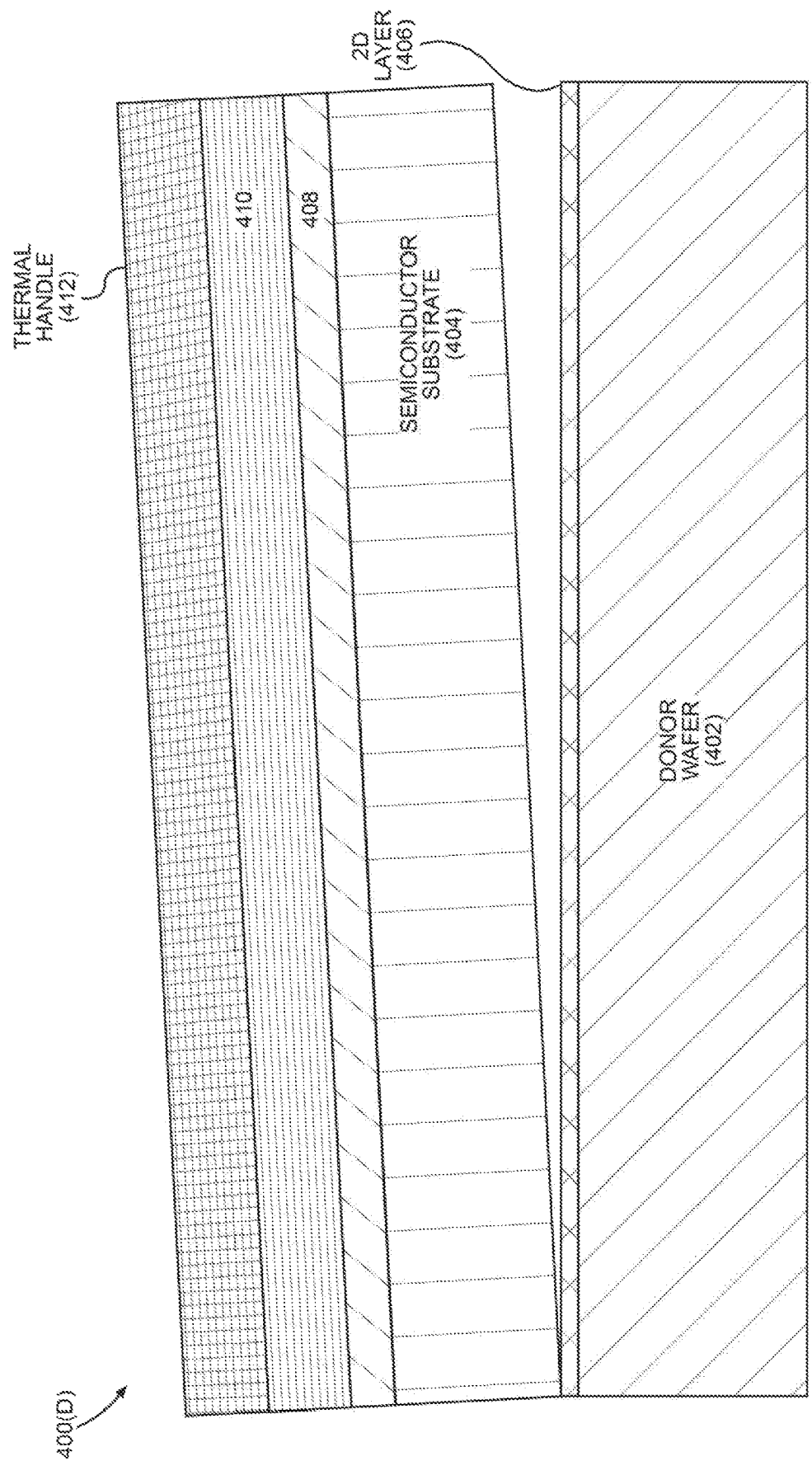
FIG. 4D is a cross-sectional side view in another exemplary fabrication stage of the vertically-integrated CMOS cell circuit shown in FIGS. 2A-2D in which the semiconductor substrate is separated from the donor wafer, according to the fabrication process in FIG. 3.

FIG. 4D illustrates an exemplary fabrication stage 400(D) in which the naturally-formed semiconductor substrate 404 is separated from the 2D crystal layer 406 on the surface of the donor wafer 402. A thermal handle 412, such as a thermal tape, is attached to the metal stressor layer 410. Pressure applied to the semiconductor substrate 404 by way of the thermal handle 412 overcomes the bond between the epitaxially grown semiconductor substrate 404 and the 2D crystal layer 406 on the surface of the donor wafer 402. Thus, a bottom surface of the semiconductor substrate 404 is separated from the donor wafer 402. Once the semiconductor substrate 404 is separated from the donor wafer 402, the donor wafer 402 is no longer needed and may be reused.

Figure 4E:
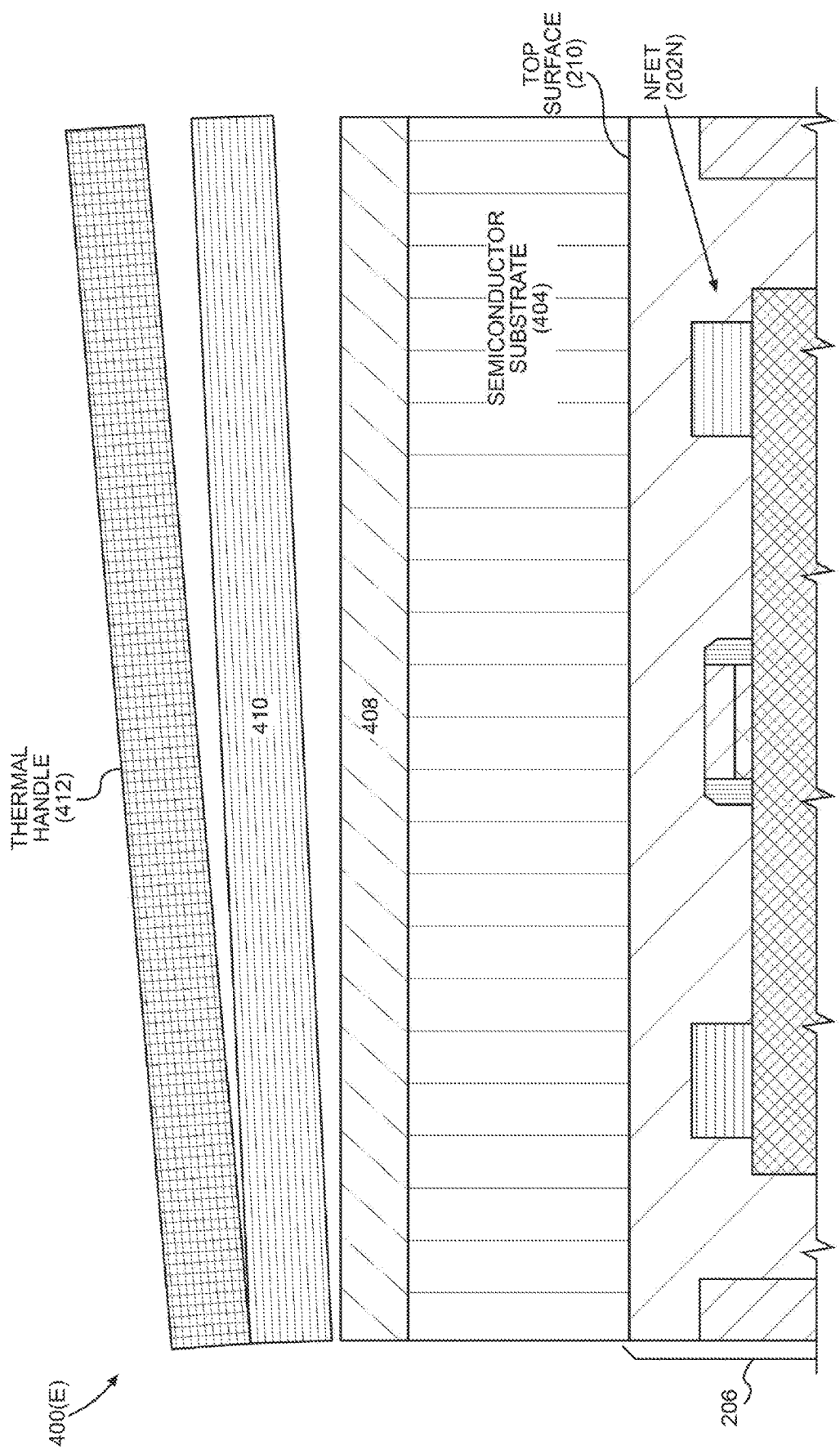
FIG. 4E is a cross-sectional side view in a another exemplary fabrication stage of the vertically-integrated CMOS cell circuit in FIGS. 2A-2D in which a bottom surface of the semiconductor substrate is bonded to the first semiconductor layer in the fabrication stage in FIG. 4A, according to the fabrication process in FIG. 3.

FIG. 4E illustrates an exemplary fabrication stage 400(E) in which the bottom surface of the semiconductor substrate 404 is directly bonded to the top surface 210 of the first semiconductor layer 206(1). The semiconductor substrate 404 stacked on the first semiconductor layer 206(1) in this manner provides a medium in which the PFET 202P can be formed above the NFET 202N to reduce the footprint of the cell circuit 200. The thermal handle 412 and the metal stressor layer 410 are separated from the semiconductor substrate 404. Although not shown here, the protective oxide layer 408 is also removed at this fabrication stage.

Figure 4F:
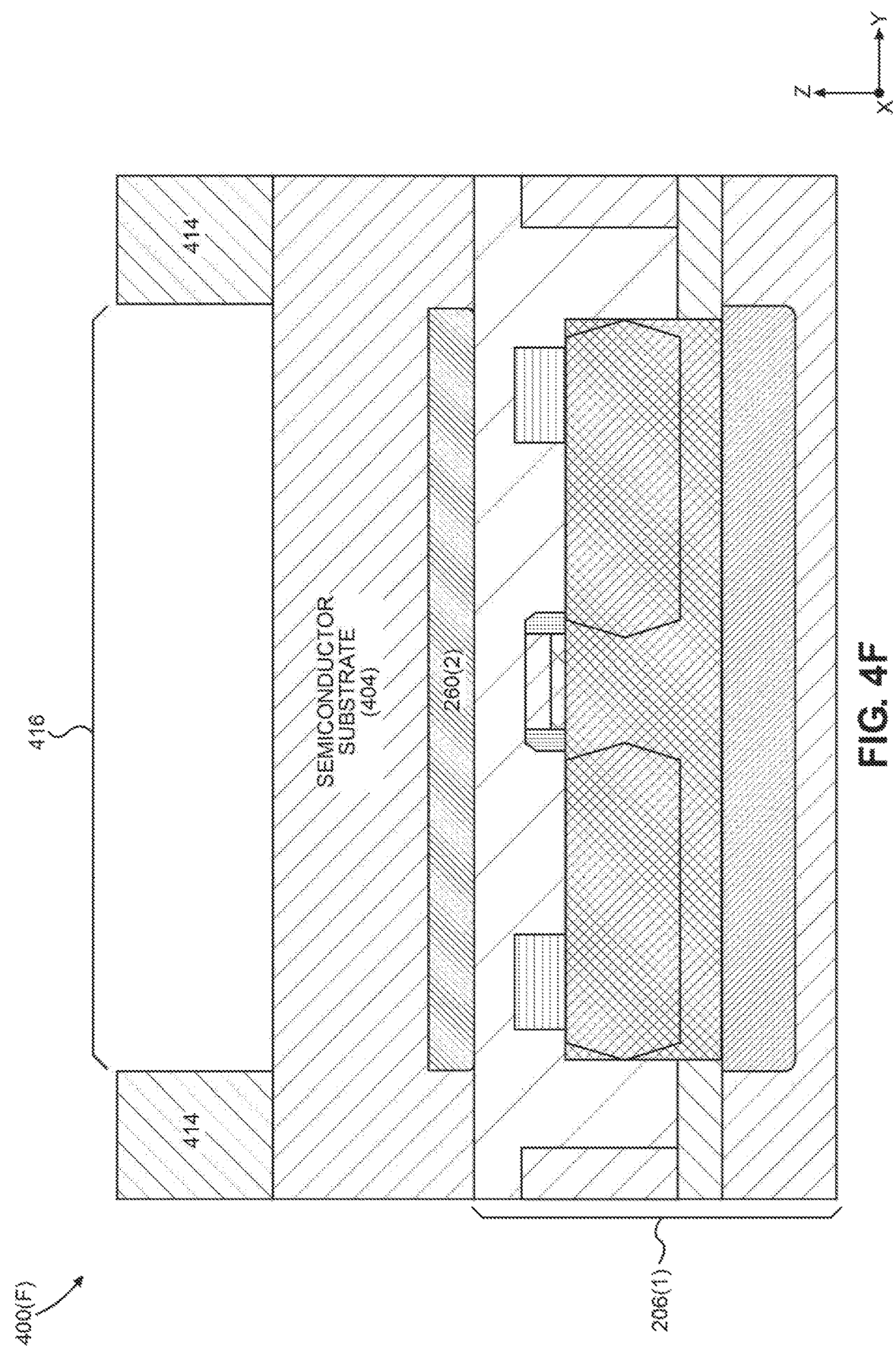
FIG. 4F is a cross-sectional side view in a another exemplary fabrication stage of the vertically-integrated CMOS cell circuit in FIGS. 2A-2D in which an oxide layer is removed, and a well region is implanted in the semiconductor substrate, according to the fabrication process in FIG. 3.

FIG. 4F illustrates an exemplary fabrication stage 400(F) in which a photo resist layer 414 is formed on the semiconductor substrate 404. The photo resist layer 414 is patterned to expose an area 416 of the semiconductor substrate 404 in which the well region 260(2) is formed. The well region 260(2) is formed by doping a bottom area of the semiconductor substrate 404 by, for example, ion implantation. The well region 260(2) is implanted in the semiconductor substrate 404 directly above at least a portion of the first fin 214(1) in the first semiconductor layer 206(1).

FIG. 4G illustrates an exemplary fabrication stage 400(G) in which the second fin 214(2) of the PFET 202P is formed in the semiconductor substrate 404 (block 312). The second fin 214(2) is formed by doping the semiconductor substrate 404 to form a second semiconductor layer 206(2) including an NFET 202N, or a PFET 202P. A portion of the semiconductor substrate 404 is doped according to a pattern of the photo resist layer 414. The second fin 214(2) formed from the doped portion extends longitudinally in the Y-axis direction and overlaps above at least a portion of the first channel column 216(1) of the first fin 214(1) (block 314). In the example of the cell circuit 200 in FIGS. 2A-2D, the second fin 214(2) is formed to fully overlap directly above the first fin 214(1). In other examples, discussed below, the second fin 214(2) may be formed to partially overlap a portion of the first fin 214(1). To form the second fin 214(2), a photo resist layer 418 is formed on the semiconductor substrate 404. The photo resist layer 418 is patterned to expose an area 420 of the semiconductor substrate 404 above the well region 260(2) in which the second fin 214(2) is formed. The semiconductor substrate 404 is doped in the exposed region by, for example, implanting ions in the semiconductor substrate 404.

Figure 4H:
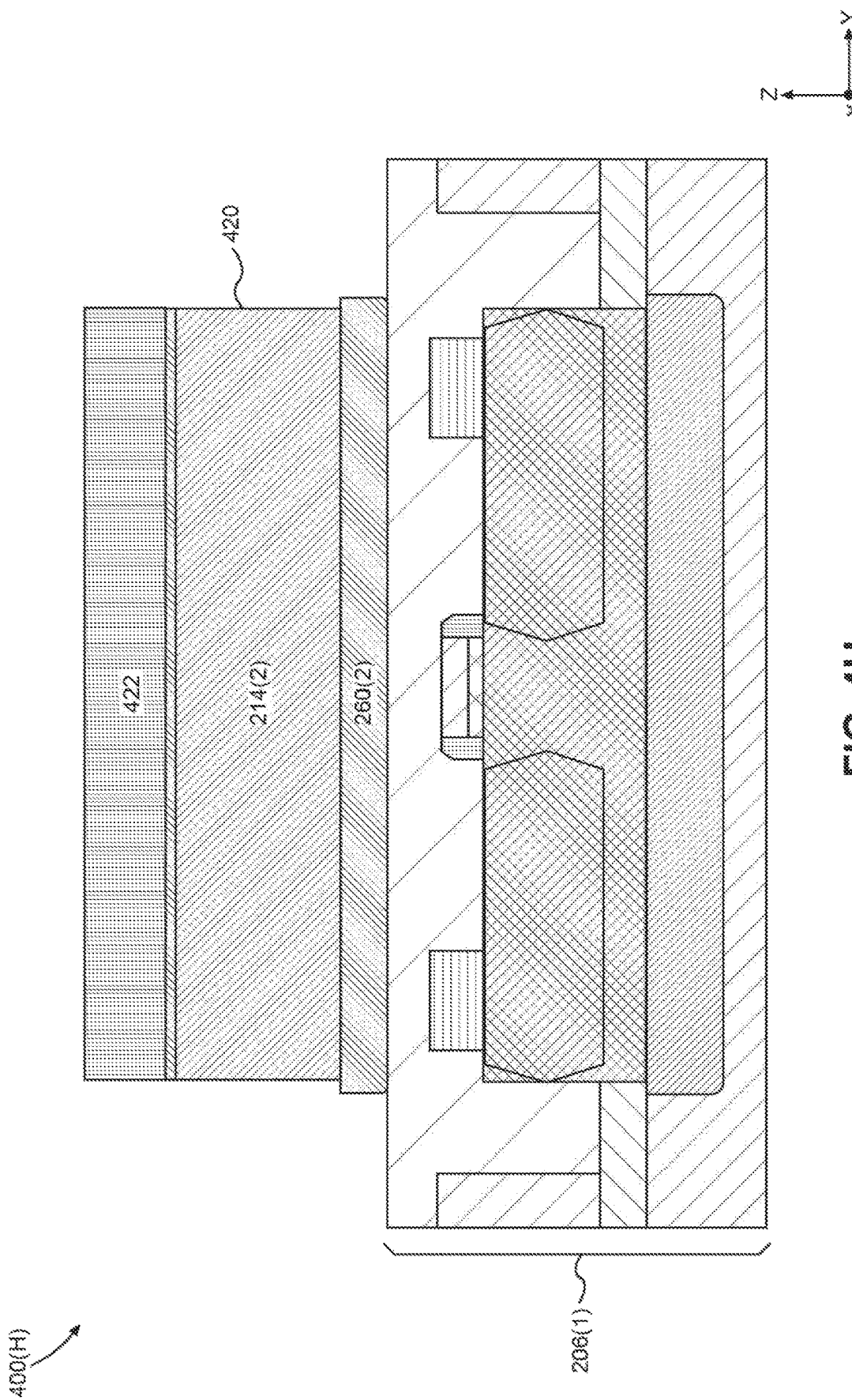
FIG. 4H is a cross-sectional side view in another exemplary fabrication stage of the vertically-integrated CMOS cell circuit in FIGS. 2A-2D in which a hard mask is formed on the fin for the PFET, and portions of the semiconductor substrate not covered by the hard mask are etched away, according to the fabrication process in FIG. 3.

FIG. 4H illustrates an exemplary fabrication stage 400(H) in which undoped areas of the semiconductor substrate 404 around the well region 260(2) and the second fin 214(2) have been removed. A hard mask 422 (e.g., Silicon Nitride (SiN)) is formed to cover portions of the semiconductor substrate 404 in which the second fin 214(2) and the well region 260(2) are formed, and protect those portions from an etching process in which the undoped portions of the semiconductor substrate 404 are etched away. The hard mask 422 is then removed.

Figure 4I:
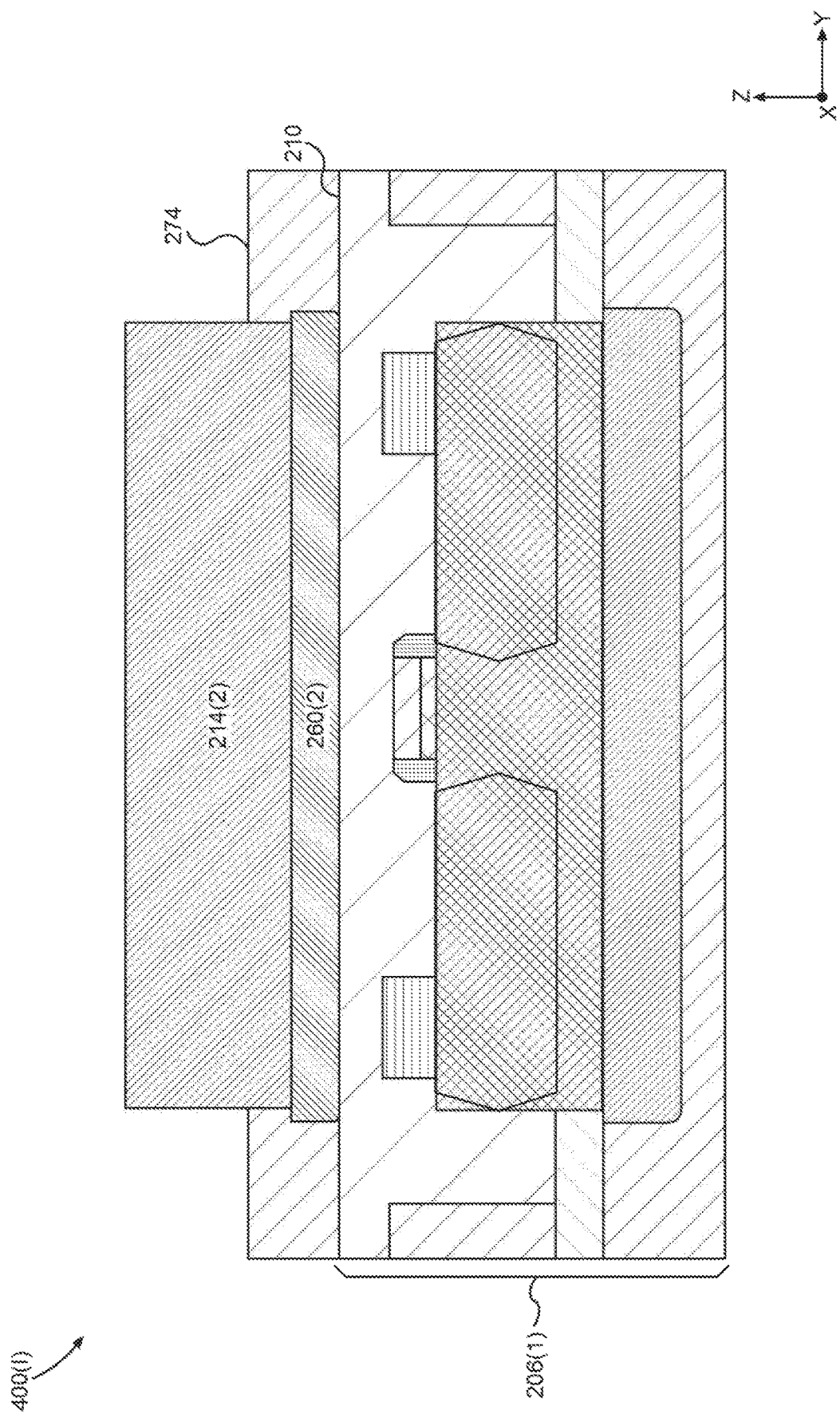
FIG. 4I is a cross-sectional side view in another exemplary fabrication stage of the vertically-integrated CMOS cell circuit in FIGS. 2A-2D in which the hard mask in FIG. 4H is removed and an isolation layer is formed around the fin for the PFET according to the fabrication process in FIG. 3.

FIG. 4I illustrates an exemplary fabrication stage 400(I) in which the second STI layer 274 is formed on the top surface 210 of the first semiconductor layer 206(1). The second STI layer 274 is disposed around the second fin 214(2) to cover the well region 260(2) and to a depth that covers a lower portion of the second fin 214(2), with at least a portion of the height of the second fin 214(2) not covered by the second STI layer 274. In this regard, the lower portion of the second fin 214(2) and the well region 260(2) are protected from processes for forming the second S/D region 230S and the second D/S region 230D.

Figure 4J:
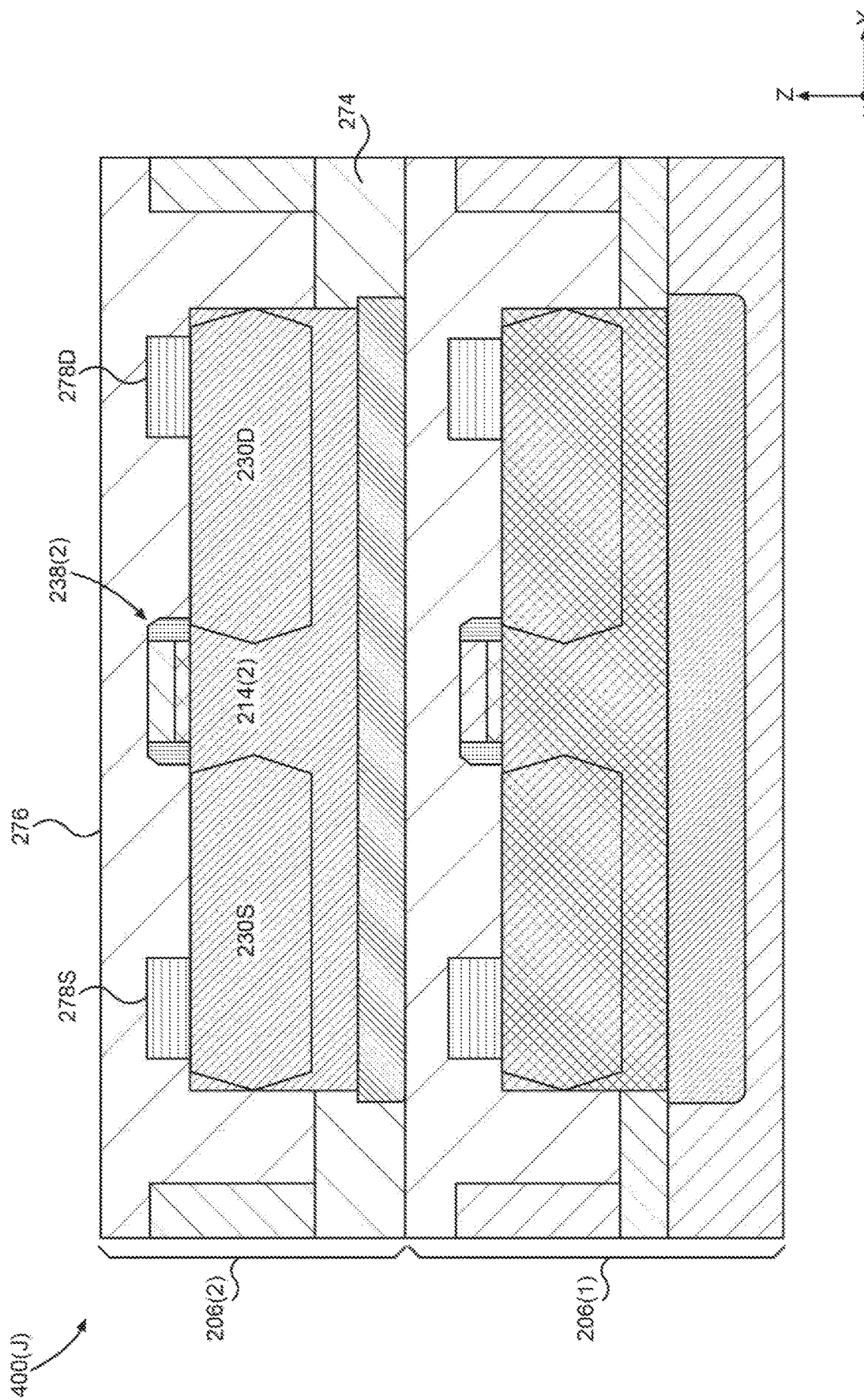
FIG. 4J is a cross-sectional side view in another exemplary fabrication stage of the vertically-integrated CMOS cell circuit in FIGS. 2A-2D in which a gate is formed on a channel region, contacts are formed on source and drain regions, and a protective layer formed on the PFET forms the second semiconductor layer, according to the fabrication process in FIG. 3.

FIG. 4J illustrates an exemplary fabrication stage 400(J) in which the second S/D region 230S, and the second D/S region 230D are formed in the second fin 214(2), and the second active gate 238(2) is formed on the second fin 214(2) between the second S/D region 230S and the second D/S region 230D (block 316). The second metal S/D contact 278S and the second metal D/S contact 278D are formed on the second S/D region 230S and the second D/S region 230D, respectively, of the second fin 214(2). The second protective ILD 276 is formed over the second STI layer 274 and over the second fin 214(2) to form the second semiconductor layer 206(2).

Figure 4K:
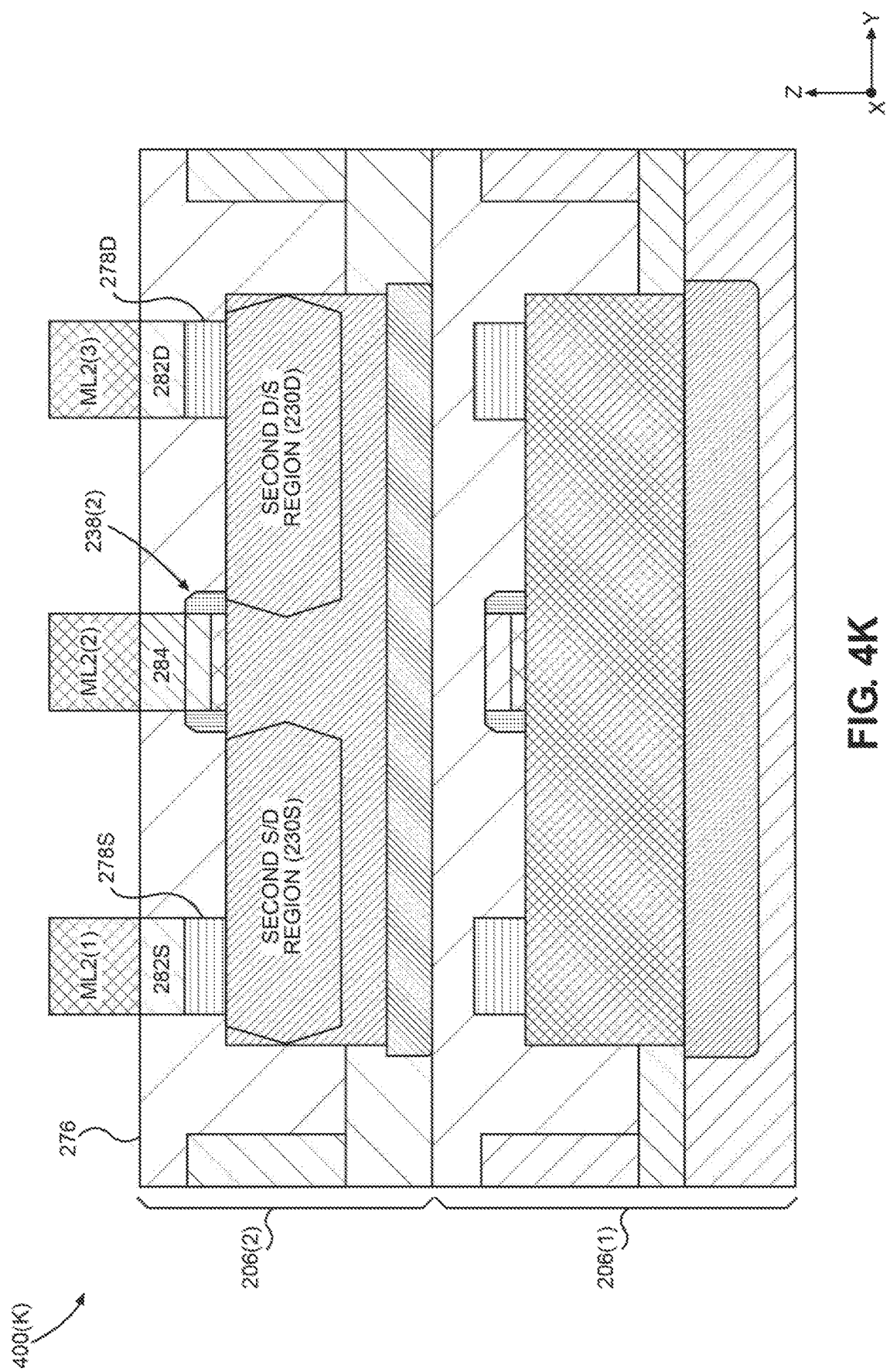
FIG. 4K is a cross-sectional side view in another exemplary fabrication stage of the vertically-integrated CMOS cell circuit in FIGS. 2A-2D in which contacts are formed through the protective layer in the fabrication stage in FIG. 4J to couple metal interconnects to the gate and the source and drain contacts of the PFET in the fabrication stage in FIG. 4J, according to the fabrication process in FIG. 3.

FIG. 4K illustrates an exemplary fabrication stage 400(K) in which the second metal S/D contact 278S, the second metal D/S contact 278D, and the vias 282S, 284, and 282D are formed in the second protective ILD 276. The vias 282S, 284, and 282D vertically couple the second metal S/D contact 278S, the second active gate 238(2), and the second metal D/S contact 278D, respectively, to the metal lines ML2(1), ML2(2), and ML2(3). A functional configuration of the cell circuit 200 may be determined by the interconnections of the vertically coupled contacts of the NFET 202N and the PFET 202P to each other and to external circuits. The cell circuit 200 fabricated by the above process 300 has a reduced footprint area because the PFET 202P and the NFET 202N are vertically integrated by stacking the second semiconductor layer 206(2), which includes the PFET 202P, above the first semiconductor layer 206(1), which includes the NFET 202N, such that the second channel structure 212(2) of the PFET 202P overlaps the first channel structure 212(1) of the NFET 202N.

Figure 5B:
FIG. 5B is a top view of the first and second semiconductor layers shown in FIGS. 5A-1 and 5A-2, respectively, vertically integrated in an exemplary CMOS cell circuit.
Figure 5B:
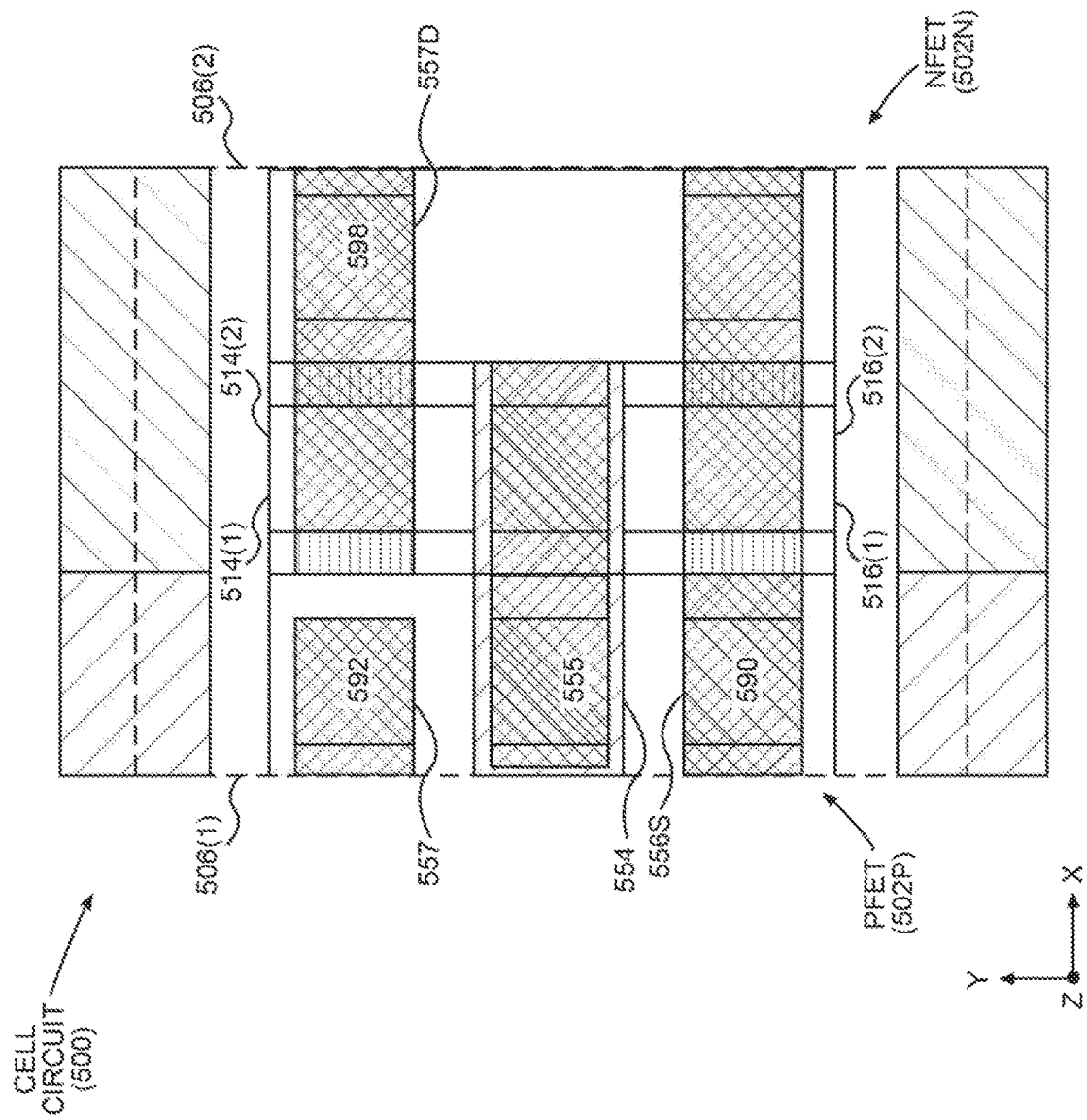

FIGS. 5A-1 and 5A-2 are separate top views of a first semiconductor layer 506(1) including a PFET 502P, and a second semiconductor layer 506(2) including an NFET 502N that is vertically stacked above the first semiconductor layer 506(1) during fabrication of a cell circuit 500 in FIG. 5B. FIG. 5A-1 illustrates a top view (i.e., a perspective in the Z-axis direction) of features of the first semiconductor layer 506(1). FIG. 5A-2 illustrates a top view of features of the second semiconductor layer 506(2) and also shows exemplary interconnects formed by metal lines ML5(1), ML5(2), and ML5(3). FIGS. 5A-1 and FIG. 5A-2 also show vias 555, 582S, 582D, 584, 590, 592, 594, and 598 to vertically couple to metal lines of a metal layer (not shown). As shown in the top view perspective of the first and second semiconductor layers 506(1) and 506(2), the vias 555, 582S, 582D, 584, 590, 592, 594, and 598 are spaced apart in the Y-axis direction according to a line pitch $P_Y$ of the metal lines, and also spaced apart according to a line pitch $P_X$ in the X-axis direction. A first fin 514(1) is disposed along a first longitudinal axis $A5_Y(1)$. A first S/D region 520S, the first active gate 538(1), and a first D/S region 520D are disposed along the first fin 514(1) in the Y-axis direction and spaced apart at the line pitch $P_Y$ to coincide with metal lines ML5(1), ML5(2), and ML5(3). Thus, a first horizontal S/D interconnect structure 542S, a first horizontal gate interconnect structure 548, and a first horizontal D/S interconnect structure 542D are disposed along the first fin 514(1) at the line pitch $P_Y$ in the Y-axis direction. The first horizontal S/D interconnect structure 542S is in contact with a first metal S/D contact 556S outside of a second channel column 516(2) of a second fin 514(2), and the first horizontal D/S interconnect structure 542D is in contact with the first metal D/S contact 556D outside of the second channel column 516(2) of the second fin 514(2). The first metal S/D contact 556S and a first metal gate contact 554 are each spaced at the line pitch $P_X$ in the X-axis direction to the left side in FIG. 5A-1. A well region 560(1) extends at least a line pitch $P_X$ in the X-axis direction from the first fin 514(1) so that a first metal ground contact 557 can vertically couple a voltage from a ground node (not shown) to the well region 560(1). With first metal ground contact 557 occupying the location at the line pitch $P_X$ to the left side of the first D/S region 520D, the first metal D/S contact 556D is spaced at the line pitch $P_X$ in the X-axis direction to the right side of the first fin 514(1). The reference to "right side" and "left side" here are specific to the exemplary orientation of the cell circuit 500 in FIGS. 5A-1 and 5A-2. Dummy gates 599(1)-599(4), which are structural only, are also shown at ends of the first and second semiconductor layers 506(1) and 506(2).

In FIG. 5A-2, the second fin 514(2) extends along a second longitudinal axis $A5_Y(2)$. As noted above, the vias 555, 582S, 582D, 584, 590, 592, 594, and 598 are spaced apart in the Y-axis direction according to the line pitch $P_Y$, and according to a line pitch $P_X$ in the X-axis direction to align features of the second semiconductor layer 506(2) with corresponding features in the first semiconductor layer 506(1). The vias 582S and 582D are each spaced at the line pitch $P_Y$ in the Y-axis direction from the via 584. The vias 590, 555, and 592 are spaced at the line pitch $P_X$ to the left side of the second fin 514(2) in the X-axis direction in FIG. 5A-2 and are positioned to vertically couple to the first metal S/D contact 556S, the first metal gate contact 554, and the first metal ground contact 557, respectively, in FIG. 5A-1. A power source via 594 to couple a voltage from a supply voltage node (not shown) to the PFET 502P, and a first D/S via 598 to vertically couple to the first metal D/S contact 556D in the first semiconductor layer 506(1) are spaced at the line pitch $P_X$ to the right in the X-axis direction. In the example of the cell circuit 500, the PFET 502P and the NFET 502N are coupled in an inverter configuration. In this regard, the metal line ML5(3) horizontally couples the first D/S via 598 to the via 582D to couple the first D/S region 520D of the PFET 502P and the second D/S region 530D of the NFET 502N. In addition, the via 584 is horizontally coupled to the first gate via 555 by the metal line ML5(2), and the power source via 594 is horizontally coupled to the second S/D region 530S by the metal line ML5(1). However, the cell circuit 500 is not limited to an inverter configuration. The PFET 502P and the NFET 502N are independently vertically coupled to the metal lines ML5(1), ML5(2), and ML5(3) or other interconnect layers not shown, so other configurations are possible.

FIG. 5B is a top view of the cell circuit 500 with the second semiconductor layer 506(2) vertically integrated with the first semiconductor layer 506(1) such that the second fin 514(2) of the NFET 502N overlaps the first fin 514(1) of the PFET 502P. Accordingly, the second channel column 516(2) of the second fin 514(2) overlaps the first channel column 516(1) of the first fin 514(1) in FIG. 5B. In addition, the vias 590, 555, and 592 of the left side of the second channel column 516(2) in the second semiconductor layer 506(2) are vertically aligned with the first metal S/D contact 556S, the first metal gate contact 554, and the first metal ground contact 557 in the first semiconductor layer 506(1). On the right side of the second channel column 516(2), the first D/S via 598 is vertically aligned with the first metal D/S contact 556D. The cell circuit 500, with the first and second semiconductor layers 506(1) and 506(2) vertically integrated as shown, has a reduced footprint area compared to a conventional CMOS circuit in which an PFET 502P and an NFET 502N are laterally disposed in a horizontal direction on a surface of a substrate. In addition, various configurations of the cell circuit 500 are made possible because the PFET 502P and the NFET 502N are both vertically coupled to the metal lines ML5(1), ML5(2), and ML5(3).

Figure 6A:
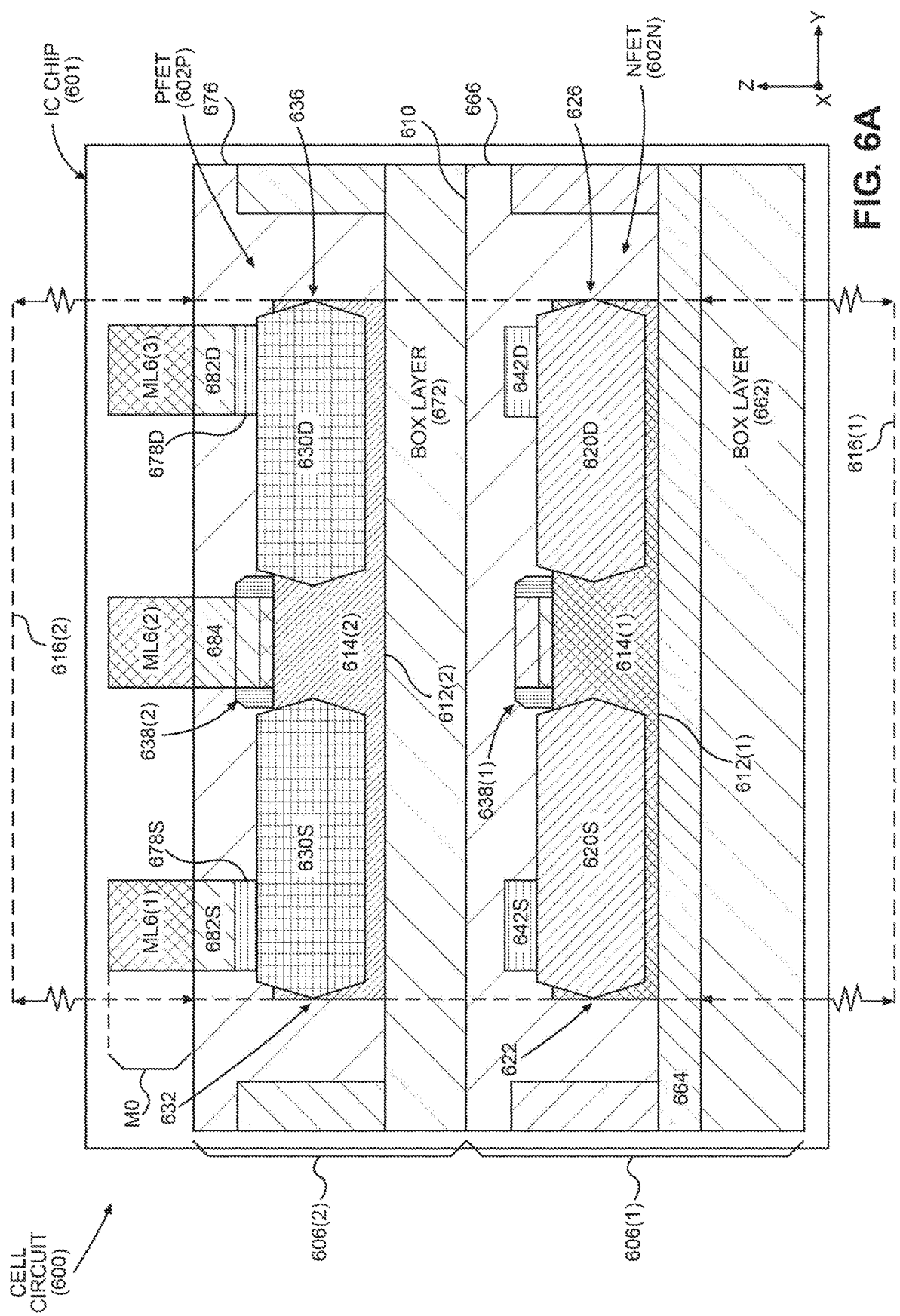
FIG. 6A is a cross-sectional side view in a first direction of an exemplary CMOS cell circuit in which a silicon-on-insulator (SOI) PFET in a second semiconductor layer is stacked vertically in a bottom-to-top orientation above an SOI NFET in a first semiconductor layer such that the channel structure of the PFET overlaps the channel structure of the NFET to reduce the footprint size of the CMOS cell circuit.

FIG. 6A is a cross-sectional side view of an exemplary CMOS cell circuit 600 (referred to herein as "cell circuit 600"). The cell circuit 600 can be formed as part of an IC in an IC chip 601. The cross-sectional side view of the cell circuit 600 in FIG. 6A is in the direction of the X-axis, and the cross-section of the cell circuit 600 in FIG. 6A is in a plane in the Y-axis and Z-axis directions.

With further reference to FIG. 6A, in this example, an NFET 602N is formed in a first semiconductor layer 606(1) of the cell circuit 600, and a PFET 602P is formed in a second semiconductor layer 606(2) to support CMOS circuits. To reduce a footprint area of the cell circuit 600, the second semiconductor layer 606(2) is vertically integrated (i.e., "stacked") on or above a top surface 610 of the first semiconductor layer 606(1). In particular, as illustrated in FIG. 6A, the second semiconductor layer 606(2) is stacked on the first semiconductor layer 606(1) such that a first channel structure 612(1) of the NFET 602N is overlapped in the vertical Z-axis direction by a second channel structure 612(2) of the PFET 602P. In the NFET 602N, the first channel structure 612(1) is in the form of a first fin 614(1). In the PFET 602P, the second channel structure 612(2) is in the form of a second fin 614(2).

As shown in FIG. 6A, a second channel column 616(2) extends vertically from a horizontal area of the second fin 614(2), and a first channel column 616(1) extends vertically from a horizontal area of the first fin 614(1). In this regard, the second channel column 616(2) overlaps at least a portion of the first channel column 616(1). In the example in FIG. 6A, the second fin 614(2) in the second semiconductor layer 606(2) overlaps the first fin 614(1) in the first semiconductor layer 606(1) such that the second channel column 616(2) fully overlaps the first channel column 616(2).

With continuing reference to FIG. 6A, the NFET 602N includes a first S/D region 620S in a first end portion 622 of the first fin 614(1), and a first D/S region 620D in a second end portion 626. For example, if the first S/D region 620S is a source (S) region, the first D/S region 620D is a drain (D) region, and vice versa. Similarly, the PFET 602P includes a second S/D region 630S in a first end portion 632 of the second fin 614(2), and a second D/S region 630D in a second end portion 636. A first active gate 638(1) is disposed on the first fin 614(1) between the first S/D region 620S and the first D/S region 620D, and a second active gate 638(2) is disposed on the second fin 614(2) between the second S/D region 630S and the second D/S region 630D. To electrically couple the PFET 602P in the cell circuit 600, the second S/D region 630S, the second D/S region 630D, and the second active gate 638(2) each vertically couple, within the second channel column 616(2), above the second semiconductor layer 606(2). However, due to the second channel column 616(2) of the second fin 614(2) overlapping the first channel column 616(1) of the first fin 614(1), vertical coupling to any of the first S/D region 620S, the first D/S region 620D, and the first active gate 638(1) is obstructed by the second fin 614(2). To avoid obstruction caused by the overlapping second channel column 616(2), the first semiconductor layer 606(1) includes horizontal interconnect structures, such as horizontal interconnect structures 642S and 642D described further with reference to FIG. 6B.

To provide interconnections to source, drain, and gate regions of channel structures of each of the vertically-integrated FETs, the cell circuit 600 is designed so that contacts to the respective regions of the first channel structure 612(1) of the NFET 602N on the first semiconductor layer 606(1) are located below open areas of the second semiconductor layer 606(2). This allows unobstructed vertical access to the NFET 602N in the first semiconductor layer 606(1) of stacked semiconductor layers.

FIG. 6B is cross-sectional side view of the cell circuit 600. The cross-section of the cell circuit 600 is in a plane in the X-axis and Z-axis directions. FIG. 6B illustrates an end view of the first fin 614(1) along a first longitudinal axis A6$_Y$(1). As shown in FIGS. 6A and 6B, the second channel column 616(2) of the second fin 614(2) overlaps the first channel column 616(1) of the first fin 614(1) in both the X-axis direction and the Y-axis direction. Alternatively, the second channel column 616(2) may partially overlap the first channel column 616(1). In the first channel column 616(1) of the first fin 614(1) where vertical coupling is obstructed by the overlapping second fin 614(2), the first semiconductor layer 606(1) includes at least one horizontal interconnect structure having a second longitudinal axis A6$_X$(1) orthogonal to the first longitudinal axis A6$_Y$(1) (i.e., of the first fin 614(1)) and extending outside the second channel column 616(2) of the second fin 614(2). For example, in FIG. 6B, the first semiconductor layer 606(1) includes a first horizontal gate interconnect structure 648 in contact with the first active gate 638(1). In this regard, a first gate 650 of the NFET 602N includes a field gate 652, which is adjacent to the first active gate 638(1) and comprises the first horizontal gate interconnect structure 648. The first semiconductor layer 606(1) also includes a first metal gate contact 654 outside of the second channel column 616(2) of the second fin 614(2) and in contact with the first horizontal gate interconnect structure 648. Vertical coupling to a metal line ML6(2) from the first metal gate contact 654 is not obstructed by the second fin

614(2). A first gate via 655 vertically couples the first metal gate contact 654 to the metal line ML6(2). Thus, the first active gate 638(1) is coupled to the metal line ML6(2).

Returning to FIG. 6A, it is shown therein that the second channel column 616(2) of the second fin 614(2) also overlaps the first S/D region 620S and the first D/S region 620D of the first fin 614(1), obstructing vertical coupling to the first S/D region 620S and the first D/S region 620D. In this regard, the first semiconductor layer 606(1) includes the first horizontal S/D interconnect structure 642S in contact with the first S/D region 620S. The first semiconductor layer 606(1) includes the first horizontal D/S interconnect structure 642D in contact with the first D/S region 620D.

With reference back to FIG. 6A, the NFET 602N is a Silicon-On-Insulator (SOI) FinFET, with the first fin 614(1) formed on a first STI layer 664 on a first buried oxide (BOX) layer 662. The first semiconductor layer 606(1) further includes a first protective ILD 666 that forms the top surface 610 of the first semiconductor layer 606(1). The PFET 602P is a SOI FinFET with the second fin 614(2) formed on a second BOX layer 672. The second S/D region 630S and the second D/S region 630D are formed in upper portions of the second fin 614(2). The second semiconductor layer 606(2) further includes a second protective ILD 676. A second metal S/D contact 678S and a second metal D/S contact 678D are formed on the second S/D region 630S and the second D/S region 630D, respectively. The second metal S/D contact 678S, the second active gate 638(2), and the second metal D/S contact 678D of the PFET 602P are vertically coupled through the second protective ILD 676 to metal lines ML6(1), ML6(2), and ML6(3) by vias 682S, 684, and 682D, respectively.

FIG. 7A is a cross-sectional side view of an exemplary CMOS cell circuit 700 (referred to herein as "cell circuit 700"). The cell circuit 700 can be formed as part of an IC in an IC chip 701. The cross-sectional side view of the cell circuit 700 in FIG. 7A is in the direction of the X-axis along the cross-sectional line from X$_7$' to X$_7$ of the cell circuit 700 in FIG. 7D, and is in a plane in the Y-axis and Z-axis directions.

With further reference to FIG. 7A, in this example, an NFET 702N in the form of a FinFET is formed in a first semiconductor layer 706(1) of the CMOS cell circuit 700, and a PFET 702P in the form of a FinFET is formed in a second semiconductor layer 706(2) to support CMOS circuits. To reduce a footprint area of the cell circuit 700, the second semiconductor layer 706(2) is vertically integrated (i.e., "stacked") on or above a top surface 710 of the first semiconductor layer 706(1). In particular, as illustrated in FIG. 7A, the second semiconductor layer 706(2) is stacked on the first semiconductor layer 706(1) such that a first channel structure 712(1) of the NFET 702N is overlapped in the vertical Z-axis direction by a second channel structure 712(2) of the PFET 702P. In the NFET 702N, the first channel structure 712(1) is in the form of a first fin 714(1). In the PFET 702P, the second channel structure 712(2) is in the form of a second fin 714(2).

As shown in FIG. 7A, a second channel column 716(2) extends vertically from a horizontal area of the second fin 714(2), and a first channel column 716(1) extends vertically from a horizontal area of the first fin 714(1). In this regard, the second channel column 716(2) overlaps at least a portion of the first channel column 716(1). In the example in FIG. 7A, the second fin 714(2) in the second semiconductor layer 706(2) overlaps the first fin 714(1) in the first semiconductor layer 706(1) such that the second channel column 716(2) fully overlaps the first channel column 716(2).

With continuing reference to FIG. 7A, the NFET 702N includes a first S/D region 720S in a first end portion 722 of the first fin 714(1), and a first D/S region 720D in a second end portion 726. For example, if the first S/D region 720S is a source (S) region, the first D/S region 720D is a drain (D) region, and vice versa. Similarly, the PFET 702P includes a second S/D region 730S in a first end portion 732 of the second fin 714(2), and a second D/S region 730D in a second end portion 736. A first active gate 738(1) is disposed on a top side of the first fin 714(1) between the first S/D region 720S and the first D/S region 720D.

With regard to stacking the second semiconductor layer 706(2) on the first semiconductor layer 706(1), the cell circuit 700 differs from examples previously disclosed herein. In the cell circuit 700, a second semiconductor layer 706(2) is formed separately (as explained below with regard to process 800 in FIGS. 8A and 8B) from the first semiconductor layer 706(1). The second semiconductor layer 706(2) includes the PFET 702(2) with the second active gate 738(2) formed on the second fin 714(2). The second semiconductor layer 706(2) includes a top surface 708 and a bottom surface 718. The top surface 708 of the second semiconductor layer 706(2) is bonded to the top surface 710 of the first semiconductor layer 706(1), and the bottom surface 718 becomes a top surface 724 of the cell circuit 700.

To electrically couple the PFET 702P in the cell circuit 700, the second S/D region 730S and the second D/S region 730D vertically couple within the second channel column 716(2) to metal lines ML7(1) and ML7(3) above the top surface 724 of the cell circuit 700. Due to the second channel column 716(2) of the second fin 714(2) overlapping the first channel column 716(1) of the first fin 714(1), vertical coupling to any of the first S/D region 720S, the first D/S region 720D, and the first active gate 738(1) is obstructed by the second fin 714(2). To avoid obstruction caused by the overlapping second channel column 716(2), the first semiconductor layer 706(1) includes horizontal interconnect structures, such as horizontal interconnect structures 742S and 742D described further with reference to FIG. 7B.

To provide interconnections to source, drain, and gate regions of channel structures of each of the vertically-integrated FETs, the cell circuit 700 is designed so that contacts to the respective regions of the first channel structure 712(1) of the NFET 702N on the first semiconductor layer 706(1) are located below open areas of the second semiconductor layer 706(2) (i.e., areas not occupied by the second channel structure 712(2) or other structures of the PFET 702P). This allows unobstructed vertical access to the NFET 702N in the first semiconductor layer 706(1) of stacked semiconductor layers.

FIG. 7B is cross-sectional side view of the cell circuit 700. Specifically, the cross-sectional side view in FIG. 7B is in the direction of the Y-axis along the cross-sectional line from Y$_7$' to Y$_7$ in the illustration in FIG. 7D, which is discussed further below. The cross-section of the cell circuit 700 is in a plane in the X-axis and Z-axis directions. FIG. 7B illustrates an end view of the first fin 714(1) along a first longitudinal axis A7$_Y$(1). As shown in FIGS. 7A and 7B, the second channel column 716(2) of the second fin 714(2) overlaps the first channel column 716(1) of the first fin 714(1) in both the X-axis direction and the Y-axis direction. Alternatively, the second channel column 716(2) may partially overlap the first channel column 716(1). In the first channel column 716(1) of the first fin 714(1), where vertical coupling is obstructed by the overlapping second fin 714(2), the first semiconductor layer 706(1) includes at least one horizontal interconnect structure having a second longitudinal axis A7$_X$(1) orthogonal to the first longitudinal axis A7$_Y$(1) (i.e., of the first fin 714(1)) and extending outside the second channel column 716(2) of the second fin 714(2). For example, in FIG. 7B, the first semiconductor layer 706(1) includes a first horizontal gate interconnect structure 748(1) in contact with the first active gate 738(1). In this regard, a first gate 750(1) of the NFET 702N includes a first field gate 752(1), which is adjacent to the first active gate 738(1) and comprises the first horizontal gate interconnect structure 748(1). The first semiconductor layer 706(1) also includes a first metal gate contact 754 outside of the second channel column 716(2) of the second fin 714(2) and in contact with the first horizontal gate interconnect structure 748(1). Vertical coupling to a metal line ML7(2) from the first metal gate contact 754 is not obstructed by the second fin 714(2). A first gate via 755 vertically couples the first metal gate contact 754 to the metal line ML7(2). Thus, the first active gate 738(1) is coupled to the metal line ML7(2).

With the top surface 708 of the second semiconductor layer 706(2) bonded to the top surface 710 of the first semiconductor layer 706(1), the second active gate 738(2) is in the second channel column 716(2) below the second fin 714(2). Thus, vertical coupling to the second active gate 738(2) is obstructed by the second fin 714(2). Therefore, the second semiconductor layer 706(2) includes a second horizontal gate interconnect structure 748(2) in contact with the second active gate 738(2). In this regard, a second gate 750(2) of the PFET 702P includes a second field gate 752(2), which is adjacent to the second active gate 738(2) and comprises the second horizontal gate interconnect structure 748(2).

Returning to FIG. 7A, the second channel column 716(2) of the second fin 714(2) also overlaps the first S/D region 720S and the first D/S region 720D of the first fin 714(1), obstructing vertical coupling to the first fin 714(1). In this regard, the first semiconductor layer 706(1) includes the first horizontal S/D interconnect structure 742S in contact with the first S/D region 720S, and includes the first horizontal D/S interconnect structure 742D in contact with the first D/S region 720D.

With reference back to FIG. 7A, the NFET 702N is a SOI type FinFET, with the first fin 714(1) formed on a first STI layer 764 on a first BOX layer 762. A first protective ILD 766 forms the top surface 710 of the first semiconductor layer 706(1). The PFET 702P is also a SOI FinFET with the second fin 714(2) formed on a second STI layer 774 on a second BOX layer 772, which forms a bottom surface 718 of the second semiconductor layer 706(2). The second S/D region 730S and the second D/S region 730D are formed in the second fin 714(2). The second semiconductor layer 706(2) further includes a second protective ILD 776 which forms the top surface 708 of the second semiconductor layer 706(2) bonded to the top surface 710 of the first semiconductor layer 706(1). A second metal S/D contact 778S and a second metal D/S contact 778D are formed on the second S/D region 730S and the second D/S region 730D, respectively. The second metal S/D contact 778S and the second metal D/S contact 778D are vertically coupled through the second STI layer 774 and the second BOX layer 772 by vias 782S and 782D, respectively. As shown in FIG. 7B, the second field gate 752(2) is vertically coupled through the second STI layer 774 and the second BOX layer 772 to the metal layer ML7(2) by a second gate via 758.

FIGS. 7C-1 and 7C-2 are separate top views of the first semiconductor layer 706(1) including the NFET 702N, and the second semiconductor layer 706(2) including the PFET 702P that is vertically stacked above the first semiconductor layer 706(1) during fabrication of the cell circuit 700. FIG. 7C-1 illustrates a top view (i.e., a perspective in the Z-axis direction) of features of the first semiconductor layer 706(1). FIG. 7C-2 illustrates a top view of features of the second semiconductor layer 706(2), and also shows exemplary interconnects formed by metal lines ML7(1), ML7(2), and ML7(3). FIGS. 7C-1 and FIG. 7C-2 also show top view perspective of vias 755, 782S, 782D, 790, 792, 794, and 798 spaced apart in the Y-axis direction according to a line pitch P$_Y$ of the metal lines ML7(1)-ML7(3), and also spaced apart according to a line pitch P$_X$ in the X-axis direction. The first S/D region 720S, the first active gate 738(1), and the first D/S region 720D are disposed along the first fin 714(1) in the Y-axis direction and spaced apart at the line pitch P$_Y$ to coincide with the metal lines ML7(1), ML7(2), and ML7(3). Thus, the first horizontal S/D interconnect structure 742S, the first horizontal gate interconnect structure 748(1), and the first horizontal D/S interconnect structure 742D are disposed along the first fin 714(1) at the line pitch P$_Y$ in the Y-axis direction. The first horizontal S/D interconnect structure 742S is in contact with a first metal S/D contact 756S outside of the second channel column 716(2) of the second fin 714(2), and the first horizontal D/S interconnect structure 742D is in contact with a first metal D/S contact 756D outside of the second channel column 716(2) of the second fin 714(2). The first metal S/D contact 756S and the first metal gate contact 754 are each spaced at the line pitch P$_X$ in the X-axis direction to the left side in FIG. 7C-1. A first metal ground contact 757 vertically couples a voltage from a ground node (not shown) to the NFET 702N. The first metal ground contact 757 occupies a location at the line pitch P$_X$ to the left side of the first D/S region 720D, so the first metal D/S contact 756D is spaced at the line pitch P$_X$ in the X-axis direction to the right side of the first fin 714(1). The reference to "right side" and "left side" here are specific to the exemplary orientation of the cell circuit 700 in FIGS. 7C-1 and 7C-2.

In FIG. 7C-2, the second fin 714(2) extends along a third longitudinal axis A7$_Y$(2). As noted above, the vias 755, 782S, 782D, 790, 792, 794, and 798 are spaced apart in the Y-axis direction according to the line pitch P$_Y$, and according to the line pitch P$_X$ in the X-axis direction to align features of the second semiconductor layer 706(2) with corresponding features in the first semiconductor layer 706(1). The metal contacts 778S and 778D on the second S/D region 730S and the second D/S region 730D, respectively, are each spaced at the line pitch P$_Y$ in the Y-axis direction from the second active gate 738(2). The vias 790, 755, and 792 are spaced at the line pitch P$_X$ to the left side of the second fin 714(2) in the X-axis direction in FIG. 7C-2, and are positioned to vertically couple to the first metal S/D contact 756S, the first metal gate contact 754, and the first metal ground contact 757, respectively, in FIG. 7C-1. A power source via 794 to couple a voltage from a supply voltage node 796 to the PFET 702P, and a first D/S via 798 to vertically couple to the first metal D/S contact 756D in the first semiconductor layer 706(1), are spaced at the line pitch P$_X$ to the right in the X-axis direction from the second fin 714(2). In addition, with vertical coupling to the second active gate 738(2) obstructed by the second fin 714(2), the second gate 750(2) of the PFET 702P extends horizontally along a fourth longitudinal axis A7$_X$(2) in a direction orthogonal to the second fin 714(2). The second metal gate via 758 is formed on the second gate 750(2) at the line pitch P$_X$ to the right in the X-axis direction from the second fin 714(2), outside of the second channel column 716(2). In the example of the cell circuit 700, the NFET 702N and the PFET 702P are coupled in an inverter configuration. In this regard, the metal line ML7(3) horizontally couples the first D/S via 798 to the via 782D, to couple the first D/S region 720D of the NFET 702N and the second D/S region 730D of the PFET 702P. In addition, the second metal gate via 758 is horizontally coupled to the first gate via 755 by the metal line ML7(2), and the power source via 794 is horizontally coupled to the via 782S by the metal line ML7(1). However, the cell circuit 700 is not limited to an inverter configuration. The NFET 702N and the PFET 702P are independently vertically coupled to the metal lines ML7(1)-ML7(3) or other interconnect lines not shown, so other configurations are possible.

Figure 7D:
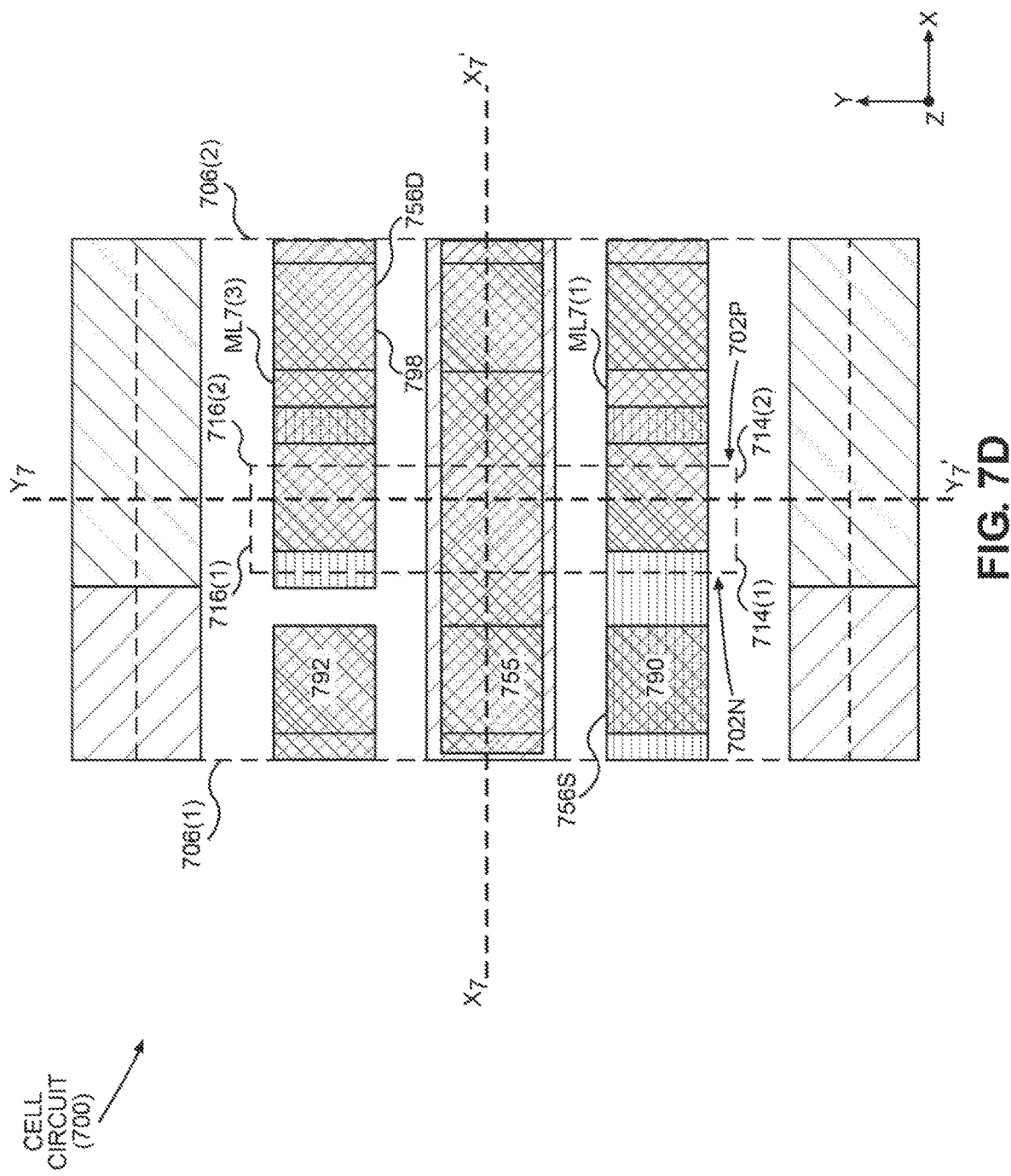
FIG. 7D is a top view of the first and second semiconductor layers shown in FIGS. 7C-1 and 7C-2, respectively, vertically integrated in the CMOS cell circuit shown in FIGS. 7A and 7B.

FIG. 7D is a top view of the cell circuit 700 with the second semiconductor layer 706(2) vertically integrated with the first semiconductor layer 706(1) such that the second fin 714(2) of the PFET 702P overlaps the first fin 714(1) of the NFET 702N. Accordingly, the second channel column 716(2) of the second fin 714(2) overlaps the first channel column 716(1) of the first fin 714(1) in FIG. 7D. In addition, the vias 790, 755, and 792 of the left side of the second channel column 716(2) in the second semiconductor layer 706(2) are vertically aligned with the first metal S/D contact 756S, the first metal gate contact 754, and the first metal ground contact 757 in the first semiconductor layer 706(1). On the right side of the second channel column 716(2), the first D/S via 798 is vertically aligned with the first metal D/S contact 756D.

Figure 8A:
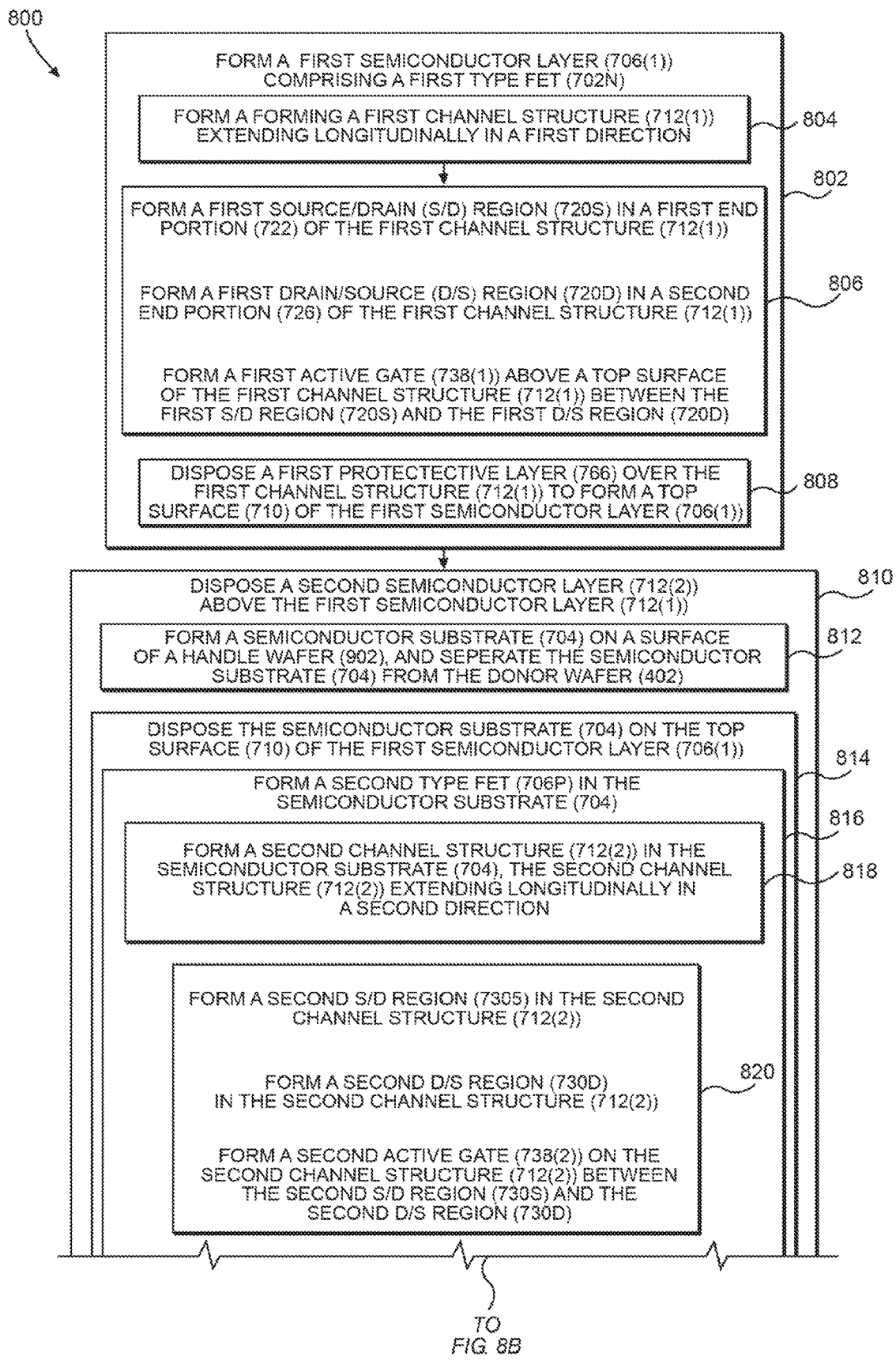
FIGS. 8A and 8B are flowcharts illustrating an exemplary process for fabricating the vertically integrated SOI FETs in a top-to-top orientation in the CMOS cell circuit shown in FIGS. 7A-7D.
Figure 8B:
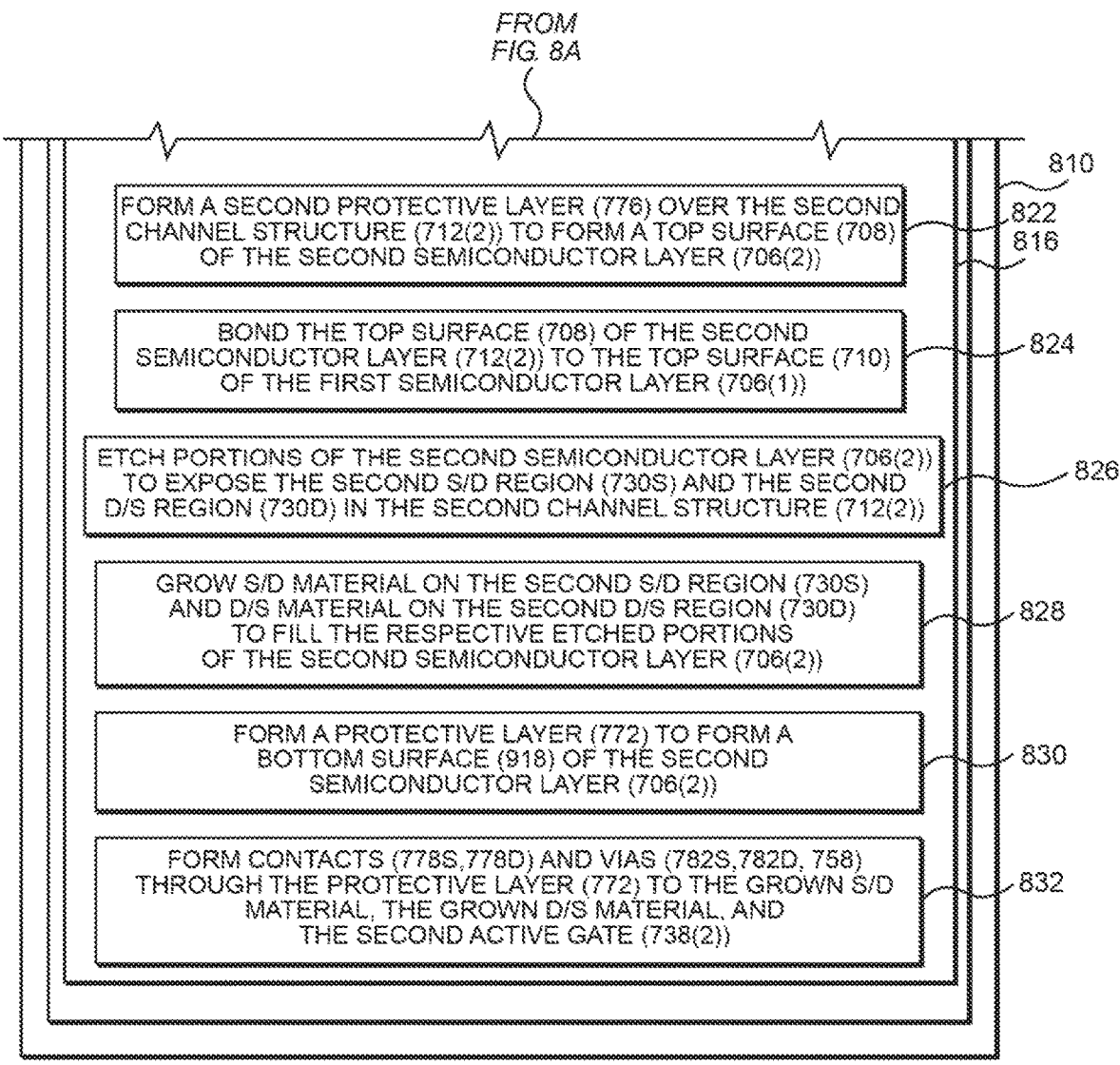

The cell circuit 700 can be fabricated according to a variety of methods and processes. For example, the cell circuit 700 can be fabricated according to CMOS fabrication methods. In this regard, FIGS. 8A and 8B are a flowchart illustrating an exemplary process 800 of fabricating the cell circuit 700 in FIGS. 7A-7D. FIGS. 9A-9I illustrate exemplary fabrication stages of the cell circuit 700 as it is fabricated according to the exemplary fabrication process 800. In this regard, the exemplary fabrication process 800 in FIGS. 8A and 8B and the exemplary fabrication stages of the cell circuit 700 in FIGS. 9A-9K will be discussed in conjunction with each other below.

FIGS. 8A and 8B are a flowchart illustrating an exemplary process for fabricating the vertically-integrated SOI FETs in a top-to-top orientation in the cell circuit 700 shown in FIGS. 7A-7D. The process 800 is explained with reference to the fabrication stages illustrated in FIGS. 9A-9I.

Figure 9A:
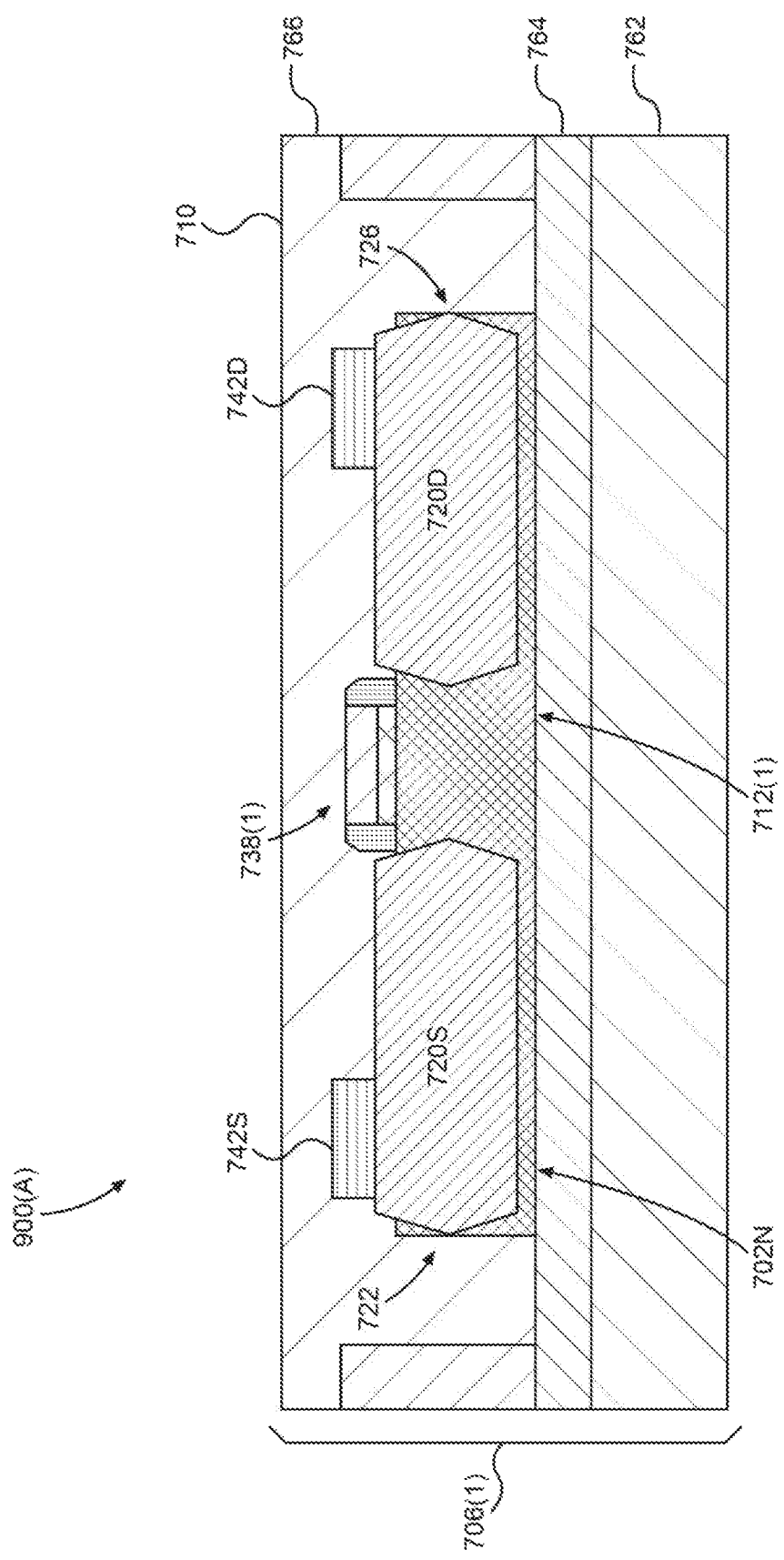
FIG. 9A is a cross-sectional side view of a first exemplary fabrication stage for fabricating the CMOS cell circuit shown in FIGS. 7A-7D in which an NMOS SOI FinFET with contacts to the gate, source, and drain regions of the fin is formed in the first semiconductor layer, according to the exemplary process in FIGS. 8A and 8B.

FIG. 9A is a cross-sectional view of the first semiconductor layer 706(1) in a first fabrication stage 900(A) in which the first semiconductor layer 706(1) including the NFET 702N is formed (block 802 in FIG. 8A). Forming the first semiconductor layer 706(1) including the NFET 702N includes forming the first channel structure 712(1) extending longitudinally in a first direction on the first STI layer 764 (block 804). Forming the NFET 702N further includes forming the first S/D region 720S in the first end portion 722 of the first fin 714(1), forming the first D/S region 720D in the second end portion 726 of the first fin 714(1), and forming the first active gate 738(1) above a top surface of the first channel structure 712(1) between the first S/D region 720S and the first D/S region 720D (block 806). In anticipation of the second fin 714(2) being formed in the second channel column 716(2) directly above at least a portion of the first fin 714(1), and overlapping at least a portion of the first channel column 716(1), the horizontal interconnect structures 742S, 748(1) (see FIG. 7B), and 742D are formed in contact with the first S/D region 720S, the first active gate 738(1), and the first D/S region 720D, respectively. Forming the first horizontal gate interconnect structure 748(1) includes forming the first gate 750(1), which includes forming the first field gate 752(1) adjacent to and in contact with the first active gate 738(1). In addition, the first metal S/D contact 756S, the first metal gate contact 754, and the first metal D/S contact 756D (none of which is shown here) are formed in contact with the horizontal interconnect structures 742S, 748(1), and 742D. The first protective ILD 766 is formed over the NFET 702N, and a top surface of the first protective ILD 766 forms the top surface 710 of the first semiconductor layer 706(1) (block 808).

Figure 9B:
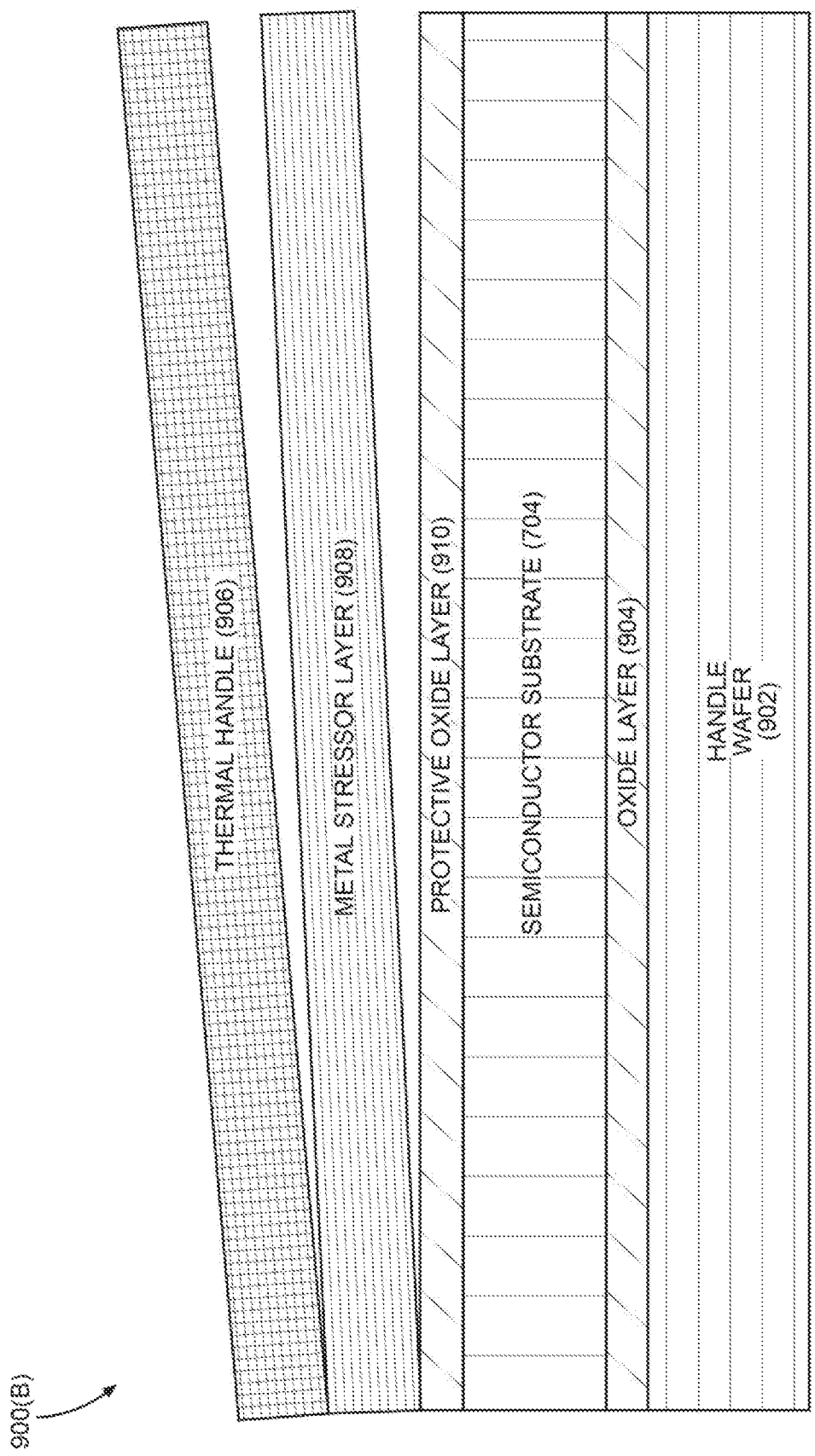
FIG. 9B is a cross-sectional side view in a fifth exemplary fabrication stage of the CMOS cell circuit shown in FIGS. 7A-7D in which, following second through fourth stages as illustrated in FIGS. 4B-4D, the second semiconductor layer is bonded to an oxide layer on a handle wafer, and a thermal handle layer and a Ni metal stressor layer are removed, according to the exemplary process in FIGS. 8A and 8B.

FIG. 9B illustrates an exemplary fabrication stage 900(B) in which fabricating the cell circuit 700 further includes disposing the second semiconductor layer 706(2) above the first semiconductor layer 706(1) (block 810), which includes disposing a semiconductor substrate 704 on a handle wafer 902. Disposing the semiconductor substrate 704 on the handle wafer 902 includes the steps (illustrated in FIGS. 4B-4D) corresponding to first forming the semiconductor substrate 404 on the donor wafer 402, forming the protective oxide layer 408, the metal stressor layer 410, and the thermal handle 412 on the semiconductor substrate 404. The semiconductor substrate 704 is separated from the donor wafer 402 (block 812), and bonded to an oxide layer 904 on the handle wafer 902, and a thermal handle 906, a metal stressor layer 908, and a protective oxide layer 910 are removed from the semiconductor substrate 704.

Figure 9C:
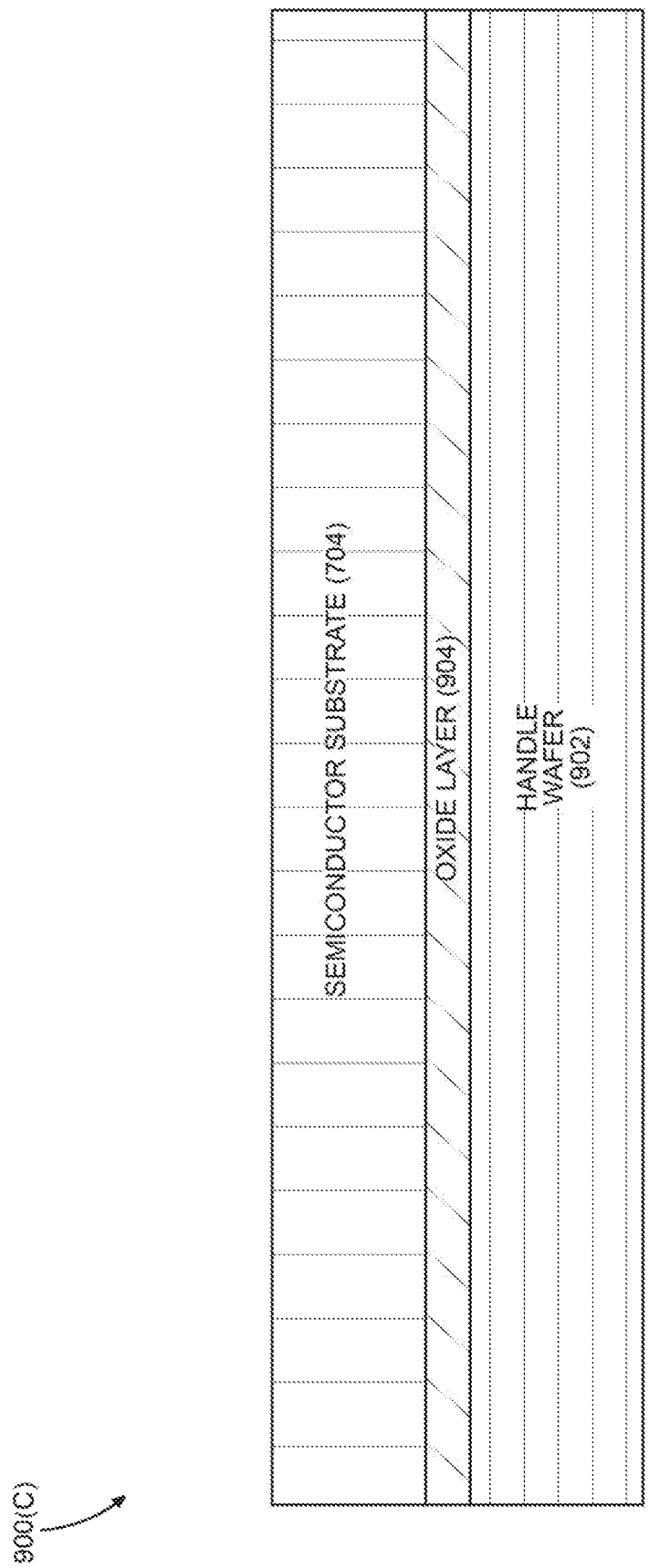
FIG. 9C is a cross-sectional side view in a sixth exemplary fabrication stage of the CMOS cell circuit shown in FIGS. 7A-7D in which the oxide layer is removed from the second semiconductor layer according to the exemplary process in FIGS. 8A and 8B.

FIG. 9C illustrates an exemplary fabrication stage 900(C) in which the semiconductor substrate 704 is bonded to the oxide layer 904 on the handle wafer 902.

Figure 9D:
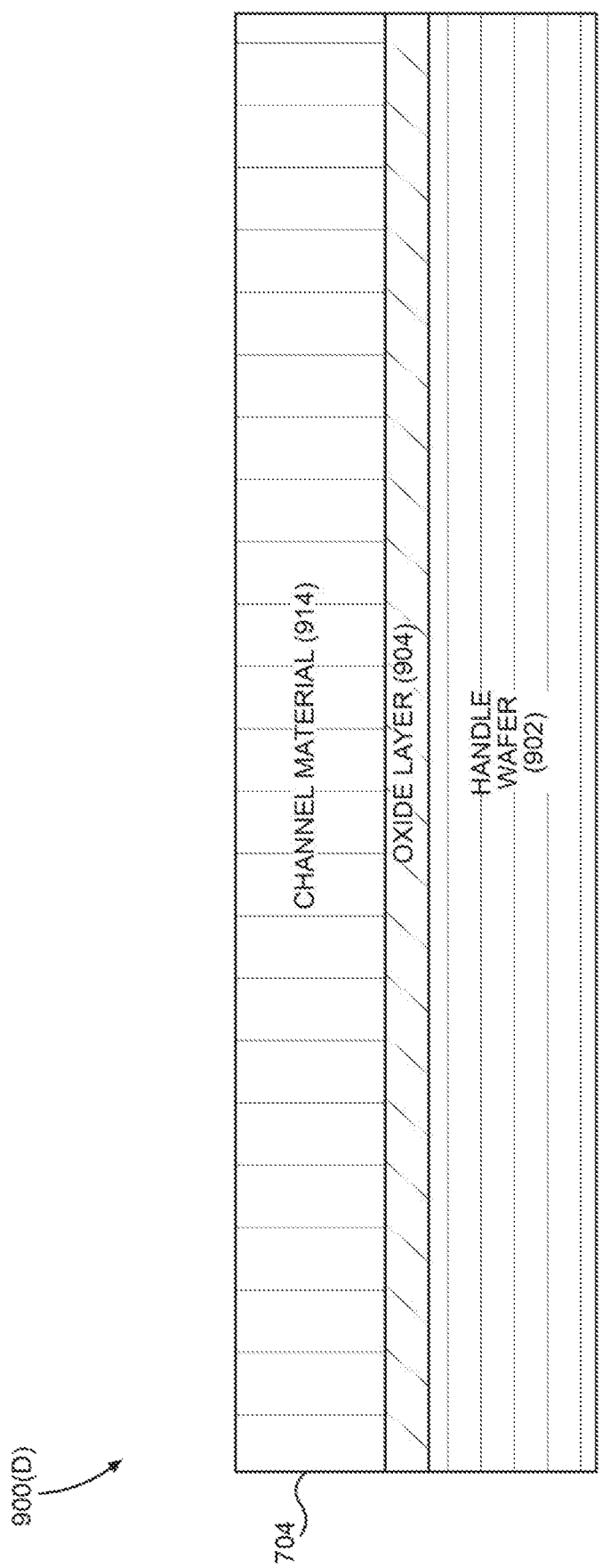
FIG. 9D is a cross-sectional side view in a seventh exemplary fabrication stage of the CMOS cell circuit shown in FIGS. 7A-7D in which the second semiconductor layer is doped for the PMOS SOI FinFET, according to the exemplary process in FIGS. 8A and 8B.

FIG. 9D illustrates an exemplary fabrication stage 900(D) in which, to dispose the second semiconductor layer 706(2), including the semiconductor substrate 704, on the top surface 710 of the first semiconductor layer 706(1) (block 814), the PFET 702P is formed in the semiconductor substrate 704 (block 816). In the example of the cell circuit 700, a channel material 914 is doped to correspond to the PFET 702P. In another example, the channel material 914 may be doped to correspond to the NFET 702N if the first semiconductor layer 706(1) in a CMOS cell circuit includes a PFET.

Figure 9E:
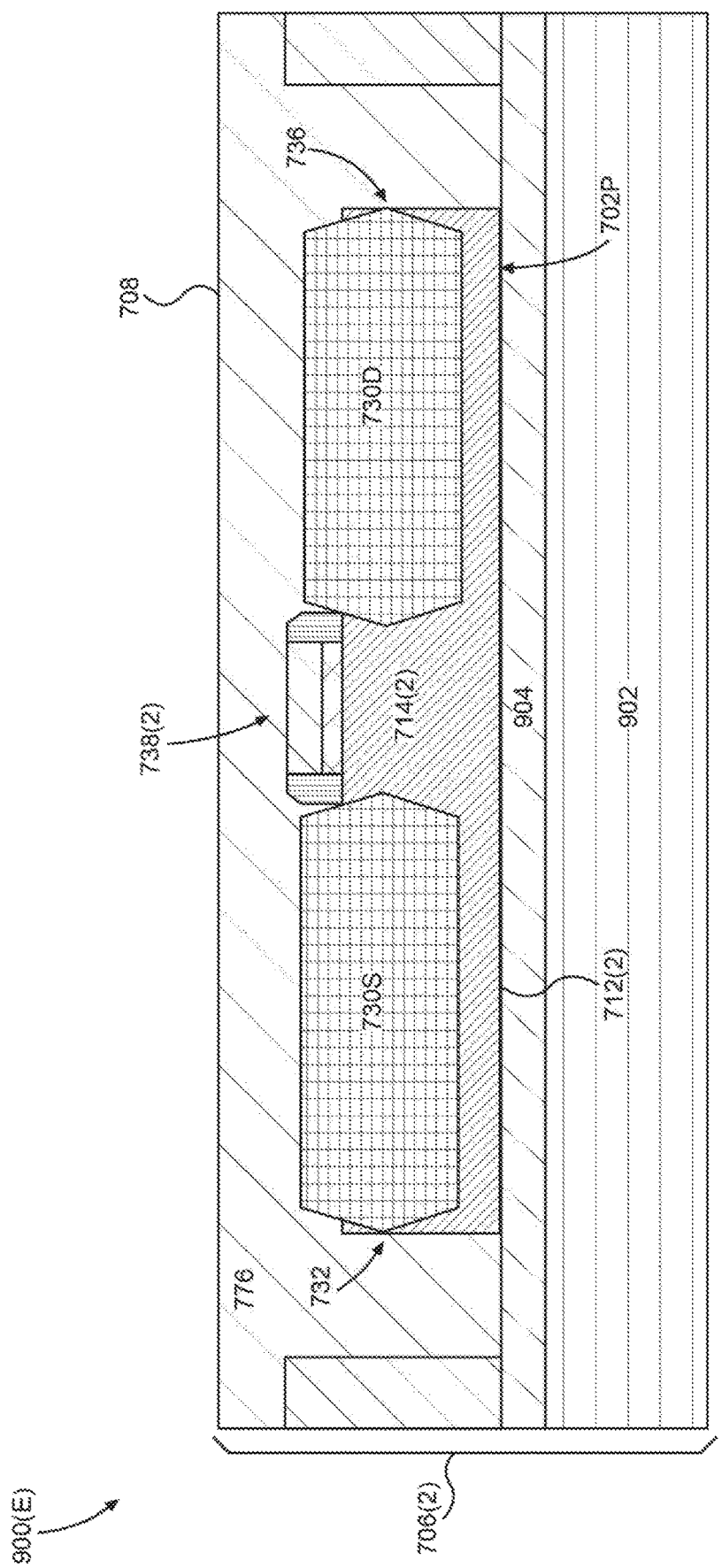
FIG. 9E is a cross-sectional side view in an eighth exemplary fabrication stage of the CMOS cell circuit shown in FIGS. 7A-7D in which the PMOS SOI FinFET with a gate on an active channel region is formed in the second semiconductor layer shown in FIG. 9D according to the exemplary process in FIGS. 8A and 8B.

FIG. 9E illustrates an exemplary fabrication stage 900(E) of forming the second semiconductor layer 706(2) including the PFET 702P. Forming the PFET 702P includes forming the second channel structure 712(2) in the channel material 914 such that the second channel structure 712(2) extends longitudinally in a second direction on the handle wafer 902 (block 818). In the example of cell circuit 700, the second channel structure 712(2) is in the form of the second fin 714(2), but the second channel structure 712(2) may have other forms, as discussed below. Forming the PFET 702P further includes forming the second S/D region 730S in the first end portion 732 of the second fin 714(2), forming the second D/S region 730D in the second end portion 736 of the second fin 714(2), and forming the second active gate 738(2) above a top surface of the second fin 714(2) between the second S/D region 730S and the second D/S region 730D (block 820 in FIG. 8A). Forming the PFET 702P further includes forming the second horizontal gate interconnect structure 748(2) (not shown) in contact with the second active gate 738(2) and extending in a direction orthogonal to the second direction in which the second channel structure 712(2) longitudinally extends. The second protective ILD 776 is disposed on the PFET 702P, including the second fin 714(2), to form the top surface 708 of the second semiconductor layer 706(2) (block 822 in FIG. 8B).

Figure 9F:
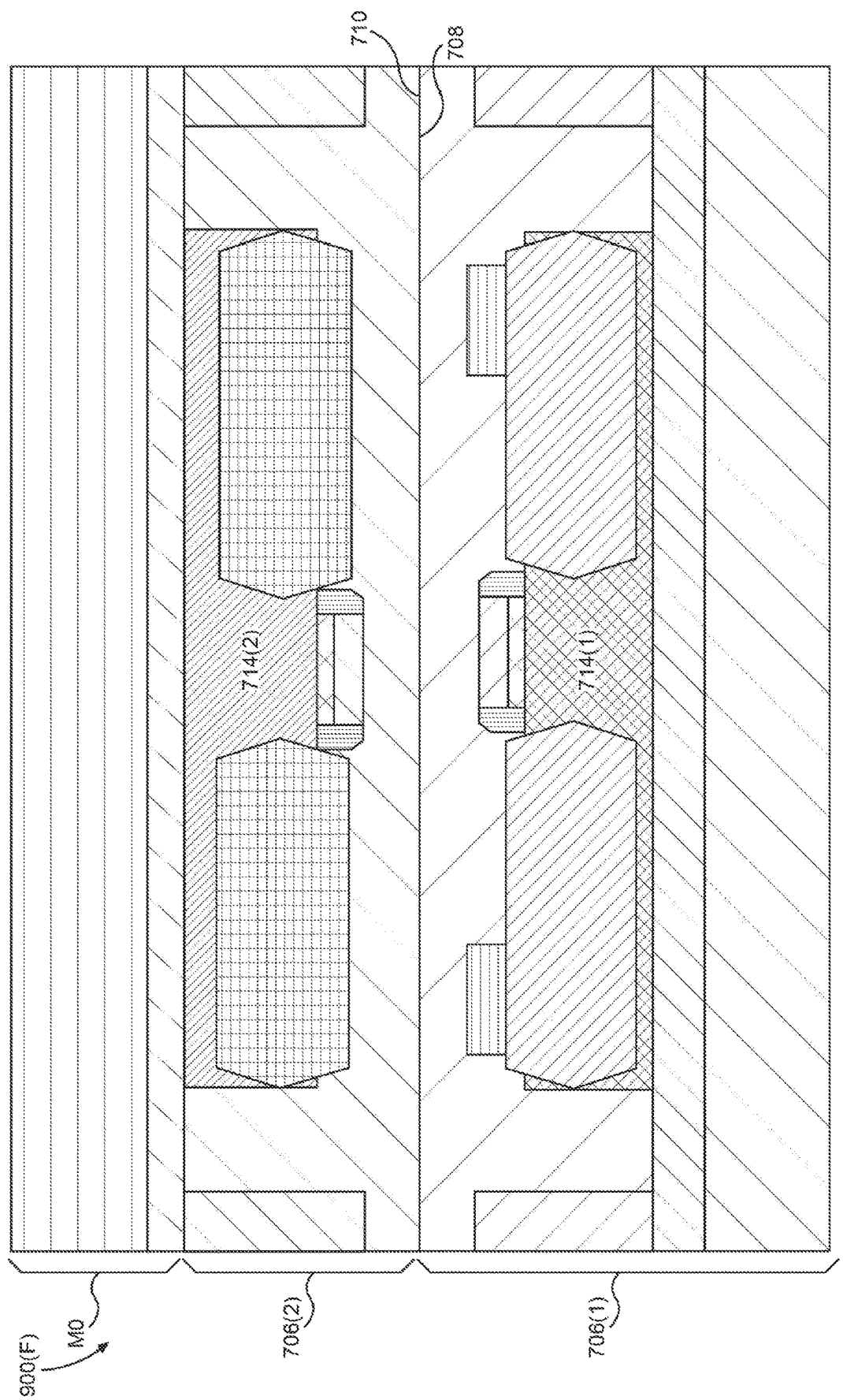
FIG. 9F is a cross-sectional side view in a ninth exemplary fabrication stage of the CMOS cell circuit shown in FIGS. 7A-7D in which the second semiconductor layer with the PMOS SOI FinFET is bonded in a top-to-top orientation on the first semiconductor layer including the NMOS SOI FinFET, according to the exemplary process in FIGS. 8A and 8B.

FIG. 9F illustrates an exemplary fabrication stage 900(F) in which the second semiconductor layer 706(2) is inverted, and the top surface 708 of the second semiconductor layer 706(2) is bonded to the top surface 710 of the first semiconductor layer 706(1) (block 824 in FIG. 8B). The second semiconductor layer 706(2) is further oriented with respect to the first semiconductor layer 706(1) such that the second fin 714(2) at least partially overlaps the first fin 714(1). In the cell circuit 700, the second fin 714(2) fully overlaps the first fin 714(1). By overlapping the second fin 714(2) with the first fin 714(1) in the vertical (i.e., Z-axis) direction, the footprint area of the cell circuit 700 is reduced in comparison to a CMOS cell circuit in which a PFET and an NFET are laterally disposed (i.e., side-by-side) on a horizontal substrate surface.

Figure 9G:
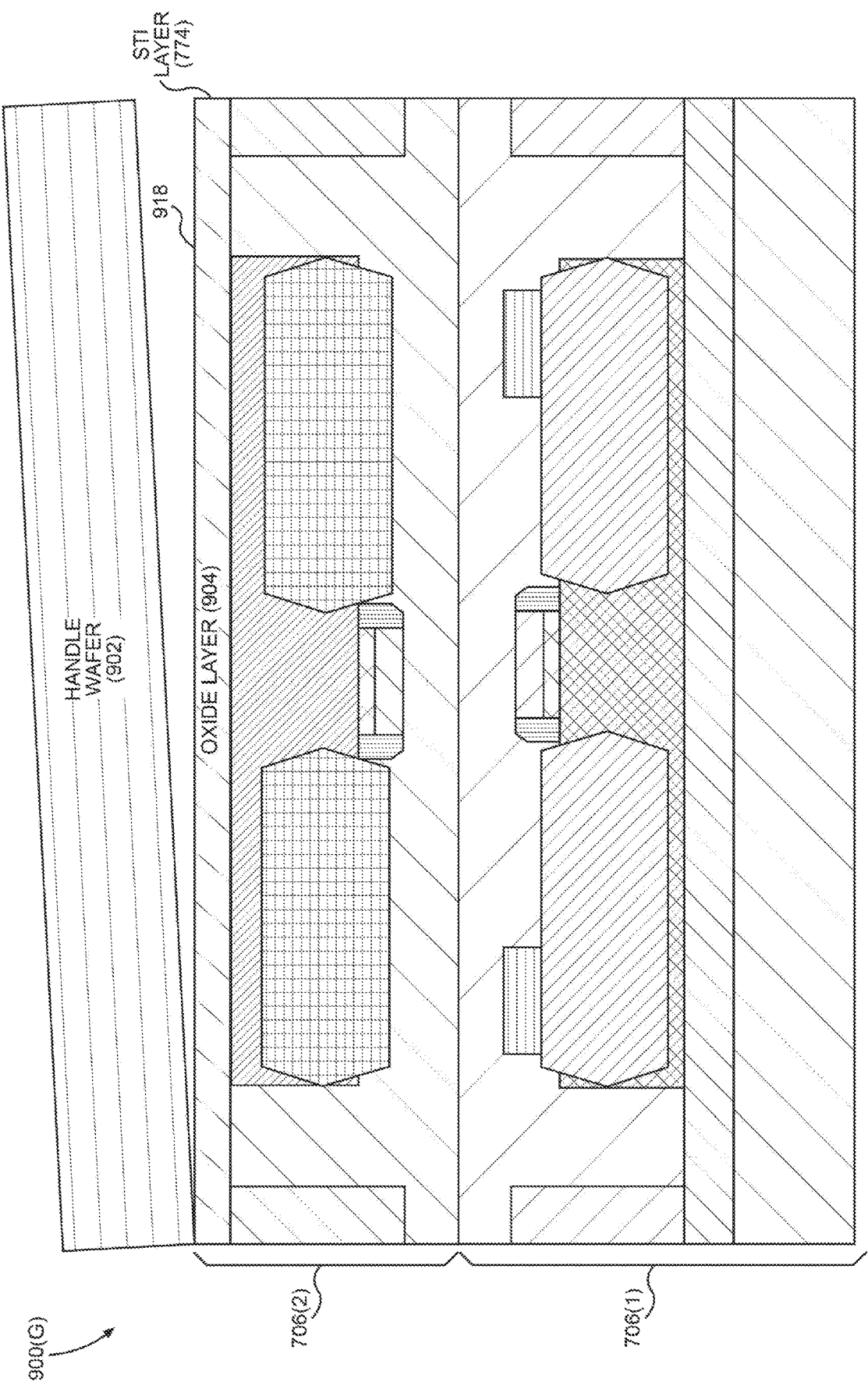
FIG. 9G is a cross-sectional side view in a tenth exemplary fabrication stage of the CMOS cell circuit shown in FIGS. 7A-7D in which the handle wafer is removed from the second semiconductor layer according to the exemplary process in FIGS. 8A and 8B.

FIG. 9G illustrates an exemplary fabrication stage 900(G) in which the handle wafer 902 is removed from the second semiconductor layer 706(2), but the oxide layer 904, on which the second fin 714(2) is formed, is not removed. The oxide layer 904 forms the STI layer 774, which forms a bottom surface 918 of the second semiconductor layer 706(2).

Figure 9H:
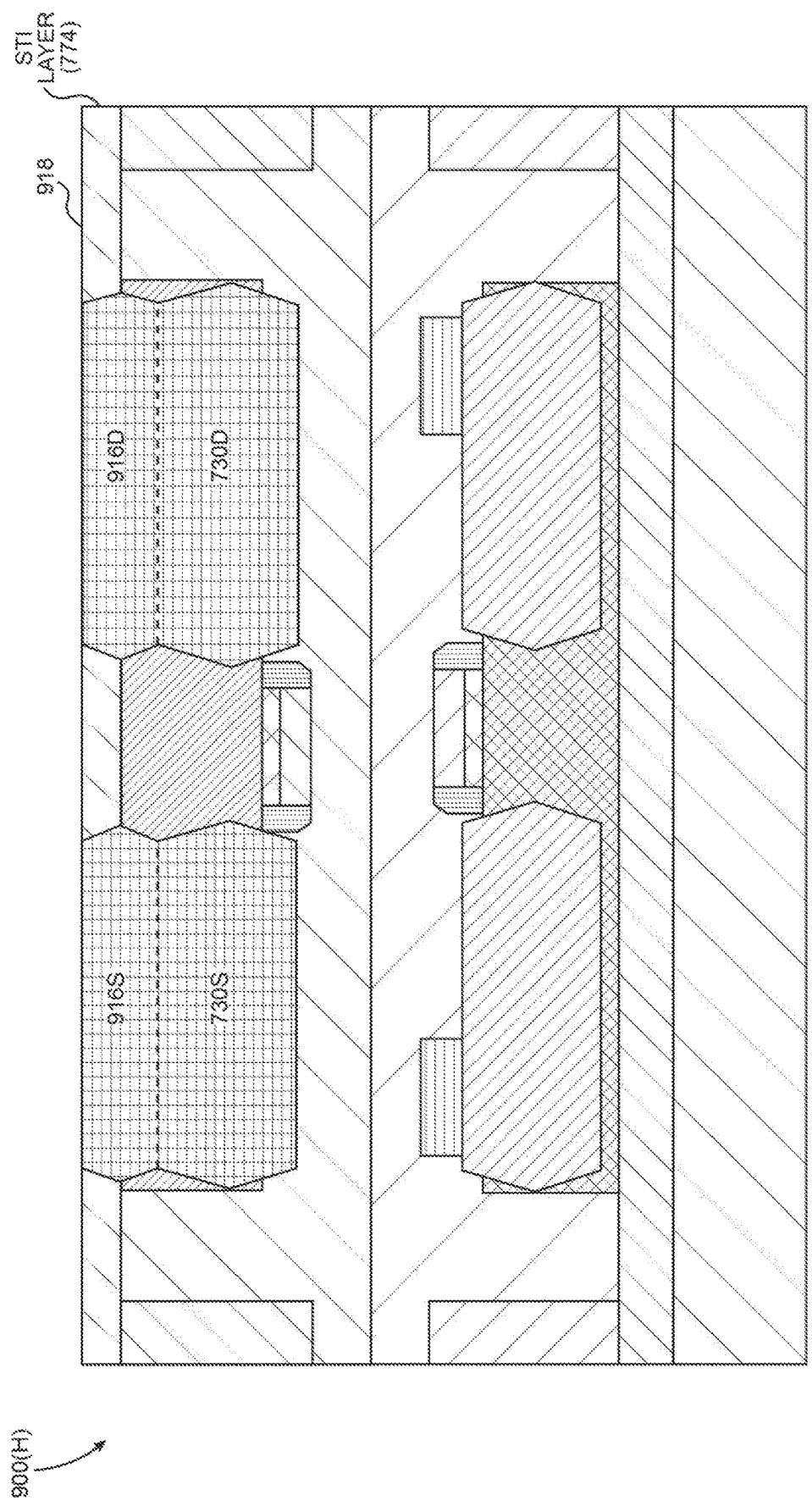
FIG. 9H is a cross-sectional side view in an eleventh exemplary fabrication stage of the CMOS cell circuit shown in FIGS. 7A-7D in which openings are etched in the oxide layer to expose the source and drain regions of the fin, and the source and drain regions are raised to a surface of the oxide layer by epitaxial growth according to the exemplary process in FIGS. 8A and 8B.

FIG. 9H illustrates an exemplary fabrication stage 900(H) in which portions of the second semiconductor layer 706(2) are etched to expose the second S/D region 730S and the second D/S region 730D (block 826 in FIG. 8B). In particular, areas 916S and 916D of the STI layer 774 corresponding to the second S/D region 730S and the second D/S region 730D are recessed by employing, for example, patterned photo resist and etching processes, to expose the second S/D region 730S and the second D/S region 730D. The second S/D region 730S and the second D/S region 730D are raised through the STI layer 774 by growing (e.g., epitaxially) S/D material on the second S/D region 730S and the D/S material on the second D/S region 730D to fill the recessed areas 916S and 916D (block 828 in FIG. 8B).

Figure 9I:
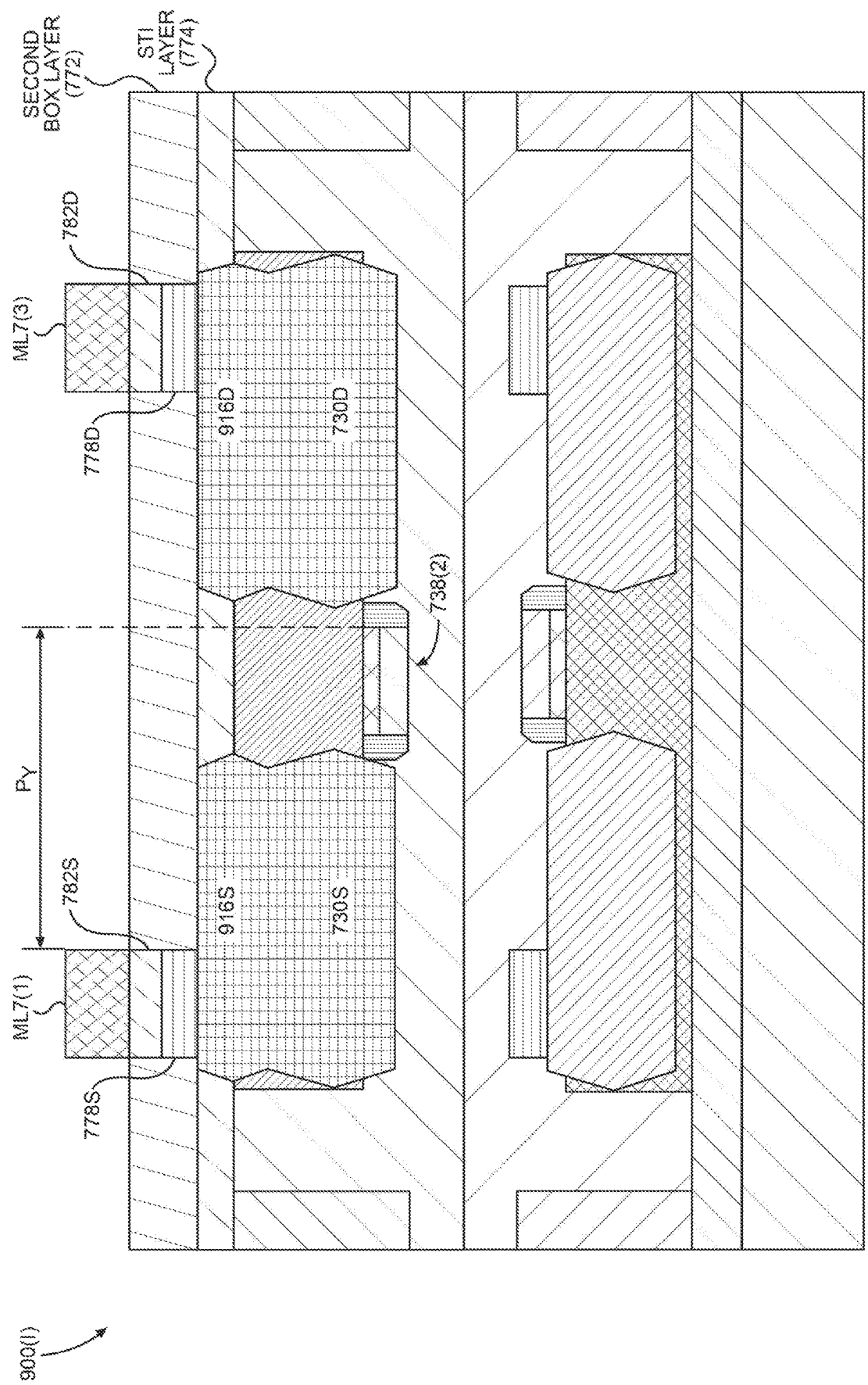
FIG. 9I is a cross-sectional side view in a twelfth exemplary fabrication stage of the CMOS cell circuit shown in FIGS. 7A-7D in which a protective layer is formed on the second semiconductor layer, and contacts to the source and drain regions are formed in the protective layer to couple to metal layers according to the exemplary process in FIGS. 8A and 8B.

FIG. 9I illustrates an exemplary fabrication stage 900(I) in which the second BOX layer 772 is formed over the STI layer 774 and the raised second S/D region 730S and the second D/S region 730D in the areas 916S and 916D to restore the bottom surface 918 of the second semiconductor layer 706(2) (block 830 in FIG. 8B). The second metal S/D contact 778S and the via 782S are formed in the second BOX layer 772 to vertically couple the second S/D region 730S to the metal line ML7(1). The second metal S/D contact 778S and the via 782S are formed in the area 916S and are spaced at the line pitch $P_Y$ from the second active gate 738(2). The second metal D/S contact 778D and the via 782D are formed in the second BOX layer 772 to vertically couple the second D/S region 730D to the metal line ML7(3). The second metal D/S contact 778D and the via 782D are formed on the second D/S region 730D in the area 916D and are spaced at the line pitch $P_Y$ from the second active gate 738(2). Although not shown in FIGS. 7A-7D, the second gate via 758 is formed in the second BOX layer 772 to vertically couple the second field gate 752(2) to the metal line ML7(2) (block 832 in FIG. 8B).

Figure 10A:
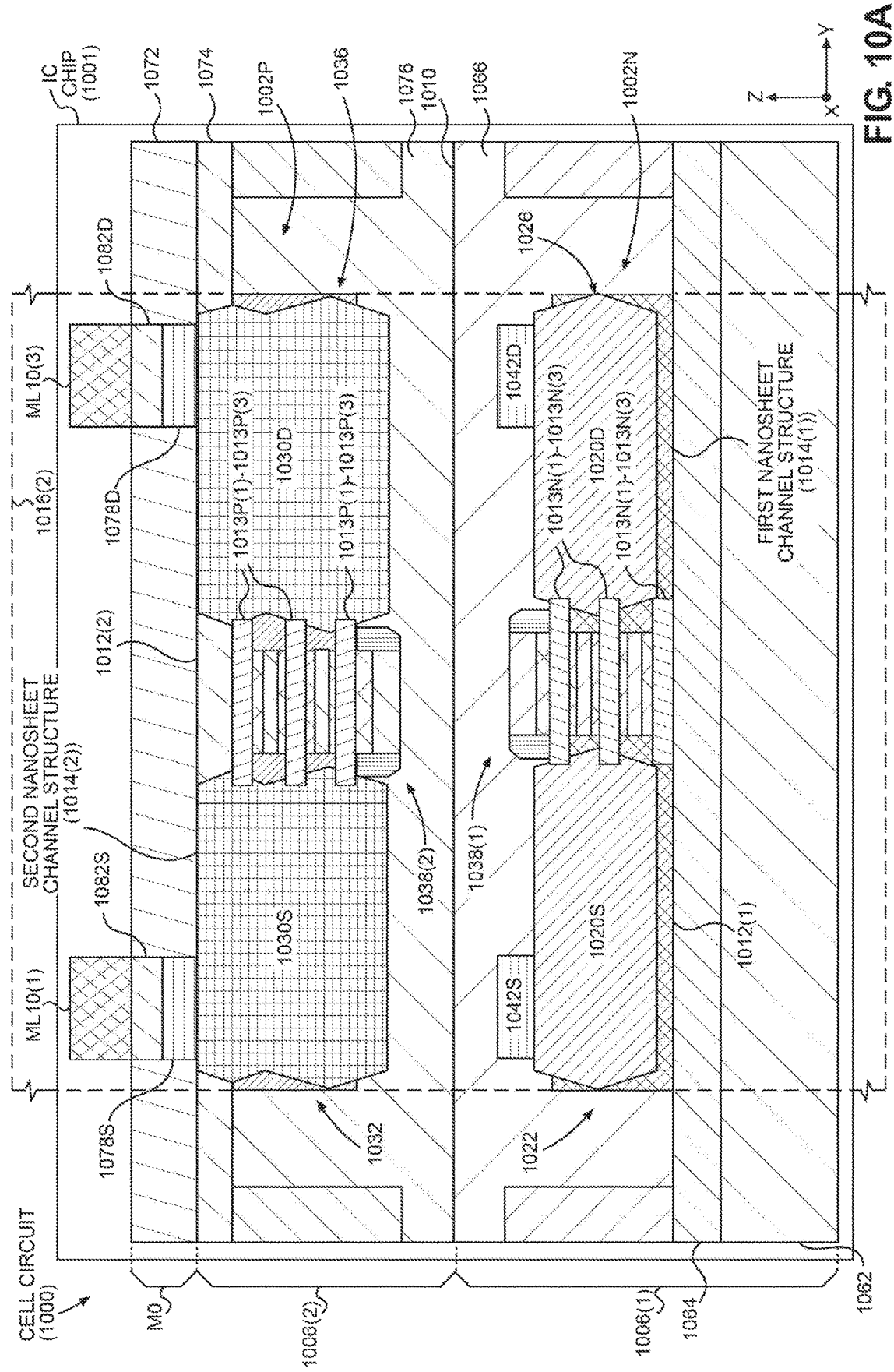
FIG. 10A is a cross-sectional side view in a first direction of an exemplary CMOS cell circuit in which a SOI PMOS nanosheet FET in a second semiconductor layer is vertically integrated in a top-to-top orientation on a SOI NMOS nanosheet FET in a first semiconductor layer.

FIG. 10A is a cross-sectional side view of an exemplary CMOS cell circuit 1000 (referred to herein as "cell circuit 1000") which can be formed as part of an IC chip 1001. The cross-sectional side view of the cell circuit 1000 in FIG. 10A is in the direction of the X-axis, and the cross-section of the cell circuit 1000 in FIG. 10A is in a plane in the Y-axis and Z-axis directions. With further reference to FIG. 10A, in this example, an NFET 1002N is a silicon-on-insulator (SOI) nanosheet NFET ("nanosheet NFET 1002N") formed in a first semiconductor layer 1006(1) vertically integrated in a top-to-top orientation on a SOI nanosheet PFET 1002P ("nanosheet PFET 1002P") formed in a second semiconductor layer 1006(2) to support CMOS circuits. To reduce a footprint area of the cell circuit 1000, the second semiconductor layer 1006(2) is vertically integrated (i.e., "stacked") on or above a top surface 1010 of the first semiconductor layer 1006(1).

As illustrated in FIG. 10A, the nanosheet NFET 1002N has a first channel structure 1012(1) of a Gate-All-Around (GAA) three-dimensional (3D) nanosheet type. In particular, the first channel structure 1012(1) is formed of stacked nanosheets 1013N(1)-1013N(3) having a first type of doping The nanosheet PFET 1002P has a second channel structure 1012(2) of the GAA 3D nanosheet type, wherein the second channel structure 1012(2) is in the form of stacked nanosheets 1013P(1)-1013P(3) having a second type of doping. The first and second channel structures 1012(1) and 1012(2) could also be formed of nanoslabs or nanowires, for example. The nanosheet NFET 1002N in FIG. 10A includes three (3) nanosheets 1013N(1)-1013N(3) stacked to form a first nanosheet channel structure 1014(1), and the nanosheet PFET 1002P includes three (3) stacked nanosheets 1013P (1)-1013P(3) to form a second nanosheet channel structure 1014(2). However, a number of nanosheets in the nanosheet channel structures 1014(1) and 1014(2) are not limited to three (3), and could be more or less than three. In addition, a number of nanosheets in the first nanosheet channel structure 1014(1) in the nanosheet NFET 1002N is not necessarily the same as a number of nanosheets in the second nanosheet channel structure 1014(2) in the nanosheet PFET 1002P.

As shown in FIG. 10A, the second semiconductor layer 1006(2) is stacked on the first semiconductor layer 1006(1) such that the first stacked nanosheet channel structure 1014 (1) of the nanosheet NFET 1002N is overlapped in the vertical Z-axis direction by the second nanosheet channel structure 1014(2) of the nanosheet PFET 1002P. A second channel column 1016(2) extends vertically from a horizontal area of the second nanosheet channel structure 1014(2), and a first channel column 1016(1) extends vertically from a horizontal area of the first nanosheet channel structure 1014(1). In this regard, the second channel column 1016(2) overlaps at least a portion of the first channel column 1016(1). In the example in FIG. 10A, the second nanosheet channel structure 1014(2) in the second semiconductor layer 1006(2) overlaps the first nanosheet channel structure 1014 (1) in the first semiconductor layer 1006(1) such that the second channel column 1016(2) fully overlaps the first channel column 1016(1).

With continuing reference to FIG. 10A, the nanosheet NFET 1002N includes a first S/D region 1020S in a first end portion 1022 of the first nanosheet channel structure 1014 (1), and a first D/S region 1020D in a second end portion 1026. For example, if the first S/D region 1020S is a source (S) region, the first D/S region 1020D is a drain (D) region, and vice versa. Similarly, the nanosheet PFET 1002P includes a second S/D region 1030S in a first end portion 1032 of the second nanosheet channel structure 1014(2), and a second D/S region 1030D in a second end portion 1036. A first active gate 1038(1) is disposed on a top side of the first nanosheet channel structure 1014(1) between the first S/D region 1020S and the first D/S region 1020D.

To electrically couple the nanosheet PFET 1002P in the cell circuit 1000, the second S/D region 1030S and the second D/S region 1030D vertically couple within the second channel column 1016(2) to metal lines ML10(1) and ML10(3). Due to the second channel column 1016(2) of the second nanosheet channel structure 1014(2) overlapping the first channel column 1016(1) of the first nanosheet channel structure 1014(1), vertical coupling to any of the first S/D region 1020S, the first D/S region 1020D, and the first active gate 1038(1) is obstructed by the second nanosheet channel structure 1014(2). To avoid obstruction caused by the overlapping second channel column 1016(2), the first semiconductor layer 1006(1) includes horizontal interconnect structures, such as horizontal interconnect structures 1042S and 1042D described further with reference to FIG. 10B.

To provide interconnections to source, drain, and gate regions of channel structures of each of the vertically-integrated FETs, the cell circuit 1000 is designed so that contacts to the respective regions of the first channel structure 1012(1) of the nanosheet NFET 1002N on the first semiconductor layer 1006(1) are located below open areas of the second semiconductor layer 1006(2) (i.e., areas not occupied by the second channel structure 1012(2) or other structures of the nanosheet PFET 1002P). This allows unobstructed vertical access to the nanosheet NFET 1002N in the first semiconductor layer 1006(1) of stacked semiconductor layers.

FIG. 10B is cross-sectional side view of the cell circuit 1000. Specifically, the cross-sectional side view in FIG. 10B is in the direction of the Y-axis, and the cross-section of the cell circuit 1000 is in a plane in the X-axis and Z-axis directions. FIG. 10B illustrates an end view of the first nanosheet channel structure 1014(1) along a first longitudinal axis $A10_Y(1)$. As shown in FIGS. 10A and 10B, the second channel column 1016(2) of the second nanosheet channel structure 1014(2) overlaps the first channel column 1016(1) of the first nanosheet channel structure 1014(1) in both the X-axis direction and the Y-axis direction. Alternatively, the second channel column 1016(2) may partially overlap the first channel column 1016(1). In the first channel column 1016(1) of the first nanosheet channel structure 1014(1), where vertical coupling is obstructed by the overlapping second nanosheet channel structure 1014(2), the first semiconductor layer 1006(1) includes at least one horizontal interconnect structure having a second longitudinal axis $A10_X(1)$ orthogonal to the first longitudinal axis $A10_Y(1)$ (i.e., of the first nanosheet channel structure 1014(1)) and extending outside the second channel column 1016(2) of the second nanosheet channel structure 1014(2). For example, in FIG. 10B, the first semiconductor layer 1006(1) includes a first horizontal gate interconnect structure 1048(1) in contact with the first active gate 1038(1). In this regard, a first gate 1050(1) of the nanosheet NFET 1002N includes a first field gate 1052(1), which is adjacent to the first active gate 1038(1) and comprises the first horizontal gate interconnect structure 1048(1). The first semiconductor layer 1006(1) also includes a first metal gate contact 1054 outside of the second channel column 1016(2) of the second nanosheet channel structure 1014(2) and in contact with the first horizontal gate interconnect structure 1048(1). Vertical coupling to a metal line ML10(2) from the first metal gate contact 1054 is not obstructed by the second nanosheet channel structure 1014(2). A first gate via 1055 vertically couples the first metal gate contact 1054 to the metal line ML10(2). Thus, the first active gate 1038(1) is coupled to the metal line ML10(2).

With the vertical coupling to the second active gate 1038(2) obstructed by the second nanosheet channel structure 1014(2), the second semiconductor layer 1006(2) includes a second horizontal gate interconnect structure 1048(2) in contact with the second active gate 1038(2). In this regard, a second gate 1050(2) of the nanosheet PFET 1002P includes a second field gate 1052(2), which is adjacent to the second active gate 1038(2) and comprises the second horizontal gate interconnect structure 1048(2).

Returning to FIG. 10A, it is shown therein that the second channel column 1016(2) of the second nanosheet channel structure 1014(2) also overlaps the first S/D region 1020S and the first D/S region 1020D of the first nanosheet channel structure 1014(1). In this regard, the first semiconductor layer 1006(1) includes the first horizontal S/D interconnect structure 1042S in contact with the first S/D region 1020S, and includes the first horizontal D/S interconnect structure 1042D in contact with the first D/S region 1020D.

With reference back to FIG. 10A, the nanosheet NFET 1002N is formed on a first STI layer 1064 on a first BOX layer 1062. A first protective ILD 1066 forms the top surface 1010 of the first semiconductor layer 1006(1). The nanosheet PFET 1002P is formed on an STI layer 1074 on a second BOX layer 1072. The second S/D region 1030S and the second D/S region 1030D are formed in the second nanosheet channel structure 1014(2). The second semiconductor layer 1006(2) further includes a second protective ILD 1076. A second metal S/D contact 1078S and a second metal D/S contact 1078D are formed on the second S/D region 1030S and the second D/S region 1030D, respectively. The second metal S/D contact 1078S and the second metal D/S contact 1078D are vertically coupled through the STI layer 1074 and the second BOX layer 1072 by vias 1082S and 1082D, respectively. As shown in FIG. 10B, the second field gate 1052(2) is vertically coupled through the STI layer 1074 and the second BOX layer 1072 to the metal layer ML2(10) by a second gate via 1058.

Figure 11B:
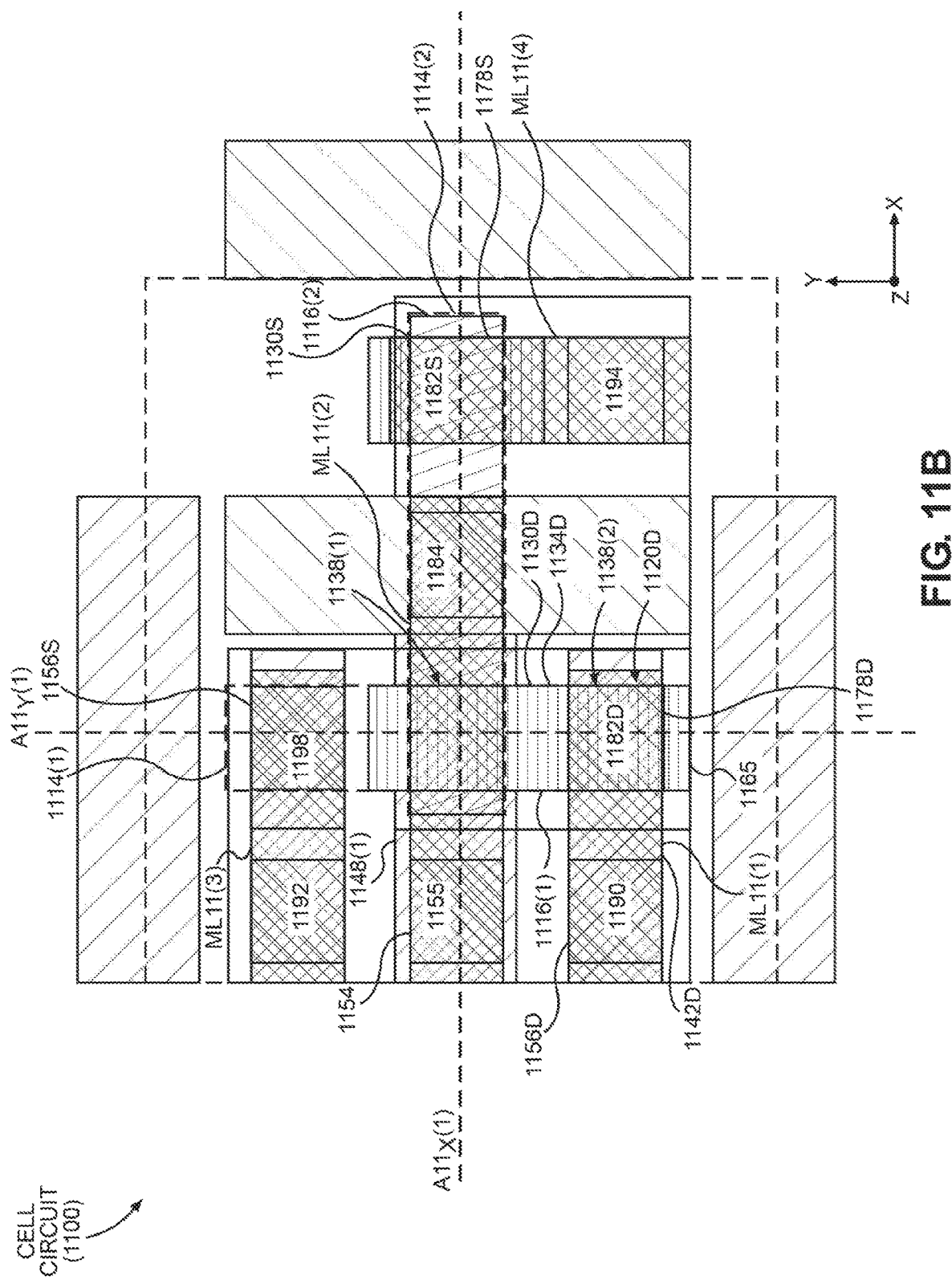
FIG. 11B is a top view of the first and second semiconductor layers shown in FIGS. 11A-1 and 11A-2 vertically integrated in a CMOS cell circuit.

FIGS. 11A-1 and 11A-2 are top views of a first semiconductor layer 1106(1) including an NFET 1102N, and a second semiconductor layer 1106(2) including a PFET 1102P for fabricating a cell circuit 1100 illustrated in FIG. 11B. The NFET 1102N includes a first fin 1114(1) and the PFET 1102P includes a second fin 1114(2). In the cell circuit 1100, the second fin 1114(2) does not fully overlap the first fin 1114(1). Rather, as shown in FIG. 11B, the second semiconductor layer 1106(2) is oriented such that the second fin 1114(2) is orthogonal to the first fin 1114(1).

In FIG. 11A-1, the first fin 1114(1) is disposed along a first axis $A11_Y(1)$. The first fin 1114(1) includes a first D/S region 1120D, a first active gate 1138(1), and a first S/D region 1120S disposed along the first fin 1114(1) in the Y-axis direction and spaced apart at a line pitch $P_Y$ to coincide with metal lines ML11(1)-ML11(3) shown in FIG. 11B. FIG. 11A-2 shows the second fin 1114(2) disposed along a second axis $A11_X(1)$. The second fin 1114(2) includes a second D/S region 1130D, a second active gate 1138(2), and a second S/D region 1130S disposed along the second fin 1114(2) in the X-axis direction and spaced apart at a line pitch $P_X$. The alignment of regions of the first fin 1114(1) and the second fin 1114(2) during fabrication of the cell circuit 1100 is illustrated in FIG. 11B.

In FIG. 11B, the second D/S region 1130D of the second fin 1114(2) is stacked vertically above the first active gate 1138(1) of the first fin 1114(1). Thus, vertical coupling above the first active gate 1138(1) is obstructed by the second fin 1114(2). In other words, a second channel column 1116(2) of the second fin 1114(2) overlaps a first channel column 1116(1) of the first fin 1114(1) only where the second D/S region 1130D is vertically integrated above the first active gate 1138(1). To avoid the vertical obstruction above the first active gate 1138(1), a first horizontal gate interconnect structure 1148(1) in contact with the first active gate 1138(1) is disposed in a direction orthogonal to the first fin 1114(1), and a first metal gate contact 1154 is formed on the first horizontal gate interconnect structure 1148(1). A via 1155 vertically couples the first metal gate contact 1154 to the metal line ML11(2).

In the cell circuit 1100, a first metal S/D contact 1156S is formed on the first S/D region 1120S, and a via 1198 vertically couples the first metal S/D contact 1156S to the metal line ML11(3) which couples a voltage from a ground node 1192.

The NFET 1102N includes a first horizontal D/S interconnect structure 1142D in contact with the first D/S region 1120D. A first metal D/S contact 1156D is formed on the first horizontal D/S interconnect structure 1142D. A second horizontal D/S interconnect structure 1134D is formed in the second semiconductor layer 1106(2) in contact with the second D/S region 1130D. The second horizontal D/S interconnect structure 1134D extends in a direction orthogonal to the second fin 1114(2) and a second metal D/S contact 1178D is formed on the second horizontal D/S interconnect structure 1134D in a location corresponding to the metal line ML11(1) in the Z-axis direction. Vias 1190 and 1182D vertically couple the first metal D/S contact 1156D and the second metal D/S contact 1178D, respectively, to the metal line ML11(1).

In other aspects of the inverter configuration of cell circuit 1100, a via 1184 vertically couples the second active gate 1138(2) to the metal line ML11(2), such that the second active gate 1138(2) is electrically coupled to the first active gate 1138(1). A second S/D metal contact 1178S is formed on the second S/D region 1130S of the second fin 1114(2), and the second S/D metal contact 1178S is vertically coupled, by a via 1182S, to a metal line ML11(4) to couple a supply voltage from a supply voltage node 1194.

With reference back to FIGS. 11A-1 and 11A-2, the NFET 1102N and the PFET 1102P are bulk-type FETs. Thus, the first semiconductor layer 1106(1) includes a first well region 1160(1) and the second semiconductor layer 1106(2) includes a second well region 1160(2). In another example of the cell circuit 1100, the NFET 1102N and the PFET 1102P may be SOI FETs without the well regions 1160(1) and 1160(2). As in previously discussed examples, the vias vertically coupling the NFET 1102N and the PFET 1102P to the metal lines ML11(1)-ML11(4) are spaced apart in the Y-axis direction according to the line pitch $P_Y$ of the metal lines ML11(1)-ML11(4), and also spaced apart according to the line pitch $P_X$ in the X-axis direction.

Dummy gates 1199(1)-1199(4), which are structural features that are not electrically active, are also shown at ends of the first and second semiconductor layers 1106(1) and 1106(2).

The cell circuit 1100, with the first and second semiconductor layers 1106(1) and 1106(2) vertically integrated as shown, has a reduced footprint area compared to a CMOS cell circuit in which an NFET 1102N and a PFET 1102P are laterally disposed in a horizontal direction on a surface of a substrate. In addition, various configurations of the cell circuit 1100 are made possible because the PFET 1102P and the NFET 1102N are both vertically coupled to the metal lines ML11(1)-ML11(4).

Figures 2, 12A:
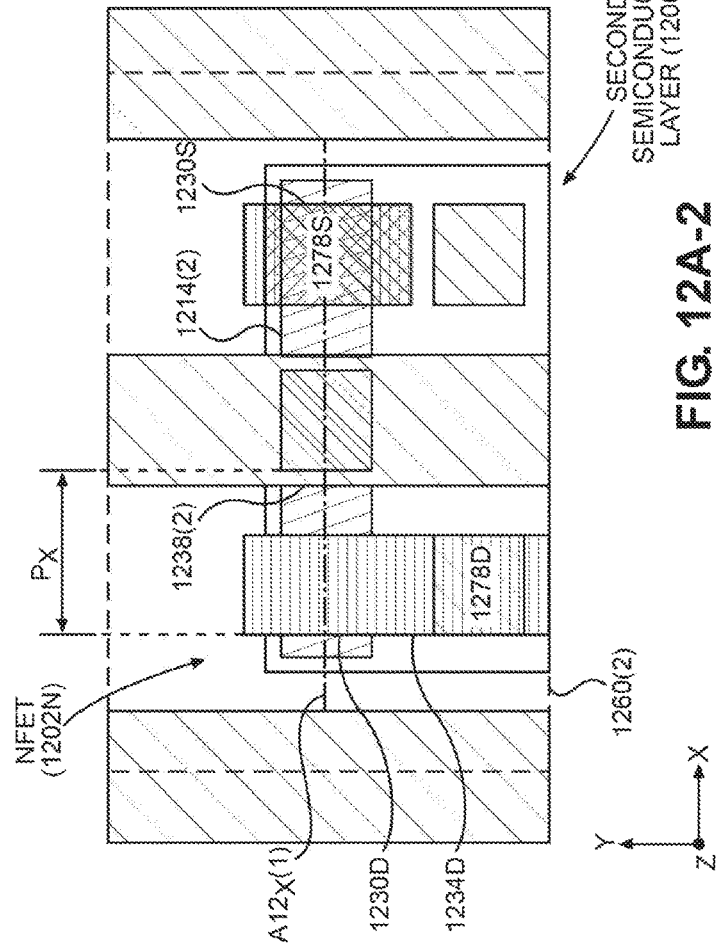
Figures 1, 12A:
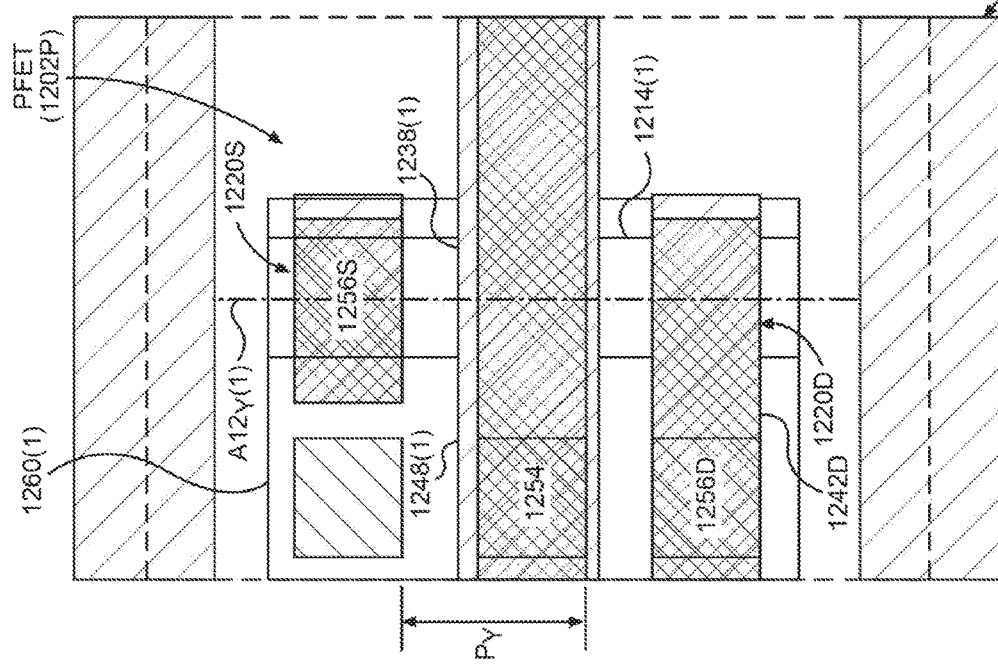
Figure 12B:
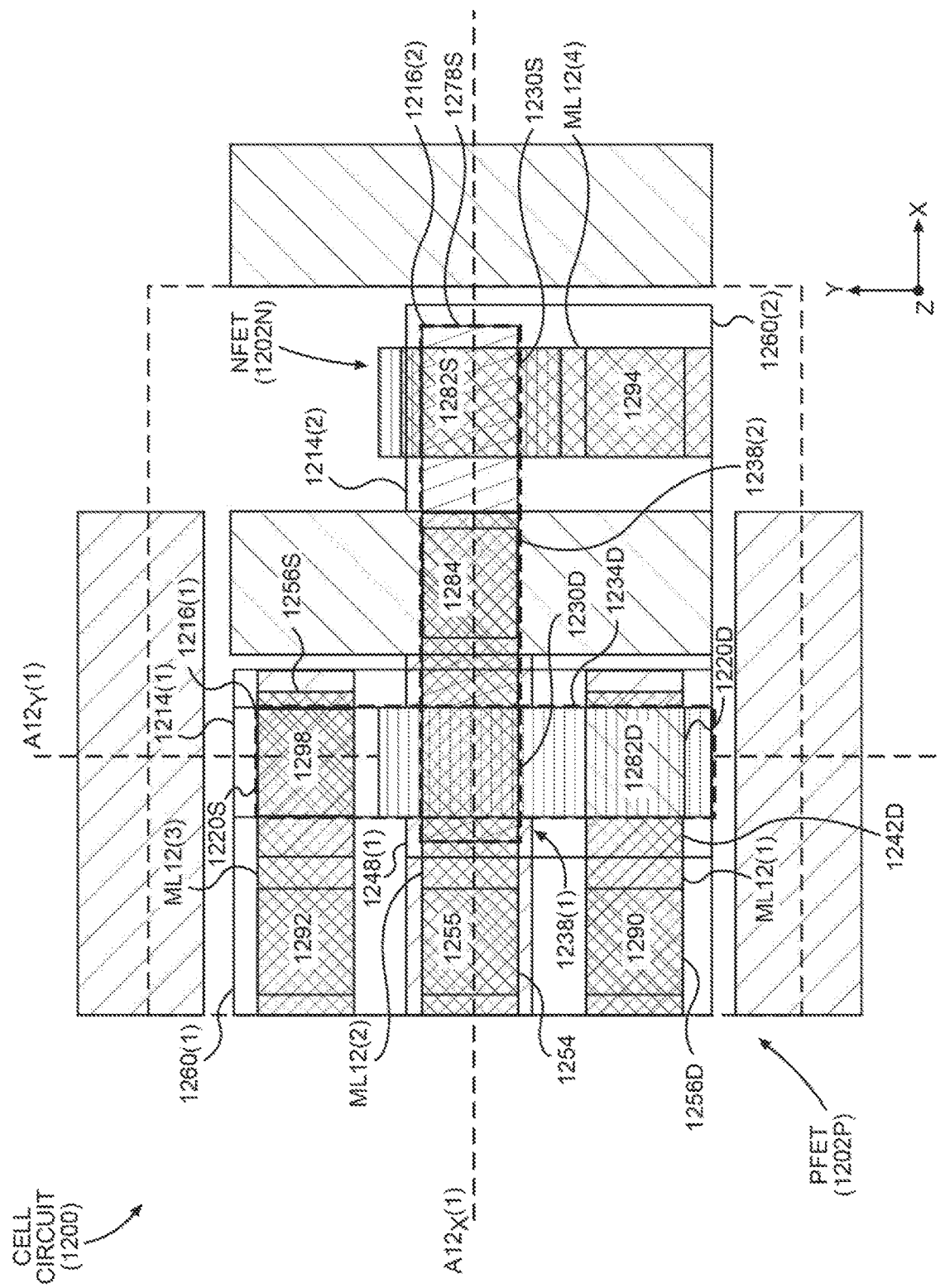
FIG. 12B is a top view of the first and second semiconductor layers shown in FIGS. 12A-1 and 12A-2 vertically integrated in a CMOS cell circuit.

FIGS. 12A-1 and 12A-2 are top views of a first semiconductor layer 1206(1) including a PFET 1202P, and a second semiconductor layer 1206(2) including an NFET 1202N for fabricating a cell circuit 1200 illustrated in FIG. 12B. The PFET 1202P includes a first fin 1214(1) and the NFET 1202N includes a second fin 1214(2). As shown in FIG. 12B, the second semiconductor layer 1206(2) is oriented such that the second fin 1214(2) is orthogonal to the first fin 1214(1). In the cell circuit 1200, the NFET 1202N is vertically stacked over the PFET 1202P, in contrast to cell circuit 1100 of FIG. 11B, which vertically stacks the PFET 1102P over the NFET 1102N.

In FIG. 12A-1, the first fin 1214(1) is disposed along a first axis $A12_Y(1)$. The first fin 1214(1) includes a first D/S region 1220D, a first active gate 1238(1), and a first S/D region 1220S disposed along the first fin 1214(1) in the Y-axis direction and spaced apart at a line pitch $P_Y$ to coincide with metal lines ML12(1)-ML12(4) shown in FIG. 12B. In FIG. 12A-2, the second fin 1214(2) is disposed along a second axis $A12_X(1)$. The second fin 1214(2) includes a second D/S region 1230D, a second active gate 1238(2), and a second S/D region 1230S disposed along the second fin 1214(2) in the X-axis direction and spaced apart at a line pitch $P_X$. The alignment of regions of the first fin 1214(1) and the second fin 1214(2) during fabrication of the cell circuit 1200 is illustrated in FIG. 12B.

In FIG. 12B, the second D/S region 1230D of the second fin 1214(2) is stacked vertically above the first active gate 1238(1) of the first fin 1214(1). Thus, vertical coupling above the first active gate 1238(1) is obstructed by the second fin 1214(2). In other words, a second channel column 1216(2) of the second fin 1214(2) overlaps a first channel column 1216(1) of the first fin 1214(1) only where the second D/S region 1230D is vertically integrated above the first active gate 1238(1). To avoid the vertical obstruction above the first active gate 1238(1), a first horizontal gate interconnect structure 1248(1) in contact with the first active gate 1238(1) is disposed in a direction orthogonal to the first fin 1214(1), and a first metal gate contact 1254 is formed on the first horizontal gate interconnect structure 1248(1). A via 1255 vertically couples the first metal gate contact 1254 to the metal line ML12(2).

In the cell circuit 1200, a first metal S/D contact 1256S is formed on the first S/D region 1220S, and a via 1298 vertically couples the first metal S/D contact 1256S to the metal line ML12(3) to couple a supply voltage from a supply voltage node 1292.

The PFET 1202P includes a first horizontal D/S interconnect structure 1242D in contact with the first D/S region 1220D. A first metal D/S contact 1256D is formed on the first horizontal D/S interconnect structure 1242D. A second horizontal D/S interconnect structure 1234D is formed in the second semiconductor layer 1206(2) in contact with the second D/S region 1230D. The second horizontal D/S interconnect structure 1234D extends in a direction orthogonal to the second fin 1214(2), and a second metal D/S contact 1278D is formed on the second horizontal D/S interconnect structure 1234D in a location corresponding to the metal line ML12(1) in the Z-axis direction. Vias 1290 and 1282D vertically couple the first metal D/S contact 1256D and the second metal D/S contact 1278D, respectively, to the metal line ML12(1).

In other aspects of the inverter configuration of the cell circuit 1200, a via 1284 vertically couples the second active gate 1238(2) to the metal line ML12(2), such that the second active gate 1238(2) is electrically coupled to the first active gate 1238(1). The second S/D region 1230S of the second fin 1214(2) is vertically coupled by a via 1282S to the metal line ML12(4) to couple a voltage from a ground node 1294.

With reference back to FIGS. 12A-1 and 12A-2, the NFET 1202N and the PFET 1202P are bulk-type FETs. Thus, the first semiconductor layer 1206(1) includes a first well region 1260(1) and the second semiconductor layer 1206(2) includes a second well region 1260(2). In another example of the cell circuit 1200, the NFET 1202N and the PFET 1202P may be SOI FETs without the well regions

1260(1) and 1260(2). As in previously discussed examples, the vias vertically coupling the NFET 1202N and the PFET 1202P to the metal lines ML12(1)-ML12(4) are spaced apart in the Y-axis direction according to the line pitch $P_Y$ of the metal lines ML12(1)-ML12(4), and also spaced apart according to the line pitch $P_X$ in the X-axis direction.

The cell circuit 1200, with the first and second semiconductor layers 1206(1) and 1206(2) vertically integrated as shown, has a reduced footprint area compared to a CMOS cell circuit in which an NFET 1202N and a PFET 1202P are laterally disposed in a horizontal direction on a surface of a substrate. In addition, various configurations of the cell circuit 1200 are made possible because the PFET 1202P and the NFET 1202N are both vertically coupled to the metal lines ML12(1)-ML12(4).

Figure 13B:
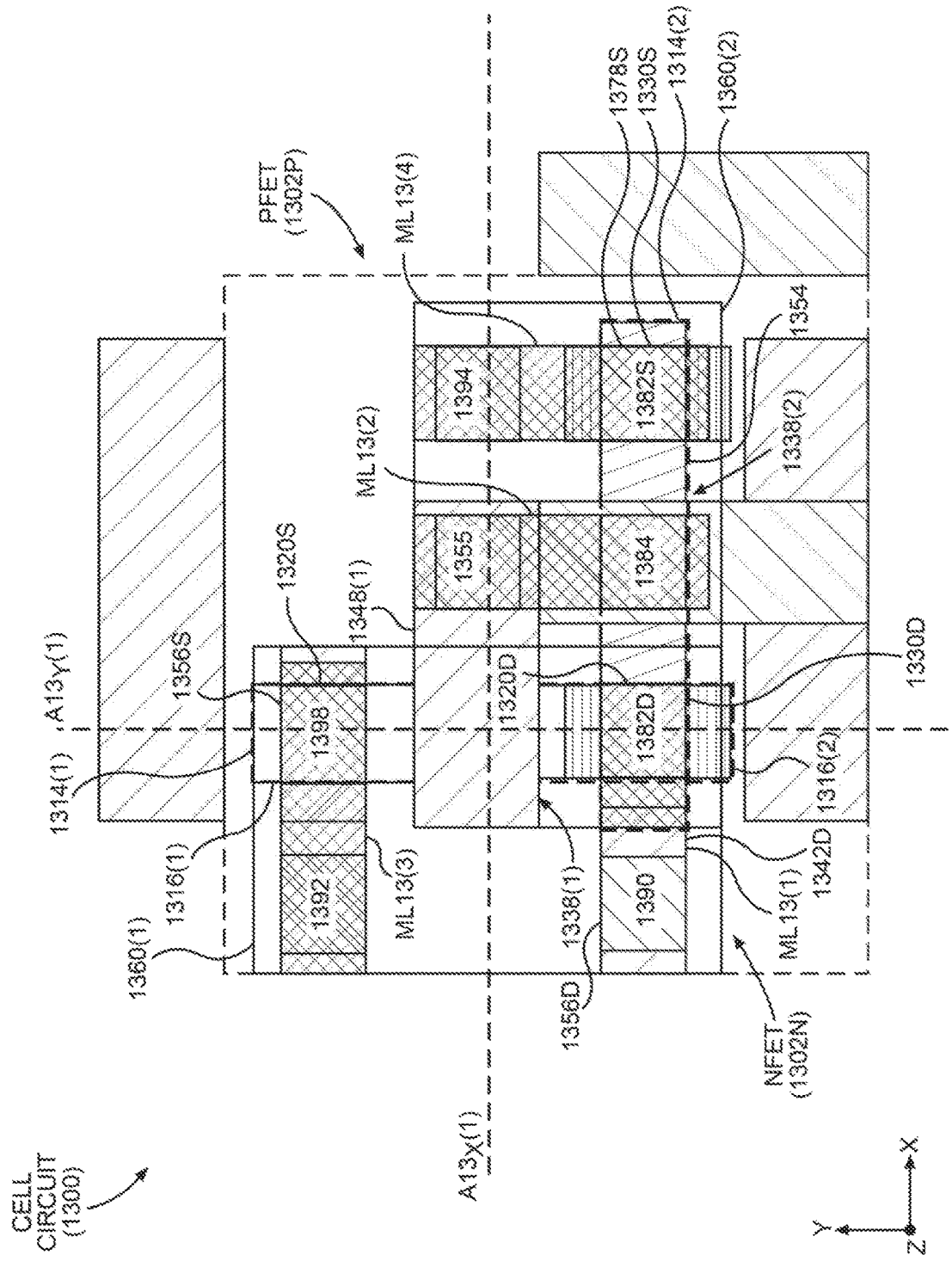
FIG. 13B is a top view of the first and second semiconductor layers shown in FIGS. 13A-1 and 13A-2 vertically integrated in a CMOS cell circuit.

FIGS. 13A-1 and 13A-2 are top views of a first semiconductor layer 1306(1) including a NFET 1302N, and a second semiconductor layer 1306(2) including a PFET 1302P for fabricating a cell circuit 1300 illustrated in FIG. 13B. The NFET 1302N includes a first fin 1314(1) and the PFET 1302P includes a second fin 1314(2). In the cell circuit 1300, the second fin 1314(2) overlaps a first D/S region 1320D of the first fin 1314(1). As shown in FIGS. 13A-2 and 13B, the second semiconductor layer 1306(2) is oriented such that the second fin 1314(2) is orthogonal to the first fin 1314(1).

In FIG. 13A-1, the first fin 1314(1) is disposed along a first axis $A13_Y(1)$. The first fin 1314(1) includes the first D/S region 1320D, a first active gate 1338(1), and a first S/D region 1320S disposed along the first fin 1314(1) in the Y-axis direction and spaced apart at a line pitch $P_Y$ to coincide with metal lines ML11(1)-ML11(3) as shown in FIG. 13B. FIG. 13A-2 shows the second fin 1314(2) disposed along a second axis $A13_X(1)$. The second fin 1314(2) includes a second D/S region 1330D, a second active gate 1338(2), and a second S/D region 1330S disposed along the second fin 1314(2) in the X-axis direction and spaced apart at a line pitch $P_X$. The alignment of regions of the first fin 1314(1) and the second fin 1314(2) during fabrication of the cell circuit 1300 is illustrated in a top view in FIG. 13B.

In FIG. 13B, the second D/S region 1330D of the second fin 1314(2) is stacked vertically above the first D/S region 1320D of the first fin 1314(1). Thus, vertical coupling above the first D/S region 1320D is obstructed by the second fin 1314(2). In other words, a second channel column 1316(2) of the second fin 1314(2) overlaps a first channel column 1316(1) of the first fin 1314(1) only where the second D/S region 1330D is vertically integrated above the first D/S region 1320D. To avoid the vertical obstruction above the first D/S region 1320D, a first horizontal D/S interconnect structure 1342D in contact with the first D/S region 1320D is disposed in a direction orthogonal to the first fin 1314(1), and a first metal D/S contact 1356D is formed on the first horizontal D/S interconnect structure 1342D. A via 1390 vertically couples between the first metal D/S contact 1356D and a metal line ML13(1).

In the cell circuit 1300, a first metal S/D contact 1356S is formed on the first S/D region 1320S, and a via 1398 vertically couples the first metal S/D contact 1356S to the metal line ML13(3) to couple a voltage from a ground node 1392.

The NFET 1302N includes a first horizontal gate interconnect structure 1348(1) to simplify coupling between the first active gate 1338(1) and the second active gate 1338(2) in the PFET 1302P. In particular, the first horizontal gate interconnect structure 1348(1) extends in a direction orthogonal to the first fin 1314(1) (i.e., parallel to the second fin 1314(2)), and the first horizontal gate interconnect structure 1348(1) is vertically coupled to the metal line ML13(2) by a first metal gate contact 1354 and a via 1355. The second active gate 1338(2) is also vertically coupled to the metal line ML13(2) by a second metal gate via 1384.

In other aspects of the inverter configuration of the cell circuit 1300, a first metal S/D contact 1378S and a first S/D via 1382S vertically couple the second S/D region 1330S of the second fin 1314(2) to a metal line ML13(4) to couple a supply voltage from a supply voltage node 1394. A first metal D/S contact 1378D and a first D/S via 1382D vertically couple the second D/S region 1330D of the second fin 1314(2) to the metal line ML13(1).

With reference back to FIGS. 13A-1 and 13A-2, the NFET 1302N and the PFET 1302P are bulk-type FETs. Thus, the first semiconductor layer 1306(1) includes a first well region 1360(1) and the second semiconductor layer 1306(2) includes a second well region 1360(2). In another example of the cell circuit 1300, the NFET 1302N and the PFET 1302P may be SOI FETs without the well regions 1360(1) and 1360(2). As in previously discussed examples, the vias vertically coupling the NFET 1302N and the PFET 1302P to the metal lines ML13(1)-ML13(4) are spaced apart in the Y-axis direction according to the line pitch $P_Y$ of the metal lines ML13(1)-ML13(4), and also spaced apart according to the line pitch $P_X$ in the X-axis direction.

The cell circuit 1300, with the first and second semiconductor layers 1306(1) and 1306(2) vertically integrated as shown, has a reduced footprint area compared to a CMOS cell circuit in which an NFET 1302N and a PFET 1302P are laterally disposed in a horizontal direction on a surface of a substrate. In addition, various configurations of the cell circuit 1300 are made possible because the PFET 1302P and the NFET 1302N are both vertically coupled to the metal lines ML13(1)-ML13(4).

Figure 14B:
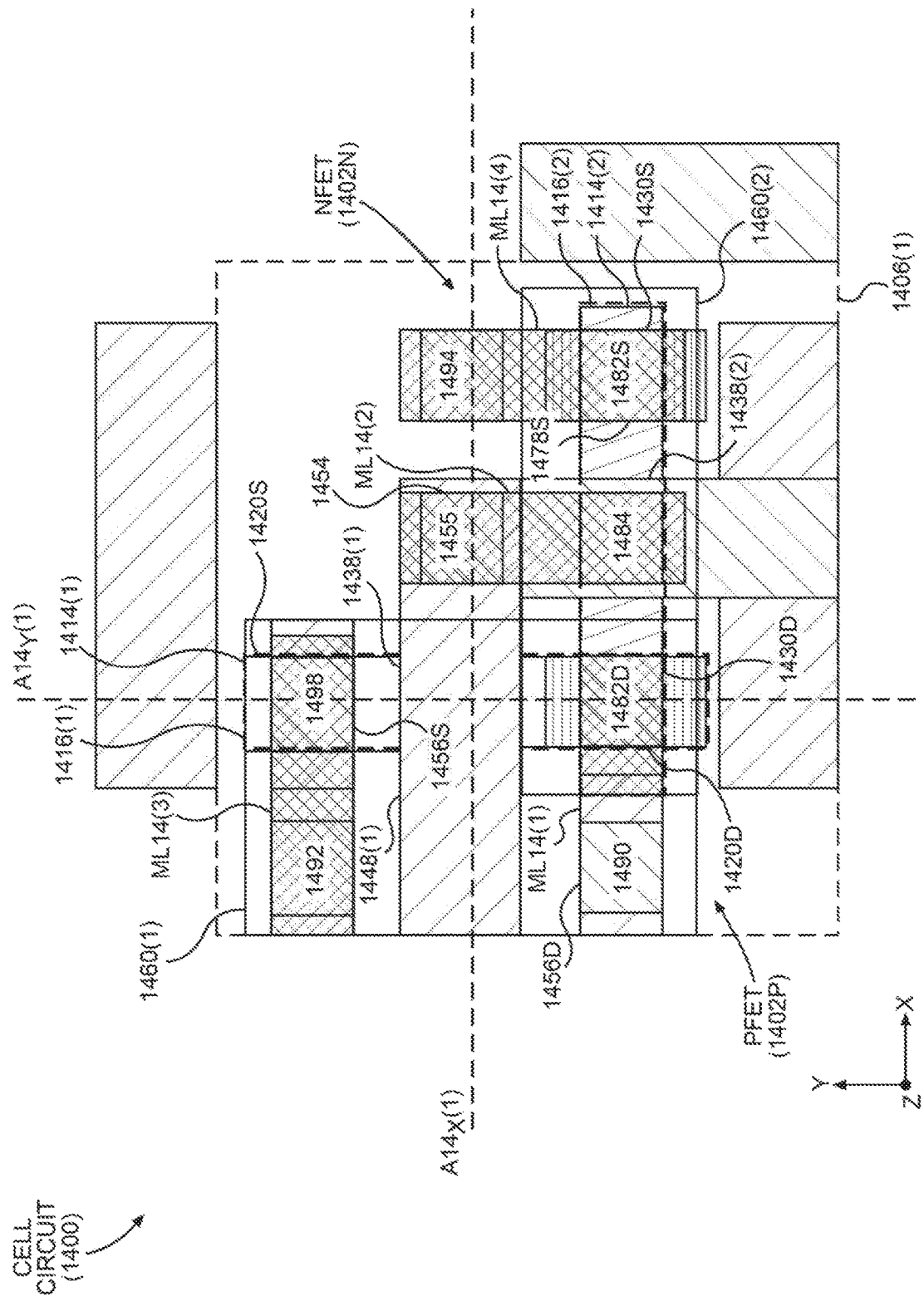
FIG. 14B is a top view of the first and second semiconductor layers shown in FIGS. 14A-1 and 14A-2 vertically integrated in a CMOS cell circuit.

FIGS. 14A-1 and 14A-2 are top views of a first semiconductor layer 1406(1) including a PFET 1402P, and a second semiconductor layer 1406(2) including the NFET 1402N for fabricating a cell circuit 1400 illustrated in FIG. 14B. The PFET 1402P includes a first fin 1414(1) and the NFET 1402N includes a second fin 1414(2). In the cell circuit 1400 in FIG. 14B the second fin 1414(2) overlaps a first D/S region 1420D of the first fin 1414(1). As shown in FIG. 14B, the second semiconductor layer 1406(2) is oriented such that the second fin 1414(2) is orthogonal to the first fin 1414(1). In the cell circuit 1400, the NFET 1402N is vertically stacked over the PFET 1402P, in contrast to cell circuit 1300 which vertically stacks the PFET 1302P over the NFET 1302N.

In FIG. 14A-1, the first fin 1414(1) is disposed along a first axis $A14_Y(1)$. The first fin 1414(1) includes the first D/S region 1420D, a first active gate 1438(1), and a first S/D region 1420S disposed along the first fin 1414(1) in the Y-axis direction and spaced apart at a line pitch $P_Y$ to coincide with metal lines ML14(1)-ML14(4) as shown in FIG. 14B. In FIG. 14A-2, the second fin 1414(2) is disposed along a second axis $A14_X(1)$. The second fin 1414(2) includes a second D/S region 1430D, a second active gate 1438(2), and a second S/D region 1430S disposed along the second fin 1414(2) in the X-axis direction and spaced apart at a line pitch $P_X$. The alignment of regions of the first fin 1414(1) and the second fin 1414(2) during fabrication of the cell circuit 1400 is illustrated in a top view in FIG. 14B.

As shown in FIG. 14B, the second D/S region 1430D of the second fin 1414(2) is stacked vertically above the first D/S region 1420D of the first fin 1414(1). Thus, vertical coupling above the first D/S region 1420D is obstructed by the second fin 1414(2). In other words, a second channel column 1416(2) of the second fin 1414(2) overlaps a first channel column 1416(1) of the first fin 1414(1) only where the second D/S region 1430D is vertically integrated above the first D/S region 1420D. To avoid the vertical obstruction above the first D/S region 1420D, a first horizontal D/S interconnect structure 1442D in contact with the first D/S region 1420D is disposed in a direction orthogonal to the first fin 1414(1), and a first metal D/S contact 1456D is formed on the first horizontal D/S interconnect structure 1442D. A via 1490 vertically couples between the first metal D/S contact 1456D and the metal line ML14(1).

In the cell circuit 1400, a first metal S/D contact 1456S is formed on the first S/D region 1420S, and a via 1498 vertically couples the first metal S/D contact 1456S to the metal line ML14(3) to couple a supply voltage from a supply voltage node 1492.

The PFET 1402P includes a first horizontal gate interconnect structure 1448(1) to simplify coupling between the first active gate 1438(1) and the second active gate 1438(2) in the NFET 1402N. In particular, the first horizontal gate interconnect structure 1448(1) extends in a direction orthogonal to the first fin 1414(1) (i.e., parallel to the second fin 1414(2)), and the first horizontal gate interconnect structure 1448(1) is vertically coupled to the metal line ML14(2) by a first metal gate contact 1454 and a via 1455. The second active gate 1438(2) is also vertically coupled to the metal line ML14(2) by a second metal gate via 1484.

In other aspects of the inverter configuration of the cell circuit 1400, a first metal S/D contact 1478S and a first S/D via 1482S vertically couple the second S/D region 1430S of the second fin 1414(2) to the metal line ML14(4) to couple a voltage from a ground node 1494.

With reference back to FIGS. 14A-1 and 14A-2, the NFET 1402N and the PFET 1402P are bulk-type FETs. Thus, the first semiconductor layer 1406(1) includes a first well region 1460(1) and the second semiconductor layer 1406(2) includes a second well region 1460(2). In another example of the cell circuit 1400, the NFET 1402N and the PFET 1402P may be SOI FETs without the well regions 1460(1) and 1460(2). As in previously discussed example, the vias vertically coupling the NFET 1402N and the PFET 1402P to the metal lines ML14(1)-ML14(4) are spaced apart in the Y-axis direction according to the line pitch $P_Y$ of the metal lines ML14(1)-ML14(4), and also spaced apart according to the line pitch $P_X$ in the X-axis direction.

The cell circuit 1400, with the first and second semiconductor layers 1406(1) and 1406(2) vertically integrated as shown, has a reduced footprint area compared to a CMOS cell circuit in which an NFET 1402N and a PFET 1402P are laterally disposed in a horizontal direction on a surface of a substrate. In addition, various configurations of the cell circuit 1400 are made possible because the PFET 1402P and the NFET 1402N are both vertically coupled to the metal lines ML14(1)-ML14(4).

3D CMOS cell circuits in which a PFET and an NFET are vertically integrated by stacking a second semiconductor layer on a first semiconductor layer such that the channel structure of the second FET overlaps the channel structure of the first FET, as illustrated in any of FIGS. 2A-2D, 5A-1-5B, 6A-6B, 7A-7D, 10A-10B, 11A-1-11B, 12A-1-12B, 13A-1-13B, and 14A-1-14B, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 15:
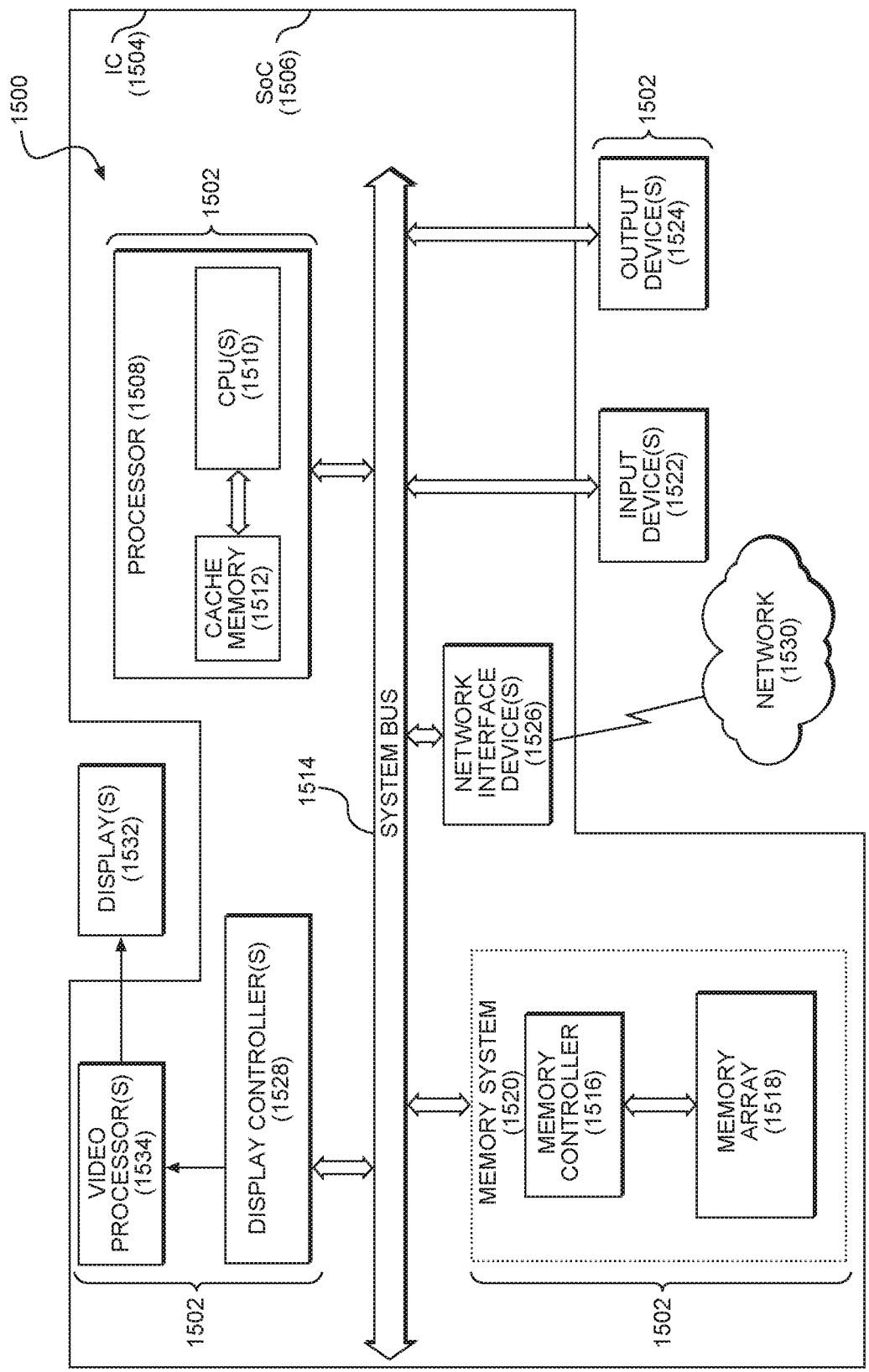
FIG. 15 is a block diagram of an exemplary processor-based system that can include a CMOS cell circuit that a PFET and an NFET are vertically integrated by stacking a second semiconductor layer that includes a second FET above a first semiconductor layer that includes a first FET, such that the channel structure of the second FET overlaps the channel structure of the first FET to reduce a footprint of a CMOS cell circuit including, but not limited, to the circuits in FIGS. 2A, 2B, 2D, 5B, 6A, 6B, 7A, 7B, 7D, 10A, 10B, 11A, 11B, 12A, 12B, 13A, 13B, 14A, and 14B.

In this regard, FIG. 15 illustrates an example of a processor-based system 1500 with circuits 1502 that can include CMOS cell circuits having a PFET and an NFET vertically integrated by stacking a second semiconductor layer on a first semiconductor layer such that the channel structure of the second FET overlaps the channel structure of the first FET, including, but not limited to, the cell circuits 200, 500, 600, 700, 1000, 1100, 1200, 1300, and 1400, and according to any aspects disclosed herein. In this example, the processor-based system 1500 may be formed as an IC 1504 in a system-on-a-chip (SoC) 1506. The processor-based system 1500 includes a processor 1508 that includes one or more central processor units (CPUs) 1510, which may also be referred to as CPU or processor cores. The processor 1508 may have cache memory 1512 coupled to the CPUs 1510 for rapid access to temporarily stored data. As an example, the CPUs 1510 could include CMOS cell circuits having a PFET and an NFET vertically integrated by stacking a second semiconductor layer on a first semiconductor layer such that the channel structure of the second FET overlaps the channel structure of the first FET, including, but not limited to, the cell circuits 200, 500, 600, 700, 1000, 1100, 1200, 1300, and 1400, and according to any aspects disclosed herein. The processor 1508 is coupled to a system bus 1514 and can intercouple master and slave devices included in the processor-based system 1500. As is well known, the processor 1508 communicates with these other devices by exchanging address, control, and data information over the system bus 1514. For example, the processor 1508 can communicate bus transaction requests to a memory controller 1516 as an example of a slave device. Although not illustrated in FIG. 15, multiple system buses 1514 could be provided, wherein each system bus 1514 constitutes a different fabric.

Other master and slave devices can be connected to the system bus 1514. As illustrated in FIG. 15, these devices can include a memory system 1520 that includes the memory controller 1516 and a memory array(s) 1518, one or more input devices 1522, one or more output devices 1524, one or more network interface devices 1526, and one or more display controllers 1528, as examples. Each of the memory system 1520, the one or more input devices 1522, the one or more output devices 1524, the one or more network interface devices 1526, and the one or more display controllers 1528 can include CMOS cell circuits having a PFET and an NFET vertically integrated by stacking a second semiconductor layer on a first semiconductor layer such that the channel structure of the second FET overlaps the channel structure of the first FET, including, but not limited to, the cell circuits 200, 500, 600, 700, 1000, 1100, 1200, 1300, and 1400, and according to any aspects disclosed herein. The input device(s) 1522 can include any type of input device, including, but not limited to, input keys, switches, voice processors, etc. The output device(s) 1524 can include any type of output device, including, but not limited to, audio, video, other visual indicators, etc. The network interface device(s)

1526 can be any device configured to allow exchange of data to and from a network 1530. The network 1530 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1526 can be configured to support any type of communications protocol desired.

The processor 1508 may also be configured to access the display controller(s) 1528 over the system bus 1514 to control information sent to one or more displays 1532. The display controller(s) 1528 sends information to the display(s) 1532 to be displayed via one or more video processors 1534, which process the information to be displayed into a format suitable for the display(s) 1532. The display(s) 1532 can include any type of display, including, but not limited to, a cathode ray tube (CRT), a liquid crystal display (LCD), a plasma display, a light emitting diode (LED) display, etc. The display controller(s) 1528, display(s) 1532, and/or the video processor(s) 1534 can include CMOS cell circuits having a PFET and an NFET vertically integrated by stacking a second semiconductor layer on a first semiconductor layer such that the channel structure of the second FET overlaps the channel structure of the first FET, including, but not limited to, the cell circuits 200, 500, 600, 700, 1000, 1100, 1200, 1300, and 1400, and according to any aspects disclosed herein.

Figure 16:
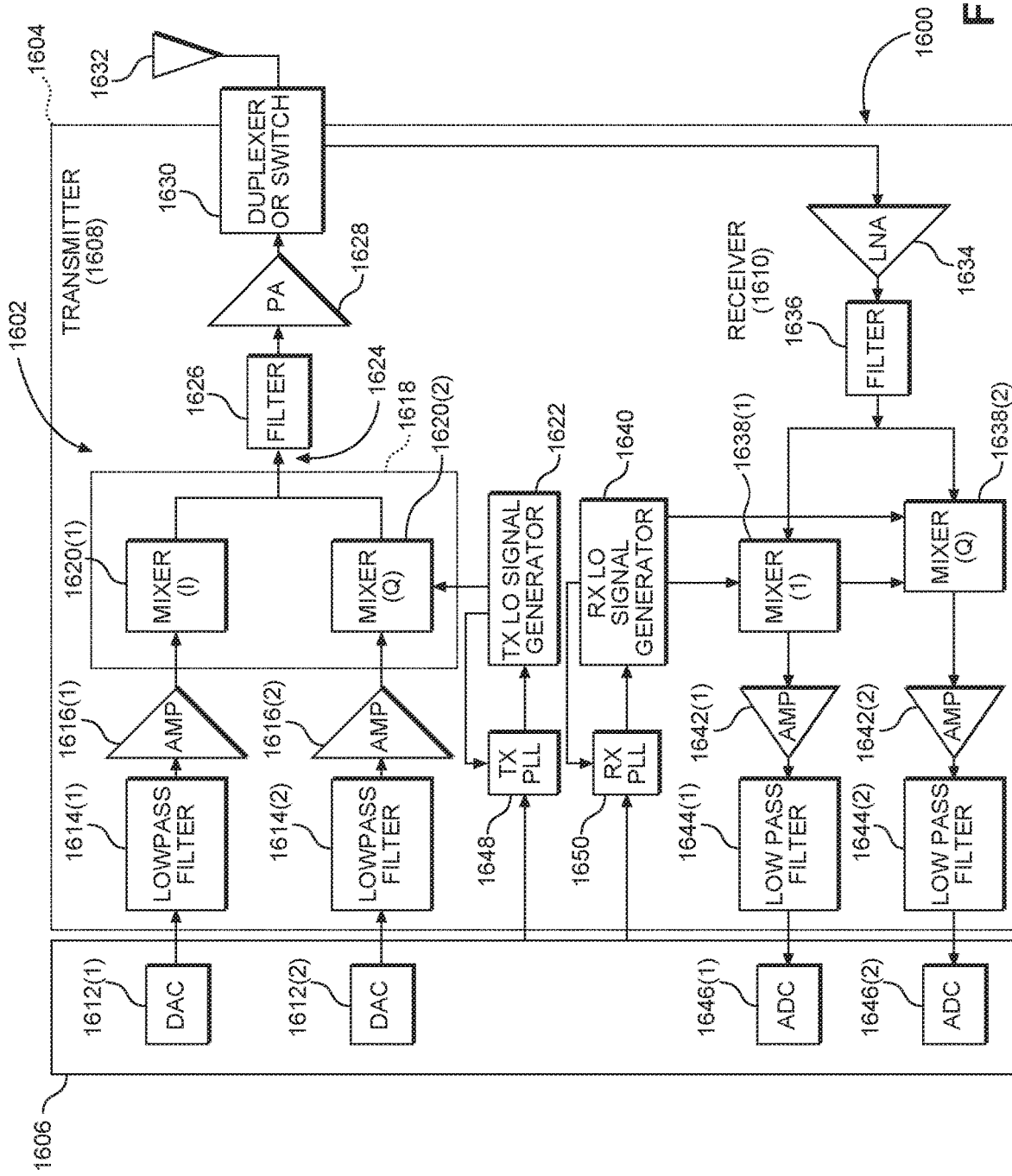
FIG. 16 is a block diagram of an exemplary wireless communications device that includes radio frequency (RF) components formed from an integrated circuit (IC), wherein any of the components therein can include a CMOS cell circuit including, but not limited, to the circuits in FIGS. 2A, 2B, 2D, 5B, 6A, 6B, 7A, 7B, 7D, 10A, 10B, 11A, 11B, 12A, 12B, 13A, 13B, 14A, and 14B.

FIG. 16 illustrates an exemplary wireless communications device 1600 that includes radio frequency (RF) components formed from an IC 1602, wherein any of the components therein can include CMOS cell circuits having a PFET and an NFET vertically integrated by stacking a second semiconductor layer on a first semiconductor layer such that the channel structure of the second FET overlaps the channel structure of the first FET, including, but not limited to, the cell circuits 200, 500, 600, 700, 1000, 1100, 1200, 1300, and 1400, and according to any aspects disclosed herein. The wireless communications device 1600 may include or be provided in any of the above-referenced devices, as examples. As shown in FIG. 16, the wireless communications device 1600 includes a transceiver 1604 and a data processor 1606. The data processor 1606 may include a memory to store data and program codes. The transceiver 1604 includes a transmitter 1608 and a receiver 1610 that support bi-directional communications. In general, the wireless communications device 1600 may include any number of transmitters 1608 and/or receivers 1610 for any number of communication systems and frequency bands. All or a portion of the transceiver 1604 may be implemented on one or more analog ICs, RF ICs (RFICs), mixed-signal ICs, etc.

The transmitter 1608 or the receiver 1610 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1610. In the direct-conversion architecture, a signal is frequency-converted between RF and baseband in one stage. The super-heterodyne and direct-conversion architectures may use different circuit blocks and/or have different requirements. In the wireless communications device 1600 in FIG. 16, the transmitter 1608 and the receiver 1610 are implemented with the direct-conversion architecture.

In the transmit path, the data processor 1606 processes data to be transmitted and provides I and Q analog output signals to the transmitter 1608. In the exemplary wireless communications device 1600, the data processor 1606 includes digital-to-analog converters (DACs) 1612(1), 1612(2) for converting digital signals generated by the data processor 1606 into the I and Q analog output signals, e.g., I and Q output currents, for further processing.

Within the transmitter 1608, lowpass filters 1614(1), 1614(2) filter the I and Q analog output signals, respectively, to remove undesired signals caused by the prior digital-to-analog conversion. Amplifiers (AMPs) 1616(1), 1616(2) amplify the signals from the lowpass filters 1614(1), 1614(2), respectively, and provide I and Q baseband signals. An upconverter 1618 upconverts the I and Q baseband signals with I and Q transmit (TX) local oscillator (LO) signals through mixers 1620(1), 1620(2) from a TX LO signal generator 1622 to provide an upconverted signal 1624. A filter 1626 filters the upconverted signal 1624 to remove undesired signals caused by the frequency upconversion as well as noise in a receive frequency band. A power amplifier (PA) 1628 amplifies the upconverted signal 1624 from the filter 1626 to obtain the desired output power level and provides a transmitted RF signal. The transmitted RF signal is routed through a duplexer or switch 1630 and transmitted via an antenna 1632.

In the receive path, the antenna 1632 receives signals transmitted by base stations and provides a received RF signal, which is routed through the duplexer or switch 1630 and provided to a low noise amplifier (LNA) 1634. The duplexer or switch 1630 is designed to operate with a specific receive (RX)-to-TX duplexer frequency separation, such that RX signals are isolated from TX signals. The received RF signal is amplified by the LNA 1634 and filtered by a filter 1636 to obtain a desired RF input signal. Down-conversion mixers 1638(1), 1638(2) mix the output of the filter 1636 with I and Q RX LO signals (i.e., LO_I and LO_Q) from an RX LO signal generator 1640 to generate I and Q baseband signals. The I and Q baseband signals are amplified by amplifiers (AMPs) 1642(1), 1642(2) and further filtered by lowpass filters 1644(1), 1644(2) to obtain I and Q analog input signals, which are provided to the data processor 1606. In this example, the data processor 1606 includes Analog to Digital Converters (ADCs) 1646(1), 1646(2) for converting the analog input signals into digital signals to be further processed by the data processor 1606.

In the wireless communications device 1600 of FIG. 16, the TX LO signal generator 1622 generates the I and Q TX LO signals used for frequency upconversion, while the RX LO signal generator 1640 generates the I and Q RX LO signals used for frequency downconversion. Each LO signal is a periodic signal with a particular fundamental frequency. A TX phase-locked loop (PLL) circuit 1648 receives timing information from the data processor 1606 and generates a control signal used to adjust the frequency and/or phase of the TX LO signals from the TX LO signal generator 1622. Similarly, an RX PLL circuit 1650 receives timing information from the data processor 1606 and generates a control signal used to adjust the frequency and/or phase of the RX LO signals from the RX LO signal generator 1640.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but, is to be accorded the widest scope consistent with the principles and novel features disclosed herein.

What is claimed is:

1. A complementary metal-oxide semiconductor (CMOS) cell circuit, comprising:
    a first semiconductor layer, comprising:
        a first channel structure;
        a first channel column of the first channel structure; and
        a first gate comprising a first active gate disposed on the first channel structure;
    a second semiconductor layer disposed above the first semiconductor layer, comprising:
        a second channel structure;
        a second channel column of the second channel structure, the second channel structure overlapping the first channel structure such that at least a portion of the second channel column of the second channel structure overlaps at least a portion of the first channel column of the first channel structure; and
        a second gate comprising a second active gate disposed on the second channel structure;
    the first semiconductor layer further comprising:
        a first type Field-Effect Transistor (FET), comprising:
            a first source/drain (S/D) region in a first end portion of the first channel structure;
            a first drain/source (D/S) region in a second end portion of the first channel structure; and
            the first active gate disposed between the first S/D region and the first D/S region; and
    the second semiconductor layer further comprising a second type FET, comprising:
        a second S/D region in a first end portion of the second channel structure;
        a second D/S region in a second end portion of the second channel structure; and
        the second active gate disposed between the second S/D region and the second D/S region,
    wherein:
        the second channel column extends vertically from a horizontal area of the second channel structure, including the second S/D region, the second D/S region, and the second active gate;
        the first channel structure has a first longitudinal axis; and
        the first semiconductor layer further comprises:
            at least one first horizontal interconnect structure having a second longitudinal axis orthogonal to the first longitudinal axis, the at least one first horizontal interconnect structure coupled to at least one of the first S/D region, the first D/S region, and the first active gate; and
            at least one first metal contact outside of the second channel column of the second channel structure and in contact with the at least one first horizontal interconnect structure.

2. The CMOS cell circuit of claim 1, wherein:
    the at least one first horizontal interconnect structure comprises a first horizontal gate interconnect structure in contact with the first active gate;
    the first gate comprises a field gate adjacent to the first active gate and comprising the first horizontal gate interconnect structure; and the at least one first metal contact outside of the second channel column of the second channel structure comprises a first metal gate contact in contact with the first horizontal gate interconnect structure.

3. The CMOS cell circuit of claim 1, wherein:
the at least one first horizontal interconnect structure comprises a first horizontal S/D interconnect structure in contact with the first S/D region; and
the at least one first metal contact outside of the second channel column of the second channel structure comprises a first metal S/D contact in contact with the first horizontal S/D interconnect structure.

4. The CMOS cell circuit of claim 1, wherein:
the at least one first horizontal interconnect structure comprises a first horizontal D/S interconnect structure in contact with the first D/S region; and
the at least one first metal contact outside of the second channel column of the second channel structure comprises a first metal D/S contact in contact with the first horizontal D/S interconnect structure.

5. The CMOS cell circuit of claim 1, wherein:
the at least one first horizontal interconnect structure comprises a first horizontal gate interconnect structure in contact with the first active gate, a first horizontal S/D interconnect structure in contact with the first S/D region, and a first horizontal D/S interconnect structure in contact with the first D/S region;
the first gate comprises a field gate adjacent to the first active gate and comprises the first horizontal gate interconnect structure; and
the at least one first metal contact outside of the second channel column of the second channel structure comprises:
  a first metal gate contact in contact with the first horizontal gate interconnect structure;
  a first metal S/D contact in contact with the first horizontal S/D interconnect structure; and
  a first metal D/S contact in contact with the first horizontal D/S interconnect structure.

6. The CMOS cell circuit of claim 1, further comprising a first via disposed outside the second channel column of the second channel structure and in contact with the at least one first metal contact.

7. The CMOS cell circuit of claim 1, wherein the second semiconductor layer further comprises:
a power source via disposed outside the second channel column of the second channel structure, the power source via coupled to a supply voltage node to supply a voltage from the supply voltage node to the second type FET; and
a ground via disposed outside the second channel column of the second channel structure, the ground via coupled to a ground node to supply a voltage from the ground node to the first type FET.

8. The CMOS cell circuit of claim 1, wherein the second semiconductor layer further comprises at least one second metal contact in contact with at least one of the second S/D region, the second D/S region, and the second active gate.

9. The CMOS cell circuit of claim 1, wherein:
the second channel structure has a third longitudinal axis; and
the second semiconductor layer further comprises:
  at least one second horizontal interconnect structure having a fourth longitudinal axis orthogonal to the third longitudinal axis, the at least one second horizontal interconnect structure coupled to at least one of the second S/D region, the second D/S region, and the second active gate; and
  at least one second metal contact in contact with the at least one second horizontal interconnect structure.

10. The CMOS cell circuit of claim 8, wherein:
the at least one second metal contact of the second semiconductor layer further comprises:
  a second S/D metal contact in contact with the second S/D region;
  a second D/S metal contact in contact with the second D/S region; and
  a second metal interconnect in contact with the second active gate;
a first horizontal S/D interconnect structure, a first horizontal gate interconnect structure, and a first horizontal D/S interconnect structure are disposed at a line pitch in a direction of the first longitudinal axis on first, second, and third tracks, respectively; and
the second S/D metal contact, the second D/S metal contact, and the second metal interconnect are disposed on the first, second, and third tracks, respectively.

11. The CMOS cell circuit of claim 7, wherein:
a first metal S/D contact, a first metal D/S contact, a first metal gate contact, the power source via, and the ground via are each spaced a distance of a track pitch from the first channel structure in a direction orthogonal to the first longitudinal axis.

12. The CMOS cell circuit of claim 1, wherein:
the second channel structure has a third longitudinal axis orthogonal to the first longitudinal axis.

13. The CMOS cell circuit of claim 12, wherein:
the at least one first horizontal interconnect structure comprises a first horizontal gate interconnect structure in contact with the first active gate;
the first gate comprises a field gate adjacent to the first active gate and comprises the first horizontal gate interconnect structure;
the at least one first metal contact outside of the second channel column of the second channel structure comprises a first metal gate contact in contact with the first horizontal gate interconnect structure; and
the first semiconductor layer further comprises:
  a first S/D metal contact in contact with the first S/D region; and
  a first D/S metal contact in contact with the first D/S region.

14. The CMOS cell circuit of claim 12, wherein:
the at least one first horizontal interconnect structure comprises a first horizontal S/D interconnect structure in contact with the first S/D region;
the at least one first metal contact outside of the second channel column of the second channel structure comprises a first metal S/D contact in contact with the first horizontal S/D interconnect structure; and
the first semiconductor layer further comprises:
  a first D/S metal contact in contact with the first D/S region; and
  a first horizontal gate interconnect structure in contact with the first active gate.

15. The CMOS cell circuit of claim 12, wherein:
the at least one first horizontal interconnect structure comprises a first horizontal D/S interconnect structure in contact with the first D/S region;
the at least one first metal contact outside of the second channel column of the second channel structure comprises a first metal D/S contact in contact with the first horizontal D/S interconnect structure; and the first semiconductor layer further comprises:
   a first S/D metal contact in contact with the first S/D region; and
   a first horizontal gate interconnect structure in contact with the first active gate.

16. The CMOS cell circuit of claim 1, wherein:
the first type FET is a bulk-type FET, and the first semiconductor layer comprises a first well; and
the second type FET is a bulk-type FET, and the second semiconductor layer comprises a second well.

17. The CMOS cell circuit of claim 1, wherein:
the first type FET is a silicon-on-insulator (SOI) FET, and the first channel structure is disposed on a first insulator; and
the second type FET is a SOI FET, and the second channel structure is disposed on a second insulator.

18. The CMOS cell circuit of claim 1, wherein the second type FET comprises a P-type metal-oxide semiconductor (MOS) (PMOS) FET, and the first type FET comprises an N-type MOS (NMOS) FET.

19. The CMOS cell circuit of claim 1, wherein the second type FET is an N-type metal-oxide semiconductor (MOS) (NMOS) FET and the first type FET is a P-type MOS (PMOS) FET.

20. The CMOS cell circuit of claim 1 comprising a standard IC.

21. The CMOS cell circuit of claim 1, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

22. A method of fabricating a complementary metal-oxide semiconductor (CMOS) cell circuit, comprising:
forming a first semiconductor layer comprising a first type Field-Effect Transistor (FET), comprising:
   forming a first channel structure extending longitudinally in a first direction;
   forming a first source/drain (S/D) region in a first end portion of the first channel structure;
   forming a first drain/source (D/S) region in a second end portion of the first channel structure; and
   forming a first active gate above a top surface of the first channel structure between the first S/D region and the first D/S region;
disposing a second semiconductor layer above the first semiconductor layer, comprising:
   disposing a semiconductor substrate on a top surface of the first semiconductor layer; and
   forming a second type FET in the semiconductor substrate, comprising:
      forming a second channel structure in the semiconductor substrate, the second channel structure extending longitudinally in a second direction and overlapping at least a portion of a first channel column of the first channel structure;
      forming a second S/D region in the second channel structure;
      forming a second D/S region in the second channel structure; and
      forming a second active gate on the second channel structure between the second S/D region and the second D/S region,
forming at least one first horizontal interconnect structure extending longitudinally in a third direction orthogonal to the first direction, the at least one first horizontal interconnect structure coupled to at least one of the first S/D region, the first D/S region, and the first active gate; and
forming at least one first metal contact outside of a second channel column of the second channel structure and in contact with the at least one first horizontal interconnect structure, the second channel column extending vertically from a horizontal area of the second channel structure, including the second S/D region, the second D/S region, and the second active gate.

23. The method of claim 22, wherein:
forming the first semiconductor layer comprising the first type FET further comprises disposing a first protective layer over the first channel structure to form the top surface of the first semiconductor layer; and
disposing the second semiconductor layer above the first semiconductor layer further comprises:
   forming the semiconductor substrate on a surface of a donor wafer; and
   separating the semiconductor substrate from the donor wafer.

24. The method of claim 22, wherein:
forming the second channel structure in the semiconductor substrate further comprises:
   bonding a bottom surface of the semiconductor substrate to the top surface of the first semiconductor layer;
   doping the semiconductor substrate according to a photo resist pattern to form the second channel structure;
   disposing a hard mask to cover the second channel structure;
   etching portions of the semiconductor substrate not covered by the hard mask; and
   forming a shallow trench isolation (STI) layer on the top surface of the first semiconductor layer around the second channel structure, with at least a portion of a height of the second channel structure not covered by the STI layer.

25. The method of claim 22, wherein disposing the second semiconductor layer above the first semiconductor layer further comprises:
forming a second protective layer over the second channel structure; and
forming contacts to the second S/D region, the second D/S region, and the second active gate in the second protective layer.

26. The method of claim 22, wherein forming the second channel structure in the semiconductor substrate further comprises doping the semiconductor substrate to form a well below the second channel structure.

27. The method of claim 23, wherein disposing the second semiconductor layer above the first semiconductor layer further comprises:
forming a graphene layer on the donor wafer to form the surface of the donor wafer;

forming an oxide layer on a top surface of the semiconductor substrate;
forming a stressor metal layer on the oxide layer; and
forming a thermal handle layer on the stressor metal layer.

28. The method of claim 23, wherein:
forming the second type FET in the semiconductor substrate further comprises doping the semiconductor substrate separated from the donor wafer to have a second type; and
disposing the semiconductor substrate on the top surface of the first semiconductor layer further comprises:
  forming a second protective layer over the second channel structure to form a top surface of the second semiconductor layer;
  bonding the top surface of the second semiconductor layer to the top surface of the first semiconductor layer;
  etching portions of the second semiconductor layer to expose the second S/D region and the second D/S region in the second channel structure;
  growing S/D material on the second S/D region and D/S material on the second D/S region to fill the respective etched portions of the second semiconductor layer; and
  forming contacts to the grown S/D material, the grown D/S material, and the second active gate.

29. The method of claim 22, wherein:
forming the first type FET further comprises doping the first channel structure to form an N-type metal-oxide semiconductor (MOS) (NMOS) FET; and
forming the second type FET in the semiconductor substrate comprises doping the semiconductor substrate to form the second semiconductor layer comprising a P-type metal-oxide semiconductor (MOS) (PMOS) FET.

30. The method of claim 22, wherein:
forming the first type FET further comprises doping the first channel structure to form a P-type metal-oxide semiconductor (MOS) (PMOS) FET; and
forming the second type FET in the semiconductor substrate comprises doping the semiconductor substrate to form the second semiconductor layer comprising an N-type metal-oxide semiconductor (MOS) (NMOS) FET.

31. The method of claim 22, wherein:
forming the at least one first horizontal interconnect structure further comprises forming a first gate, wherein forming the first gate further comprises forming a first field gate adjacent to the first active gate and in contact with the first active gate; and
forming the at least one first metal contact further comprises forming a first metal gate contact in contact with the first field gate.

32. The method of claim 22, wherein:
forming the at least one first horizontal interconnect structure further comprises forming a first horizontal S/D interconnect structure in contact with the first S/D region; and
forming the at least one first metal contact further comprises forming a first metal S/D contact in contact with the first horizontal S/D interconnect structure.

33. The method of claim 22, wherein:
forming the at least one first horizontal interconnect structure further comprises forming a first horizontal D/S interconnect structure in contact with the first D/S region; and
forming the at least one first metal contact further comprises forming a first metal D/S contact in contact with the first horizontal D/S interconnect structure.

34. The method of claim 22, wherein:
forming the at least one first horizontal interconnect structure further comprises forming a first horizontal S/D interconnect structure in contact with the first S/D region, forming a first horizontal D/S interconnect structure in contact with the first D/S region, and forming a first gate, wherein forming the first gate further comprises forming a first field gate adjacent to the first active gate and in contact with the first active gate; and
forming the at least one first metal contact outside of the second channel column of the second channel structure comprises:
  forming a first metal gate contact in contact with the first field gate;
  forming a first metal S/D contact in contact with the first horizontal S/D interconnect structure; and
  forming a first metal D/S contact in contact with the first horizontal D/S interconnect structure.

* * * * *